(12) United States Patent
Chiang et al.

(10) Patent No.: US 11,637,102 B2
(45) Date of Patent: Apr. 25, 2023

(54) GATE ISOLATION FOR MULTIGATE DEVICE

(71) Applicant: Taiwan Semiconductor Manufacturing Co., Ltd., Hsin-Chu (TW)

(72) Inventors: Kuo-Cheng Chiang, Hsinchu County (TW); Shi Ning Ju, Hsinchu (TW); Guan-Lin Chen, Hsinchu County (TW); Kuan-Ting Pan, Taipei (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/199,777

(22) Filed: Mar. 12, 2021

(65) Prior Publication Data
US 2021/0375858 A1    Dec. 2, 2021

Related U.S. Application Data

(60) Provisional application No. 63/032,178, filed on May 29, 2020.

(51) Int. Cl.
*H01L 27/088*   (2006.01)
*H01L 21/762*   (2006.01)
(Continued)

(52) U.S. Cl.
CPC ...... *H01L 27/088* (2013.01); *H01L 21/76224* (2013.01); *H01L 29/42392* (2013.01); *H01L 29/78696* (2013.01)

(58) Field of Classification Search
CPC ............. H01L 27/088; H01L 29/42392; H01L 21/823456; H01L 21/823437;
(Continued)

(56) References Cited

U.S. PATENT DOCUMENTS 6,287,904 B1     9/2001  Lee et al.
11,282,752 B2 *  3/2022  Jun ................. H01L 21/823487
(Continued)

FOREIGN PATENT DOCUMENTS

KR   20170012640 A   2/2017
KR   20190026213 A   3/2019
(Continued)

OTHER PUBLICATIONS

Pan, Kuan-Ting et al. "Gate Isolation for Multigate Device", U.S. Appl. No. 17/466,569; Assignee: Taiwan Semiconductor Manufacturing Company, Ltd. 65 pages of specification, 33 pages of drawings.
(Continued)

*Primary Examiner* — Sonya McCall-Shepard
(74) *Attorney, Agent, or Firm* — Haynes and Boone, LLP

(57) ABSTRACT

Gate cutting techniques disclosed herein form gate isolation fins to isolate metal gates of multigate devices from one another before forming the multigate devices, and in particular, before forming the metal gates of the multigate devices. An exemplary device includes a first multigate device having first source/drain features and a first metal gate that surrounds a first channel layer and a second multigate device having second source/drain features and a second metal gate that surrounds a second channel layer. A gate isolation fin, which separates the first metal gate and the second metal gate, includes a first dielectric layer having a first dielectric constant and a second dielectric layer having a second dielectric constant disposed over the first dielectric
(Continued)

layer. The second dielectric constant is less than the first dielectric constant. A gate isolation end cap may be disposed on the gate isolation fin to provide additional isolation.

20 Claims, 48 Drawing Sheets

(51) Int. Cl.
    *H01L 29/423* (2006.01)
    *H01L 29/786* (2006.01)
    *H01L 21/8234* (2006.01)
    *H01L 29/06* (2006.01)
    *H01L 29/66* (2006.01)
    *H01L 29/775* (2006.01)
    *B82Y 10/00* (2011.01)

(58) Field of Classification Search
    CPC ......... H01L 29/0847; H01L 21/823842; H01L 27/092; H01L 21/823828; H01L 21/76224; H01L 21/823481; H01L 21/823878; H01L 29/0649; H01L 21/823807; H01L 29/78696; H01L 29/66439; H01L 29/775; H01L 21/823412; H01L 29/0673; H01L 29/66787
See application file for complete search history.

(56) References Cited

U.S. PATENT DOCUMENTS

| | | |
|---|---|---|
| 2020/0091145 A1 | 3/2020 | Guha et al. |
| 2020/0287015 A1 | 9/2020 | Subramanian et al. |
| 2021/0265508 A1* | 8/2021 | Chiang ............. H01L 29/78696 |

FOREIGN PATENT DOCUMENTS

| | | |
|---|---|---|
| KR | 20190112910 A | 10/2019 |
| KR | 20200023960 A | 3/2020 |
| WO | WO2000060659 A1 | 10/2000 |
| WO | WO2016099570 A1 | 12/2014 |
| WO | WO2015094305 A1 | 6/2015 |

OTHER PUBLICATIONS

Chen, Guan-Lin et al., "Self-Aligned Metal Gate for Multigate Device", U.S. Appl. No. 17/174,109; Assignee: Taiwan Semiconductor Manufacturing Co., Ltd. 66 Pages of specification, 30 pages of drawings.

Ju, Shi Ning et al., "Gate Isolation for Multigate Device" U.S. Appl. No. 17/170,740; Assignee: Taiwan Semiconductor Manufacturing Co., Ltd, 75 Pages of Specification, 28 pages of drawings.

* cited by examiner

GATE ISOLATION FOR MULTIGATE DEVICE

This application is a non-provisional application of and claims benefit of U.S. Provisional Patent Application Ser. No. 63/032,178, filed May 29, 2020, the entire disclosure of which is incorporated herein by reference.

BACKGROUND

Multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. However, as GAA devices continue to scale, non-self-aligned gate cutting techniques typically implemented to isolate gates of different GAA devices from one another, such as a first gate of a first GAA transistor from a second gate of a second GAA transistor, are hindering the dense packing of IC features needed for advanced IC technology nodes. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
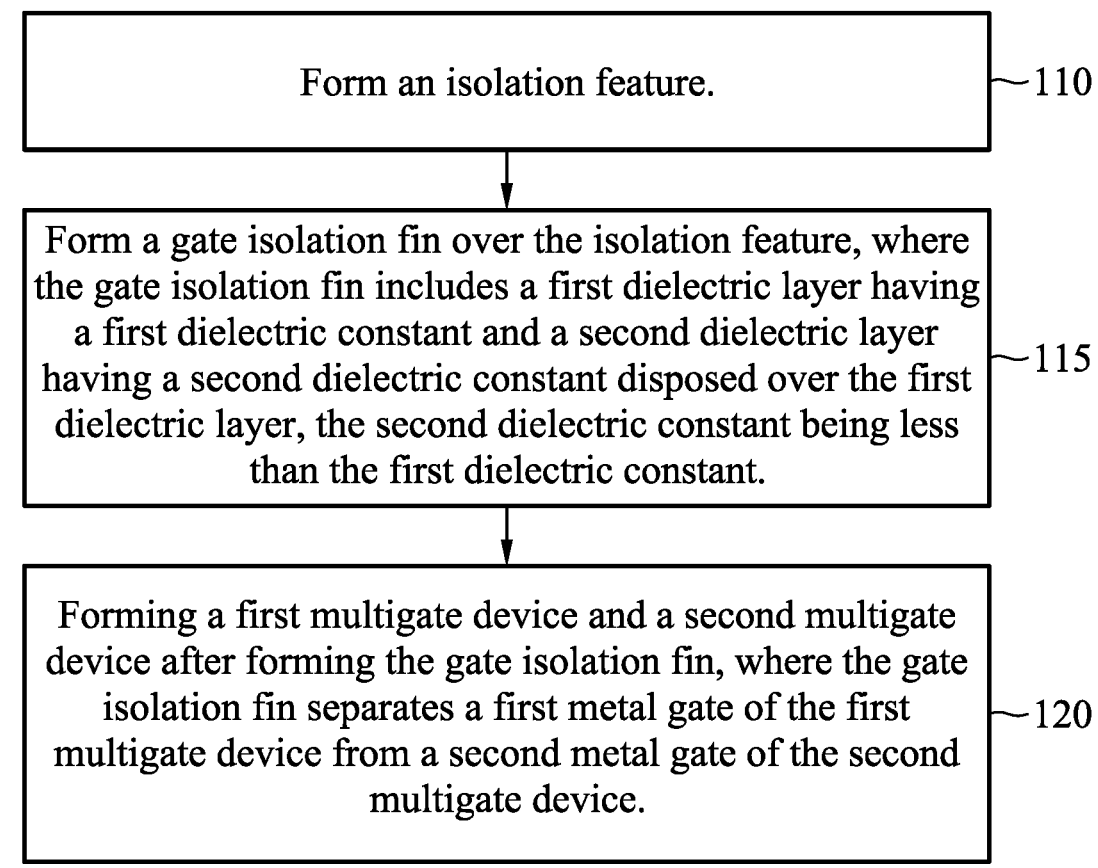
FIG. 1 is a flow chart of a method for fabricating a gate cut isolation structure for a multigate device according to various aspects of the present disclosure.

The present disclosure relates generally to integrated circuit devices, and more particularly, to gate isolation techniques for multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An exemplary non-self-aligned gate cutting technique can involve forming a mask layer over a gate stack, where the mask layer covers a first portion of the gate stack and a second portion of the gate stack and exposes a third portion of the gate stack via an opening formed in the mask layer. The third portion of the gate stack is disposed between the first portion of the gate stack and the second portion of the gate stack. An etching process is then performed that removes the exposed third portion of the gate stack (including, for example, at least one gate electrode layer and at least one gate dielectric layer), thereby forming a gate opening between and separating the first portion of the gate stack from the second portion of the gate stack. A gate isolation feature, such as a dielectric layer (for example, a silicon nitride layer), is then formed in the gate opening to provide electrical isolation between the first portion of the gate stack, which may be disposed over a first channel layer of a first GAA device (i.e., first active device area), and the second portion of the gate stack, which may be disposed over a second channel layer of a second GAA device (i.e., second active device area).

A spacing between active device areas, such as the first channel layer and the second channel layer, is intentionally designed larger than necessary to compensate for process variations that arise during the non-self-aligned gate cutting technique. For example, etch loading effects and/or other loading effects may reduce critical dimension uniformity (CDU) across a wafer, such that in some locations, a width of the opening in the mask layer and/or a width of the gate opening may be larger than a target width, which can lead to unintentional exposure and/or damage of the first channel layer, the second channel layer, the first portion of the gate stack, and/or the second portion of the gate stack. In another example, overlay shift arising from lithography processes may result in the opening in the mask layer shifted left or right of its intended position, which can also lead to unintentional exposure and/or damage of the first channel layer, the second channel layer, the first portion of the gate stack, and/or the second portion of the gate stack. The increased spacing required between the active device areas to adequately compensate for such process variations prevents compact packing of active device areas and thus compact cell heights desired for scaled memory devices.

The present disclosure proposes self-aligned gate cutting (isolation) techniques for multigate devices that allow for smaller spacing between active device areas (and thus smaller cell heights) compared to spacing required between active device areas for non-self-aligned gate cutting techniques. The proposed self-aligned gate cutting techniques form metal gate isolation structures (e.g., gate isolation fins) at a first stage of multigate device fabrication, which typically involves defining active regions of a multigate device. For example, gate isolation fins are formed after forming isolation features (e.g., shallow trench isolation structures) that define the active regions of the multigate device and before forming metal gates of the multigate device. In some embodiments, gate isolation fins are formed after defining fin active regions of the multigate device and/or after forming n-wells and/or p-wells in the active regions of the multigate device. In some embodiments, the gate isolation fins are formed before forming gate structures (e.g., dummy gate stacks, metal gate stacks, and/or gate spacers) and source/drain features. Because the gate isolation fins are formed at the first stage of multigate device fabrication, the disclosed metal gate cut techniques do not have to account for lithography process variations (e.g., overlay errors), allowing for smaller spacings between active regions of transistors, and thus smaller cell heights. Multigate devices fabricated using such techniques can thus increase packing density of transistors and IC pattern density. The proposed metal gate cut techniques also provide for trimming the gate isolation fins during gate replacement (e.g., when dummy gate stacks are replaced with the metal gates) to enlarge metal gate fill windows, thereby improving processing. Details of the proposed self-aligned gate cutting technique for multigate devices and resulting multigate devices are described herein in the following pages.

FIG. 1 is a flow chart of a method 100 for fabricating a multigate device according to various aspects of the present disclosure. In some embodiments, method 100 fabricates a p-type multigate transistor and/or an n-type multigate transistor. At block 110, method 100 includes forming an isolation feature, such as a shallow trench isolation structure, a deep trench isolation structure, other isolation structure, or combinations thereof, in a substrate. At block 115, method 100 includes forming a gate isolation fin over the isolation feature. The gate isolation fin physically contacts the isolation feature. The gate isolation fin includes a first dielectric layer having a first dielectric constant and a second dielectric layer having a second dielectric constant disposed over the first dielectric layer. The second dielectric constant is less than the first dielectric constant. In some embodiments, the gate isolation fin further includes a third dielectric layer disposed over the second dielectric layer. In some embodiments, the first dielectric constant is less than about seven and the second dielectric constant is greater than about seven. In some embodiments, the gate isolation fin further includes an oxide layer disposed over the second dielectric layer. In some embodiments, the gate isolation fin further includes a third dielectric layer having a third dielectric constant disposed over the oxide layer, where the third dielectric constant is less than the first dielectric constant. At block 120, method 100 includes forming a first multigate device and a second multigate device after forming the gate isolation fin. The first multigate device has a first channel layer, a first metal gate, and first source/drain features. The first channel layer is disposed between the first source/drain features, and the first metal gate surrounds the first channel layer. The second multigate device has a second channel layer, a second metal gate, and second source/drain features. The second channel layer is disposed between the second source/drain features, and the second metal gate surrounds the second channel layer. The gate isolation fin is disposed between and separating the first metal gate and the second metal gate. In some embodiments, the first metal gate is disposed between and physically contacts the first channel layer and the gate isolation fin, and the second metal gate is disposed between and physically contacts the second channel layer and the gate isolation fin. Additional steps can be provided before, during, and after method 100, and some of the steps described can be moved, replaced, or eliminated for additional embodiments of method 100. The discussion that follows illustrates various embodiments of multigate-based integrated circuit devices that can be fabricated according to method 100.

FIGS. 2-9, FIGS. 10A-10D, FIGS. 11A-11D, FIGS. 12A-12D, FIGS. 13A-13D, FIGS. 14A-14C, FIGS. 15A-15C, FIGS. 16A-16C, FIGS. 17A-17C, FIGS. 18A-18D, FIGS. 19A-19D, FIGS. 20A-20E, FIGS. 21A-21D, FIGS. 22A-22D, FIGS. 23A-23D, FIGS. 24A-24D, FIGS. 25A-25D, and FIGS. 26A-26D are fragmentary perspective views of a multigate device 200, in portion or entirety, at various fabrication stages (such as those associated with method 100 in FIG. 1) according to various aspects of the present disclosure. As described herein, multigate device 200 is processed to form multigate transistors, which generally refers to transistors having gates that engage channels on at least two sides. In some embodiments, the multigate transistors have gates that surround the channels, and these multigate transistors can be referred to as GAA transistors. In some embodiments, multigate device 200 may be a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Multigate device 200 may be included in a microprocessor, a memory, and/or other IC device. FIGS. 2-9, FIGS. 10A-10D, FIGS. 11A-11D, FIGS. 12A-12D, FIGS. 13A-13D, FIGS. 14A-14C, FIGS. 15A-15C, FIGS. 16A-16C, FIGS. 17A-17C, FIGS. 18A-18D, FIGS. 19A-19D, FIGS. 20A-20E, FIGS. 21A-21D, FIGS. 22A-22D, FIGS. 23A-23D, FIGS. 24A-24D, FIGS. 25A-25D, and FIGS. 26A-26D have been simplified for the sake of clarity to better understand the inventive concepts of the present disclosure. Additional features can be added in multigate device 200, and some of the features described below can be replaced, modified, or eliminated in other embodiments of multigate device 200.

Figure 2:
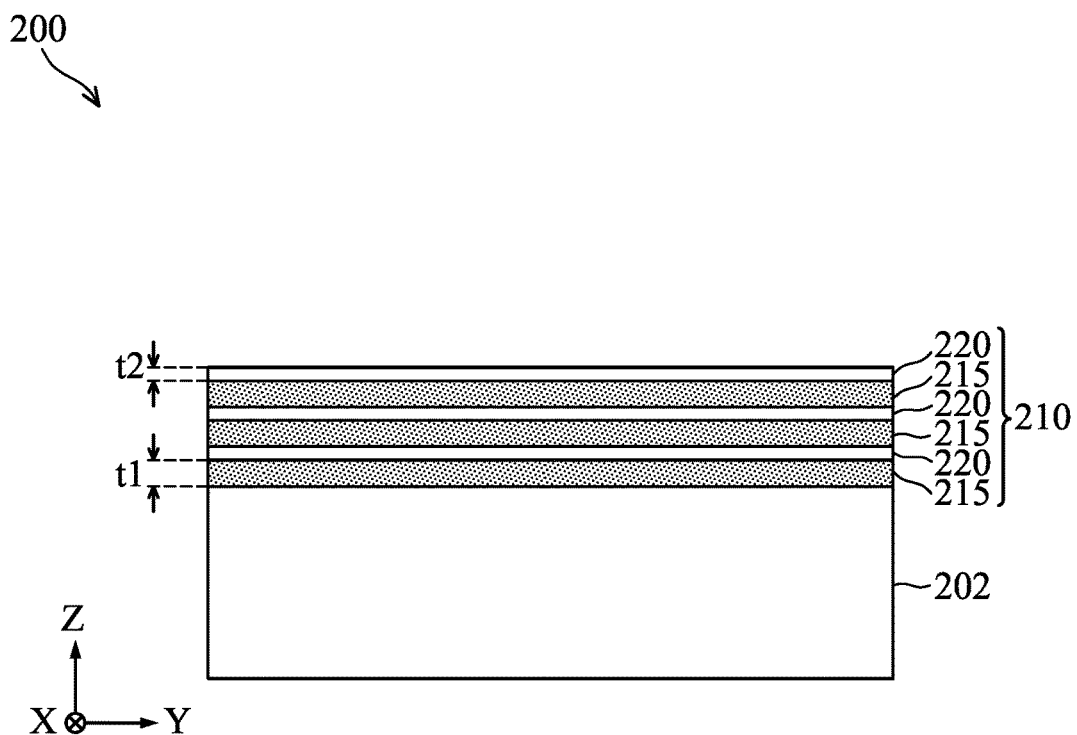
FIGS. 2-9, FIGS. 10A-10D, FIGS. 11A-11D, FIGS. 12A-12D, FIGS. 13A-13D, FIGS. 14A-14C, FIGS. 15A-15C, FIGS. 16A-16C, FIGS. 17A-17C, FIGS. 18A-18D, FIGS. 19A-19D, FIGS. 20A-20E, FIGS. 21A-21D, FIGS. 22A-22D, FIGS. 23A-23D, FIGS. 24A-24D, FIGS. 25A-25D, and FIGS. 26A-26D are fragmentary perspective views of a multigate device, in portion or entirety, at various fabrication stages (such as those associated with the method in FIG. 1) according to various aspects of the present disclosure.

Turning to FIG. 2, multigate device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 includes various doped regions, such as p-type doped regions (referred to as p-wells) and/or n-type doped regions (referred to as n-wells). For example, portions of substrate 202 that correspond with n-type transistors can include p-wells and portions of substrate 202 that correspond with p-type transistors can include n-wells. N-wells are doped with n-type dopants, such as phosphorus, arsenic, other n-type dopant, or combinations thereof. P-wells are doped with p-type dopants, such as boron, indium, other p-type dopant, or combinations thereof. In some embodiments, substrate 202 includes doped regions formed with a combination of p-type dopants and n-type dopants. The doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the doped regions.

A semiconductor layer stack 210 is formed over substrate 202, where semiconductor layer stack 205 includes semiconductor layers 215 and semiconductor layers 220 stacked vertically (e.g., along the z-direction) in an interleaving or alternating configuration from a top surface of substrate 202. In some embodiments, semiconductor layers 215 and semiconductor layers 220 are epitaxially grown in the depicted interleaving and alternating configuration. For example, a first one of semiconductor layers 215 is epitaxially grown on substrate 202, a first one of semiconductor layers 220 is epitaxially grown on the first one of semiconductor layers 215, a second one of semiconductor layers 215 is epitaxially grown on the first one of semiconductor layers 220, and so on until semiconductor layer stack 210 has a desired number of semiconductor layers 215 and semiconductor layers 220. In such embodiments, semiconductor layers 215 and semiconductor layers 220 can be referred to as epitaxial layers. In some embodiments, epitaxial growth of semiconductor layers 215 and semiconductor layers 220 is achieved by a molecular beam epitaxy (MBE) process, a chemical vapor deposition (CVD) process, a metalorganic chemical vapor deposition (MOCVD) process, other suitable epitaxial growth process, or combinations thereof. A composition of semiconductor layers 215 is different than a composition of semiconductor layers 220 to achieve etching selectivity and/or different oxidation rates during subsequent processing. In some embodiments, semiconductor layers 215 have a first etch rate to an etchant and semiconductor layers 220 have a second etch rate to the etchant, where the second etch rate is different than the first etch rate. In some embodiments, semiconductor layers 215 have a first oxidation rate and semiconductor layers 220 have a second oxidation rate, where the second oxidation rate is different than the first oxidation rate. In the depicted embodiment, semiconductor layers 215 and semiconductor layers 220 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 215 include silicon germanium and semiconductor layers 220 include silicon, a silicon etch rate of semiconductor layers 220 is less than a silicon germanium etch rate of semiconductor layers 215. In some embodiments, semiconductor layers 215 and semiconductor layers 220 include the same material but with different constituent atomic percentages to achieve the etching selectivity and/or different oxidation rates. For example, semiconductor layers 215 and semiconductor layers 220 can include silicon germanium, where semiconductor layers 215 have a first silicon atomic percent and/or a first germanium atomic percent and semiconductor layers 220 have a second, different silicon atomic percent and/or a second, different germanium atomic percent. The present disclosure contemplates that semiconductor layers 215 and semiconductor layers 220 include any combination of semiconductor materials that provides desired etching selectivity, desired oxidation rate differences, and/or desired performance characteristics (e.g., materials that maximize current flow), including any of the semiconductor materials disclosed herein.

As described further below, semiconductor layers 220 or portions thereof will form channel regions of multigate device 200. In the depicted embodiment, semiconductor layer stack 210 includes three semiconductor layers 215 and three semiconductor layers 220 configured to form three semiconductor layer pairs disposed over substrate 202, each semiconductor layer pair having a respective semiconductor layer 215 and a respective semiconductor layer 220. After undergoing subsequent processing, such configuration will result in multigate device 200 having three channels. However, the present disclosure contemplates embodiments where semiconductor layer stack 210 includes more or less semiconductor layers, for example, depending on a number of channels desired for multigate device 200 and/or design requirements of multigate device 200. For example, semiconductor layer stack 210 can include two to ten semiconductor layers 215 and two to ten semiconductor layers 220. In furtherance of the depicted embodiment, semiconductor layers 215 have a thickness t1 and semiconductor layers 220 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 220 when suspended), thickness t2 can be configured to achieve desired thickness of channels of multigate device 200, and thickness t1 and thickness t2 can be configured to achieve desired performance of multigate device 200. In some embodiments, thickness t1 and thickness t2 are each about 1 nm to about 10 nm. In some embodiments, semiconductor layers 220 include n-type and/or p-type dopants depending on their corresponding transistor. For example, semiconductor layers 220 in an n-type transistor region of multigate device 200 can include p-type dopants and semiconductor layers 220 in a p-type transistor region of multigate device 200 can include n-type dopants.

Figure 3:
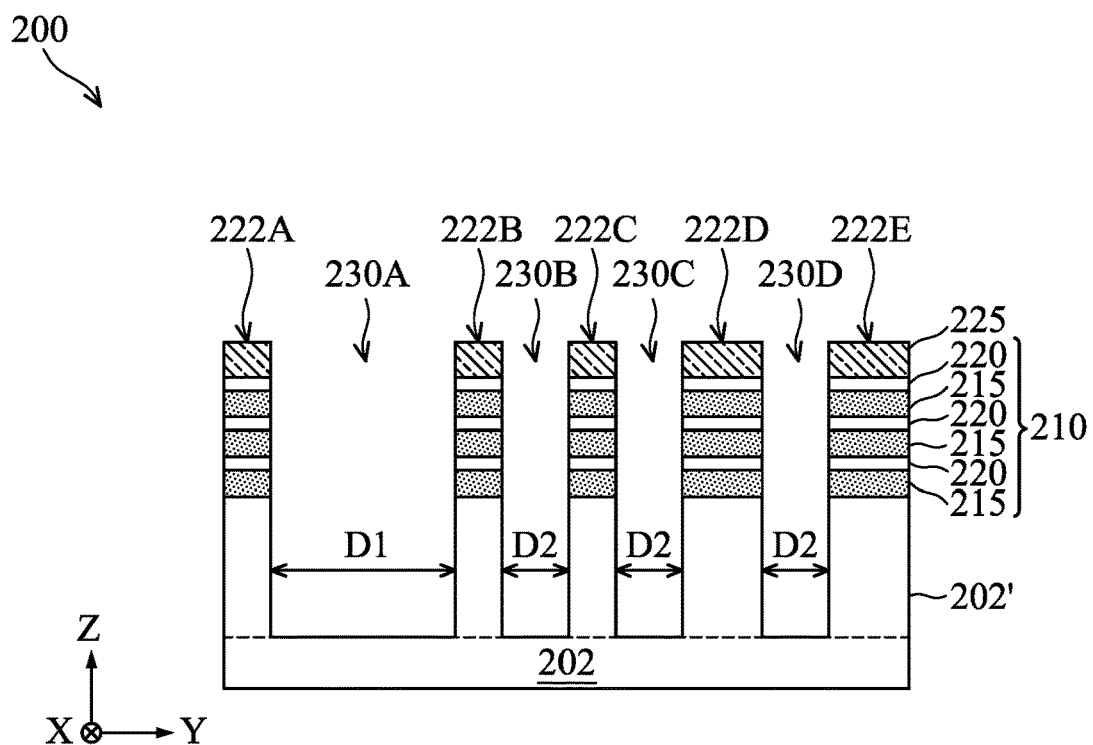

Turning to FIG. 3, a fin fabrication process is performed to form fins extending from substrate 202. For example, a fin 222A, a fin 222B, a fin 222C, a fin 222D, and a fin 222E (also referred to as fin structures, fin elements, active fin regions, etc.) extend from substrate 202 after the fin fabrication process. Fins 222A-222E each include a substrate portion (i.e., a fin portion 202' of substrate 202 (also referred to as a substrate extension, a substrate fin portion, an etched substrate portion, etc.)), a semiconductor layer stack portion (i.e., a portion of semiconductor layer stack 210 that includes semiconductor layers 215 and semiconductor layers 220) disposed over the substrate portion, and a patterning layer portion (i.e., a patterning layer 225) disposed over the semiconductor layer stack portion. Fins 222A-222E each extend substantially parallel to one another along an x-direction, having a length defined in the x-direction, a width defined in a y-direction, and a height defined in a z-direction. Various trenches are defined between fin active regions, such as fins 222A-222E. For example, a trench 230A is defined between fin 222A and fin 222B, a trench 230B is defined between fin 222B and fin 222C, a trench 230C is defined between fin 222C and fin 222D, and a trench 230D is defined between fin 222D and fin 222E. Trenches 230A-230D can have the same or different widths, resulting in the same or different spacings (distances) between fin active regions. In the depicted embodiment, multigate device 200 is configured with different spacings (distances) between fin active regions, such as a spacing D1 and a spacing D2. For example, fin 222A and fin 222B are separated by spacing D1, whereas fin 222B and fin 222C, fin 222C and fin 222D, and fin 222D and fin 222E are separated by spacing D2, where spacing D1 is greater than spacing D2. The different spacings (e.g., D1>D2) leads to different trench filling effects and thus different configurations of material filling trenches 230A and trenches 230B-230D, as described further below. In some embodiments, a ratio of spacing D1 to spacing D2 (i.e., D1/D2) greater than or equal to about 1.2 leads to different trench fill effects. In some embodiments, spacing D1 is greater than about 40 nm and spacing D2 is about 30 nm to about 50 nm, where spacing D1 is greater than spacing D2.

In some embodiments, a lithography and/or etching process is performed to pattern a semiconductor layer stack to form fins 222A-222E. The lithography process can include forming a resist layer over semiconductor layer stack 210 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 210 using the patterned resist layer as an etch mask. In some embodiments, the patterned resist layer is formed over a mask layer disposed over semiconductor layer stack 210, a first etching process removes portions of the mask layer to form patterning layer 225 (i.e., a patterned hard mask layer), and a second etching process removes portions of semiconductor layer stack 210 using patterning layer 225 as an etch mask. The etching process can include a dry etching process, a wet etching process, other suitable etching process, or combinations thereof. In some embodiments, the etching process is a reactive ion etching (RIE) process. After the etching process, the patterned resist layer is removed, for example, by a resist stripping process or other suitable process. Alternatively, fins 222A-222E are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Such processes can also provide fins 222A-222E with patterning layer 225, semiconductor layer stack 210, and fin portion 202', as depicted in FIG. 3. In some embodiments, directed self-assembly (DSA) techniques are implemented while patterning semiconductor layer stack 210. Further, in some embodiments, the exposure process can implement maskless lithography, electron-beam (e-beam) writing, and/or ion-beam writing for patterning the resist layer.

Figure 4:
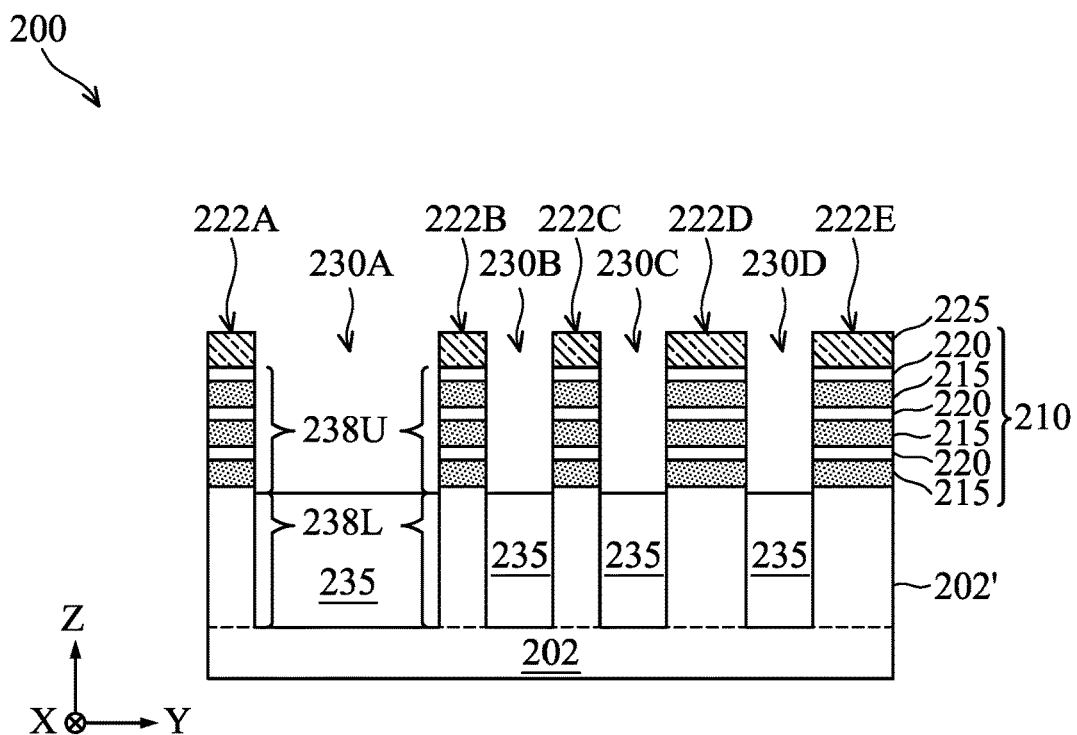

Turning to FIG. 4, isolation features 235 are formed in trenches 230A-230D, such that fins 222A-222E extend (protrude) from between isolation features 235. For example, isolation features 235 surround bottom portions of fins 222A-222E, thereby defining upper fin active regions 238U of fins 222A-222E (generally referring to portions of fins 222A-222E that extend from top surfaces of isolation features 235) and lower fin active regions 238L of fins 222A-222E (generally referring to portions of fins 222A-222E surrounded by isolation features 235 and extending from the top surface of substrate 202 to the top surfaces of isolation features 235). Isolation features 235 electrically isolate active device regions, such as fin active regions, and/or passive device regions of multigate device 200. For example, isolation features 235 separate and electrically isolate fins 222A-222E from each other. Isolation features 235 include silicon oxide, silicon nitride, silicon oxynitride, other suitable isolation material (for example, including silicon, oxygen, nitrogen, carbon, or other suitable isolation constituent), or combinations thereof. Various dimensions and/or characteristics of isolation features 235 can be configured during processing to achieve shallow trench isolation (STI) structures, deep trench isolation (DTI) structures, and/or local oxidation of silicon (LOCOS) structures, other suitable isolation structures, or combinations thereof. In the depicted embodiment, isolation features 235 are STIs. Isolation features 235 can be formed by depositing an insulator material (e.g., an oxide material) over substrate 202 after forming fins 222A-222E, such that a thickness of the insulator material is greater than a height of fins 222A-222E (i.e., the insulator material overfills trenches 230A-230D); planarizing (for example, by a chemical mechanical polishing (CMP) process) the insulator material, thereby reducing the thickness of the insulator material, for example, until it is equal to a height of fins 222A-222E; and etching back (recessing) the insulator material to form isolation features 235. The deposition process may be a flowable CVD (FCVD) process, a high aspect ratio deposition (HARP) process, a high-density plasma CVD (HDPCVD) process, other suitable deposition process, or combinations thereof. In some embodiments, patterning layer 225 of fins 222A-222E functions as a planarization (e.g., CMP) stop layer, such that the planarization process is performed until reaching and exposing patterning layer 225. In some embodiments, isolation features 235 include a multi-layer structure that fills trenches 230A-230D, such as a silicon nitride bulk layer disposed over an oxide liner layer. In some embodiments, isolation features 235 include a dielectric bulk layer disposed over a doped liner layer (including, for example, boron silicate glass (BSG) or phosphosilicate glass (PSG)). In some embodiments, isolation features 235 include a dielectric bulk layer disposed over a dielectric liner layer, where the dielectric bulk layer and the dielectric liner layer include materials depending on design requirements. In some embodiments, the etching process recesses the insulator material until achieving a desired (target) height of upper fin active regions 238U. In the depicted embodiment, the etching process proceeds until fully exposing semiconductor layer stacks 210 and partially exposing fin portions 202' of fins 222A-222E, such that top surfaces of fin portions 202' are higher than top surfaces of isolation features 235 relative to the top surface of substrate 202. In some embodiments, the etching process proceeds until fully exposing semiconductor layer stacks 210 and reaching fin portions 202', such that top surfaces of fin portions 202' are substantially planar with top surfaces of isolation features 235. In some embodiments, semiconductor layer stacks 210 are partially, instead of fully exposed, by the etching process, such that top surfaces of fin portions 202' are lower than top surfaces of isolation features 235 relative to the top surface of substrate 202.

Figure 5:
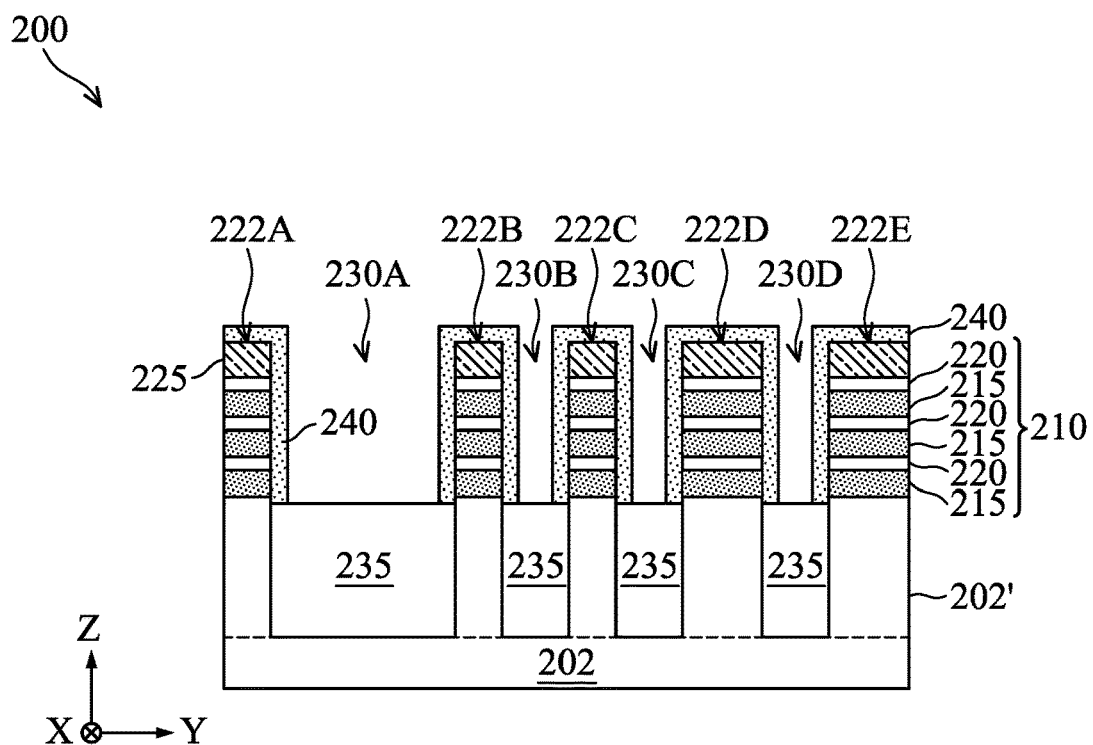

Turning to FIG. 5, silicon germanium sacrificial layers 240 having a thickness t3 are formed over fins 222A-222E. In the depicted embodiment, silicon germanium sacrificial layers 240 are formed on top surfaces and sidewalls of upper fin active regions 238U of fins 222A-222E, such that silicon germanium sacrificial layers wrap upper fin active regions 238U. In furtherance of the depicted embodiment, upper portions of trenches 230A-230D are partially filled with silicon germanium sacrificial layers 240. In some embodiments, thickness t3 is about 4 nm to about 12 nm. Thickness t3 may be selected depending on desired inner spacer thicknesses of multigate device 200. In some embodiments, silicon germanium sacrificial layers 240 are formed by depositing a silicon germanium layer over fins 222A-222E and etching the silicon germanium layer to have thickness t3 and/or a desired profile. In some embodiments, the silicon germanium layer selectively deposits over fins 222A-222E. In some embodiments, the silicon germanium layer blanket deposits over fins 222A-222E and isolation features 235. In such embodiments, the etching process is configured to remove the silicon germanium layer from over isolation features 235, such that the silicon germanium layer remains on fins 222A-222E. Silicon germanium sacrificial layers 240 can also be referred to as silicon germanium cladding layers, silicon germanium helmets, and/or a silicon germanium protection layers.

Figure 6:
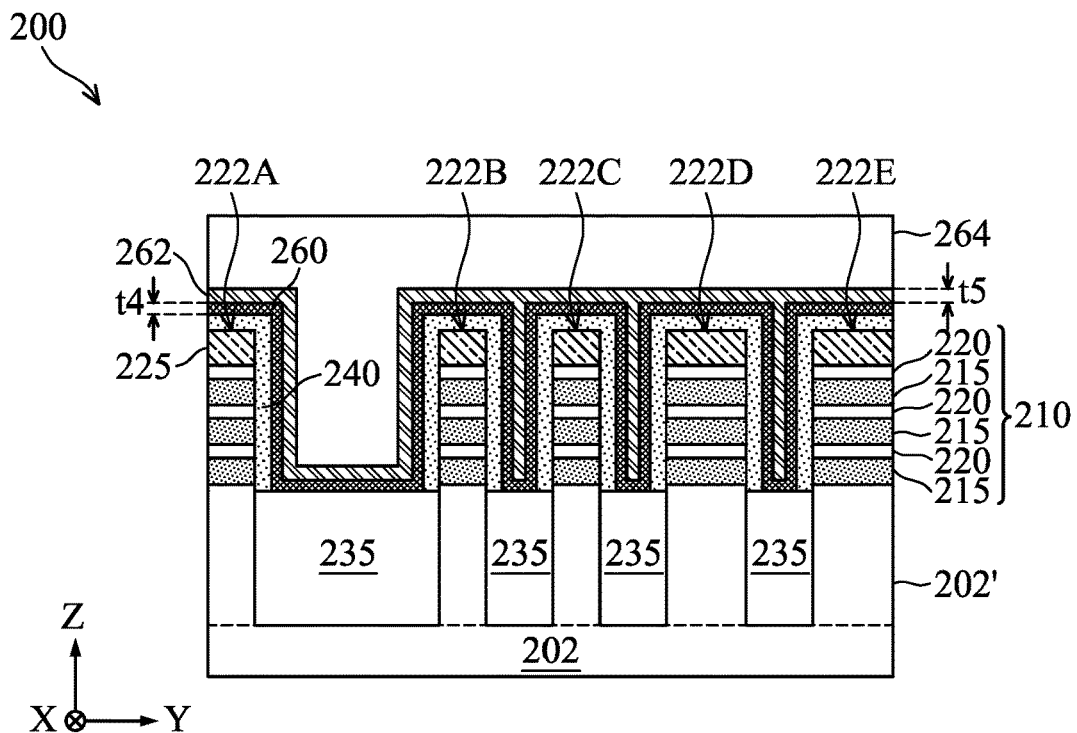

Turning to FIG. 6, a dielectric liner 260 having a thickness t4 is deposited over multigate device 200, a dielectric liner 262 having a thickness t5 is deposited over dielectric liner 260, and an oxide layer 264 is deposited over dielectric liner 262. Because a width of trench 230A is greater than a width of trenches 230B-230D, a remainder of upper portion of trench 230A is filled by oxide layer 264, dielectric liner 262, and dielectric liner 264, while remainders of upper portions of trenches 230B-230D are filled by dielectric liner 262 and dielectric liner 264. In some embodiments, thickness t4 is about 2 nm to about 10 nm. In some embodiments, thickness t5 is about 3 nm to about 10 nm. Dielectric liner 260, dielectric liner 262, and/or oxide layer 264 are deposited by any suitable deposition process, such as chemical vapor deposition (CVD), physical vapor deposition (PVD), atomic layer deposition (ALD), HDPCVD, FCVD, HARP, metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), sub-atmospheric chemical vapor deposition (SACVD), other suitable deposition processes, or combinations thereof. In some embodiments, an ALD process is performed to form dielectric liner 260 and/or dielectric liner 262, and a CVD process is performed to form oxide layer 264. In some embodiments, thickness t4 and/or thickness t5 is substantially uniform over various surfaces of multigate device 200. For example, thickness t4 is substantially the same along top surfaces of silicon germanium sacrificial layers 240, sidewall surfaces of silicon germanium sacrificial layers 240 (which define sidewalls of remaining upper portions of trenches 230A-230D), and top surfaces of isolation features 235 (which define bottoms of remaining upper portions of trenches 230A-230D). In another example, thickness t5 is substantially the same along top surfaces of silicon germanium sacrificial layers 240, sidewall surfaces of silicon germanium sacrificial layers 240 in trench 230A (which defining sidewalls of remaining upper portion of trench 230A), and top surface of isolation feature 235 in trench 230A (which defines a bottom of remaining upper portion of trench 230A).

Dielectric liner 260 includes a dielectric material having a dielectric constant that is greater than a dielectric constant of a dielectric material of dielectric liner 262. In the depicted embodiment, dielectric liner 260 includes a dielectric material having a dielectric constant that is greater than about 7.0 (k≥7.0), and dielectric liner 262 includes a dielectric material having a dielectric constant that is less than about 7.0 (k≤7.0). For purposes of the present disclosure, dielectric materials having a dielectric constant greater than about 7.0 are referred to as high-k dielectric materials, and dielectric materials having a dielectric constant less than about 7.0 are referred to as low-k dielectric materials. Dielectric liner 260 and dielectric liner 262 can thus be referred to as a high-k dielectric liner and a low-k dielectric liner, respectively. In some embodiments, dielectric liner 260 includes a dielectric material having a dielectric constant of about 7.0 to about 30.0, and dielectric liner 262 includes a dielectric material having a dielectric constant of about 1.0 to about 7.0. In some embodiments, dielectric liner 260 includes a metal-and-oxygen-comprising dielectric material having, for example, a dielectric constant of about 7.0 to about 30.0, such as a dielectric material that includes oxygen in combination with hafnium, aluminum, and/or zirconium. In such embodiments, dielectric liner 260 can also be referred to as a metal oxide layer. For example, dielectric liner 260 includes hafnium oxide (e.g., $HfO_x$), aluminum oxide ($AlO_x$), zirconium oxide ($ZrO_x$), or combinations thereof, where x is a number of oxygen atoms in the dielectric material of dielectric liner 260. In some embodiments, dielectric liner 260 includes n-type dopants and/or p-type dopants. In some embodiments, dielectric liner 260 includes $HfO_2$, HfSiO (e.g., $HfSiO$ or $HfSiO_4$), HfSiON, HfLaO, HfTaO, HfTiO, HfZrO, $HfAlO_x$, ZrO, $ZrO_2$, $ZrSiO_2$, AlO, AlSiO, Al$_2$O$_3$, TiO, TiO$_2$, LaO, LaSiO, Ta$_2$O$_3$, Ta$_2$O$_5$, Y$_2$O$_3$, SrTiO$_3$, BaZrO, BaTiO$_3$, (Ba,Sr)TiO$_3$, HfO$_2$—Al$_2$O$_3$, other suitable high-k dielectric material, or combinations thereof. In some embodiments, dielectric liner 262 includes a nitrogen-comprising dielectric material, such as a dielectric material that includes nitrogen in combination with silicon, carbon, and/or oxygen. In such embodiments, dielectric liner 262 can be referred to as a nitride liner. For example, dielectric liner 262 includes silicon nitride, silicon carbon nitride, silicon oxycarbonitride, or combinations thereof. In some embodiments, dielectric liner 262 includes n-type dopants and/or p-type dopants. For example, dielectric liner 262 can be a boron-doped nitride liner. In some embodiments, dielectric liner 262 includes a dielectric material having a dielectric constant that is less than a dielectric constant of silicon dioxide (SiO$_2$) (k≈3.9), such as fluorine-doped silicon oxide (e.g., fluorosilicate glass (FSG)), carbon-doped silicon oxide (e.g., carbon-doped FSG), Black Diamond® (Applied Materials of Santa Clara, Calif.), xerogel, aerogel, amorphous fluorinated carbon, parylene, benzocyclobutene (BCB)-based dielectric material, SiLK (Dow Chemical, Midland, Mich.), polyimide, other low-k dielectric material, or combinations thereof. In some embodiments, dielectric liner 262 includes BSG, PSG, and/or boron-doped PSG (BPSG).

In furtherance of the depicted embodiment, oxide layer 264 includes an oxide material (i.e., a material including oxygen and another chemical element (e.g., silicon)). For example, oxide layer 264 includes silicon and oxygen and can be referred to as a silicon oxide layer. The oxide material of oxide layer 264 and the low-k dielectric material of dielectric liner 262 are selected to ensure etching selectivity during subsequent etching processes, as described further below. In other words, oxide layer 264 and dielectric liner 262 include materials having distinct etching sensitivities to a given etchant. For example, oxide layer 264 includes an oxide material having an etch rate to an etchant that is greater than an etch rate of a low-k dielectric material of dielectric liner 262 to the etchant. In some embodiments, a composition of oxide layer 264 is tailored to achieve an etch selectivity (i.e., a ratio of an etch rate of oxide layer 264 to an etch rate of dielectric liner 262) that is greater than or equal to about 50:1. In some embodiments, oxide layer 264 includes a low-k dielectric material, where the low-k dielectric material is different than a low-k dielectric material of dielectric liner 262, such that desired etching selectivity is achieved between oxide layer 264 and dielectric liner 262.

Figure 7:
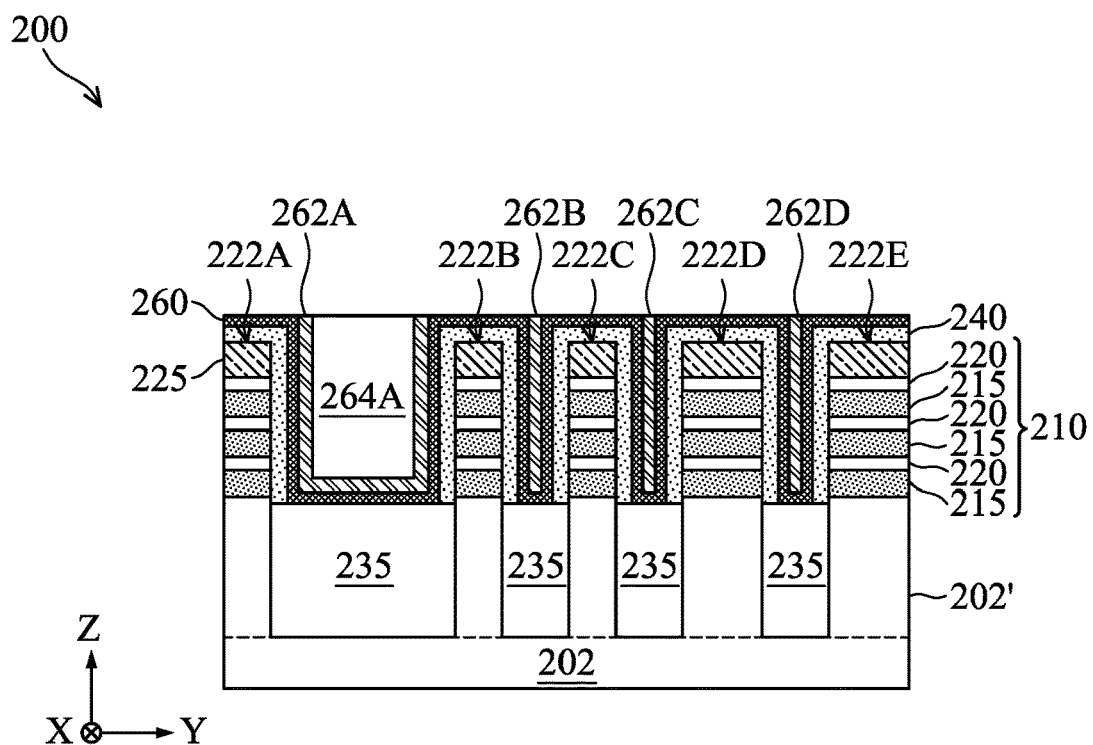

Turning to FIG. 7, a CMP process and/or other planarization process is performed on oxide layer 264 and dielectric liner 262. A remainder of oxide layer 264 and a remainder of dielectric liner 262 after the CMP process form a dielectric liner 262A and an oxide layer 264A in upper portion of trench 230A, a dielectric liner 262B in upper portion of trench 230B, a dielectric liner 262C in upper portion of trench 230C, and a dielectric liner 262D in upper portion of trench 230D. Dielectric liner 260 functions as a CMP stop layer, such that the CMP process is performed until reaching and exposing dielectric liner 260. The CMP process removes portions of oxide layer 264 and portions of dielectric liner 262 that are disposed over topmost surfaces of dielectric liner 260. The CMP process can planarize top surface of oxide layer 264A, topmost surfaces of dielectric liners 262A-262D, and topmost surfaces of dielectric liner 260, such that such surfaces are substantially planar after the CMP process.

Figure 8:
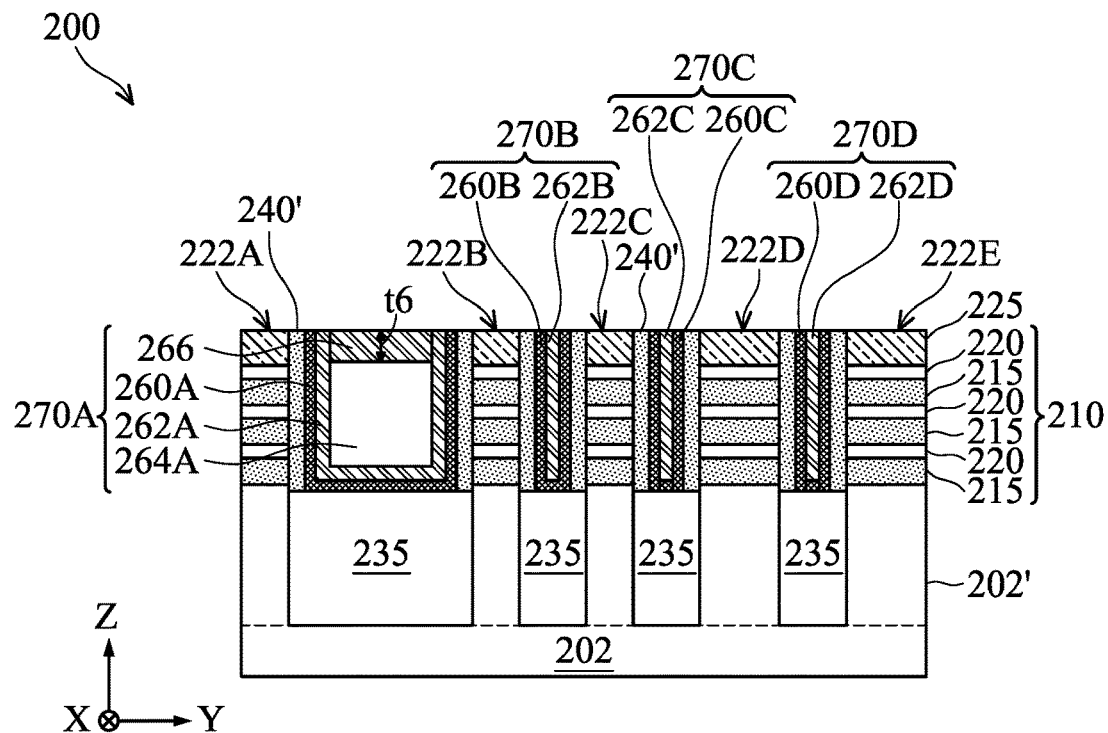

Turning to FIG. 8, a process is performed to replace a portion of oxide layer 264A with a dielectric capping layer 266. Dielectric capping layer 266 is similar to dielectric liners 262A-262D. For example, dielectric capping layer 266 includes a dielectric material having a dielectric constant less than about 7.0 (for example, a dielectric material having a dielectric constant of about 1.0 to about 7.0). Dielectric capping layer 266 is thus a low-k dielectric material and can include the same materials described above with reference to dielectric liner 262. In some embodiments, dielectric capping layer 266 includes a nitrogen-comprising dielectric material, such as a dielectric material that includes nitrogen in combination with silicon, carbon, and/or oxygen. For example, dielectric capping layer 266 includes silicon nitride, silicon carbon nitride, silicon oxycarbonitride, or combinations thereof. In such embodiments, dielectric capping layer 266 can be referred to as a nitride capping layer. In some embodiments, dielectric capping layer 266 and dielectric liners 262A-262D include the same low-k dielectric material. In some embodiments, dielectric capping layer 266 and dielectric liners 262A-262D include different low-k dielectric materials.

The process for replacing the portion of oxide layer 264A with dielectric capping layer 266 can include etching back (recessing) oxide layer 264 to form a recess having sidewalls defined by dielectric liner 262A and a bottom defined by a top surface of a recessed oxide layer 264A; depositing a dielectric capping material over multigate device 200, where the dielectric capping material is disposed over oxide layer 264A and fills the recess; and performing a planarization process, such as a CMP process, to remove any of the dielectric capping material that is disposed over top surfaces of fins 222A-222E. A remainder of the dielectric capping material forms dielectric capping layer 266 having a thickness t6. In some embodiments, thickness t6 is about 15 nm to about 50 nm. In some embodiments, oxide layer 264 is etched back until a distance defined between top surfaces of patterning layers 225 and oxide layer 264A meets a target thickness for dielectric capping layer 266. Recessing oxide layer 264 can be achieved by an etching process configured to selectively remove oxide layer 264 with respect to dielectric liners 262A-262D and, in some embodiments, with respect to dielectric liner 260. In other words, the etching process substantially removes oxide layer 264 but does not remove, or does not substantially remove, dielectric liners 262A-262D and/or dielectric liner 260. For example, an etchant is selected for the etch process that etches silicon-and-oxygen comprising dielectric materials (i.e., oxide layer 264) at a higher rate than silicon-and-nitrogen comprising dielectric materials (i.e., dielectric liners 262A-262D) (i.e., the etchant has a high etch selectivity with respect to silicon-comprising dielectric materials). In the depicted embodiment, patterning layers 225 of fins 222A-222E function as a planarization stop layer, such that the planarization process is performed until reaching and exposing patterning layers 225. In such embodiments, the CMP process also removes portions of dielectric liners 262A-262D, portions of dielectric liner 260, and portions of silicon germanium layers 240 that are disposed over the top surfaces of patterning layers 225, thereby forming a dielectric liner 260A, a dielectric liner 260B, a dielectric liner 260C, a dielectric liner 260D, and silicon germanium spacers 240'. The CMP process can planarize a top surface of dielectric capping layer 266, topmost surfaces of dielectric liners 262A-262D, topmost surfaces of dielectric liners 260A-260D, top surfaces of silicon germanium spacers 240', and top surfaces of patterning layers 225, such that these surfaces are substantially planar after the CMP process. In some embodiments, the dielectric capping material is formed by ALD, CVD, PVD, HDPCVD, MOCVD, RPCVD, PECVD, APCVD, SAVCD, other suitable deposition processes, or combinations thereof.

After forming dielectric capping layer 266, a gate isolation fin 270A and silicon germanium spacers 240' combine to fill upper portion of trench 230A, a gate isolation fin 270B and silicon germanium spacers 240' combine to fill upper portion of trench 230B, a gate isolation fin 270C and silicon germanium spacers 240' combine to fill upper portion of trench 230C, and a gate isolation fin 270D and silicon germanium spacers 240' combine to fill upper portion of trench 230D. Because a width of trench 230A (i.e., spacing D1 of fin 222A and fin 222B) is greater than a width of trenches 230B-230D (i.e., spacing D2 of fins 222B-222E), gate isolation fin 270A is different than gate isolation fins 270B-270D. For example, gate isolation fin 270A includes four dielectric layers (i.e., dielectric liner 260A, dielectric liner 262A, oxide layer 264A, and dielectric capping layer 266), whereas each of gate isolation fins 270B-270D include two dielectric layers (i.e., dielectric liners 260B-260D and dielectric liners 262B-262D, respectively, but not oxide layers or dielectric capping layers).

Figure 9:
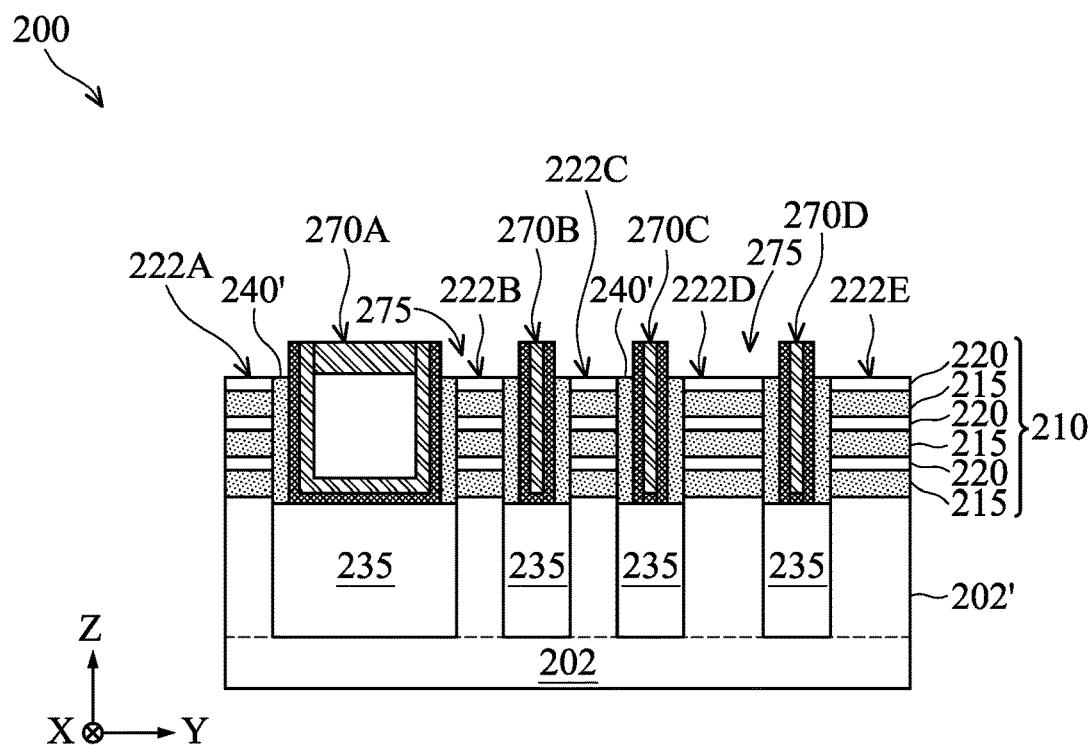

Turning to FIG. 9, an etching process is performed to remove patterning layers 225 from fins 222A-222E and portions of silicon germanium sacrificial spacers 240' disposed along sidewalls of patterning layers 225, thereby forming openings 275 between gate isolation fins 270A-270D that expose semiconductor layer stacks 210 of fins 222A-222E. In FIG. 9, top surfaces of gate isolation fins 270A-270D are higher than top surfaces of fins 222A-222E relative to the top surface of substrate 202. The etching process is configured to selectively remove patterning layers 225 and silicon germanium sacrificial spacers 240' with respect to gate isolation fins 270A-270D and semiconductor layers 220 of fins 222A-222E. In other words, the etching process substantially removes patterning layers 225 and portions of silicon germanium sacrificial spacers 240' disposed along sidewalls of patterning layers 225 but does not remove, or does not substantially remove, gate isolation fins 270A-270D and semiconductor layers 220. For example, an etchant is selected for the etch process that etches silicon-and-nitrogen comprising material (i.e., patterning layers 225, such as silicon nitride layers) and silicon germanium (i.e., silicon germanium sacrificial spacers 240') at a higher rate than metal-and-oxygen comprising material (i.e., dielectric liners 260A-260D, such as high-k dielectric layers), silicon-and-carbon comprising dielectric materials (which can also include nitrogen and/or oxygen) (i.e., dielectric liners 262A-262D and/or dielectric capping layer 266), and silicon (i.e., semiconductor layers 220) (i.e., the etchant has a high etch selectivity with respect to silicon nitride and silicon germanium). The etching process is a dry etching process, a wet etching process, or a combination thereof. In some embodiments, the etching process includes multiple steps, such as a first etch step that selectively etches patterning layers 225 and a second etch step that selectively etches silicon germanium sacrificial spacers 240' (e.g., the first etch step and the second etch step implement different etchants).

Figure 10A:
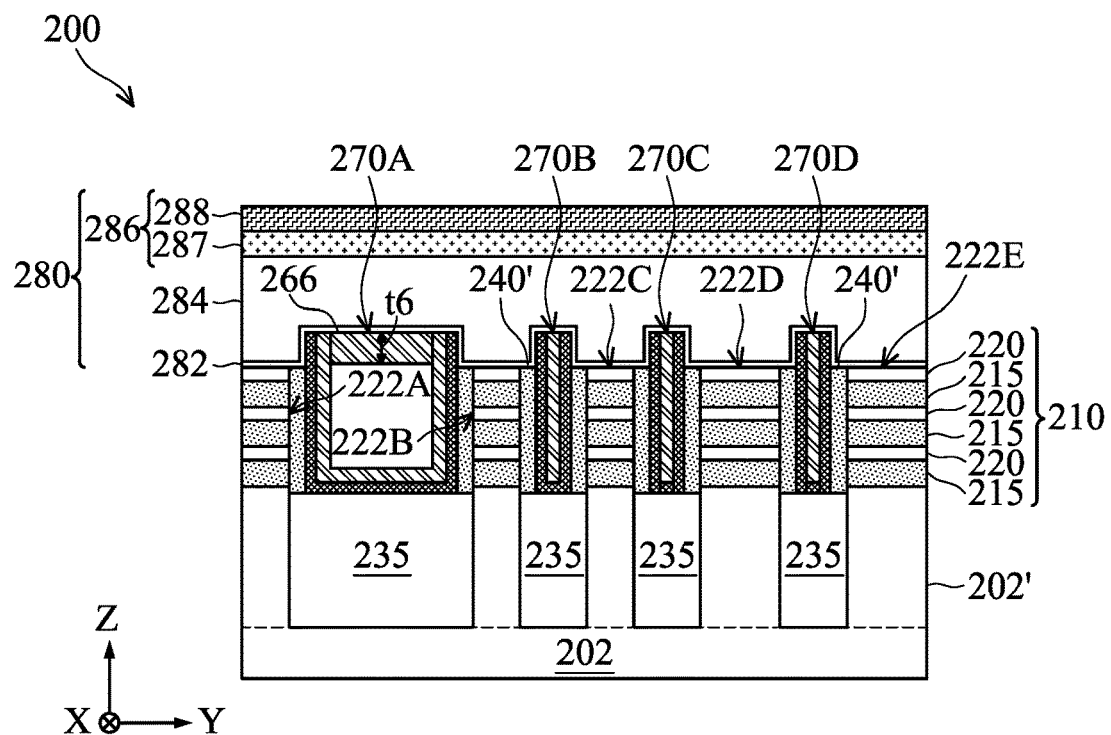
Figure 10B:
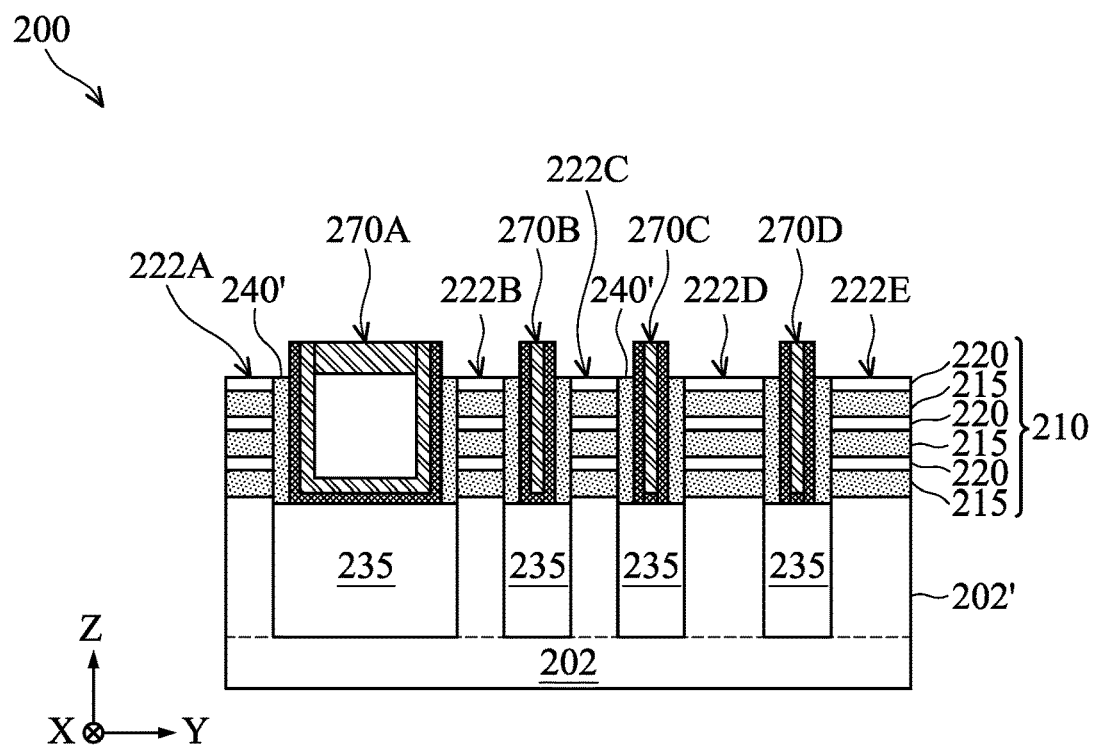
Figure 10C:
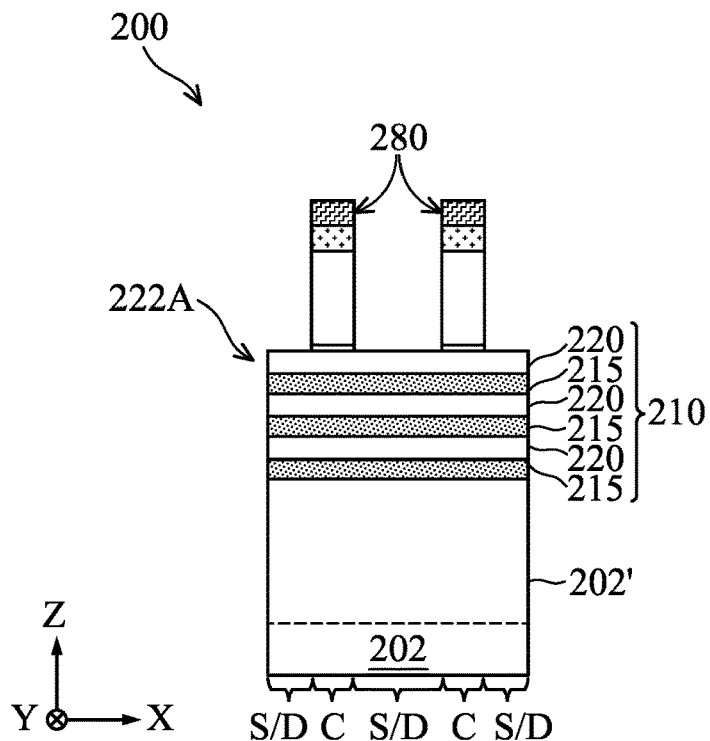
Figure 10D:
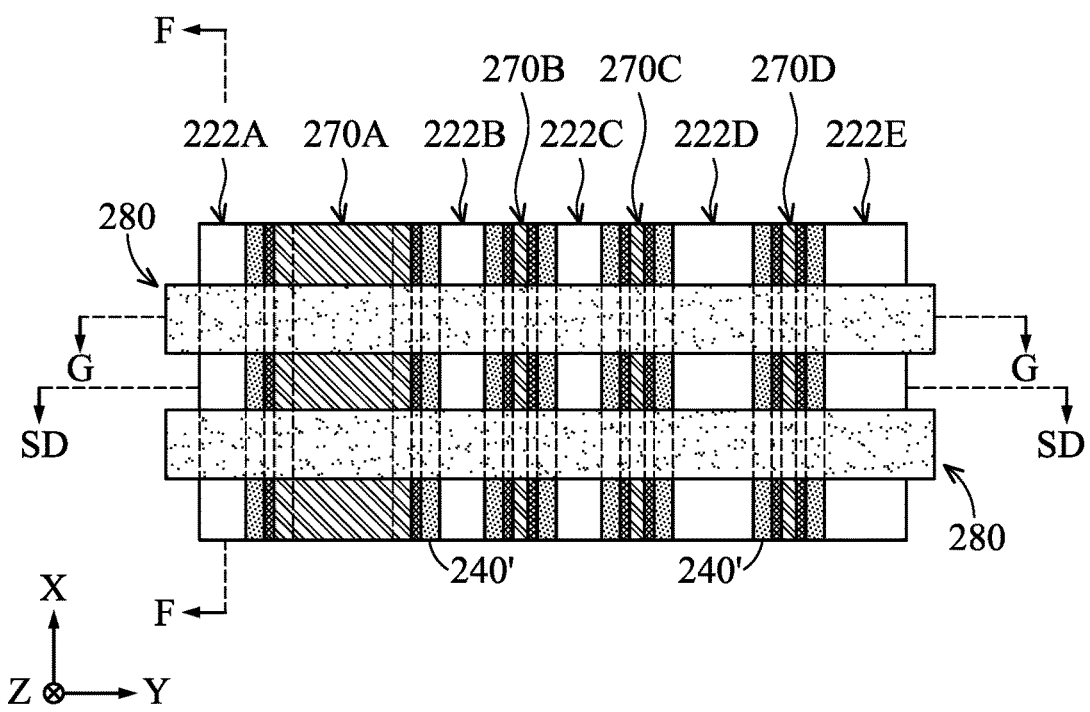

Turning to FIGS. 10A-10D, dummy gate stacks 280 are formed over portions of fins 222A-222E and dielectric fins 270A-270D. For ease of description and understanding, FIG. 10D is a top view of multigate device 200 after undergoing processing associated with FIGS. 2-9 and FIGS. 10A-10D; FIG. 10A is a cross-sectional view along line G-G in FIG. 10D (and can be referred to as a metal gate cut cross-sectional view); FIG. 10B is a cross-sectional view along line SD-SD in FIG. 10D (and can be referred to as a source/drain cut cross-sectional view); and FIG. 10C is a cross-sectional view along line F-F in FIG. 10D (and can be referred to as a fin cut cross-sectional view). In FIGS. 10A-10D, dummy gate stacks 280 fill openings 275. Dummy gate stacks 280 extend lengthwise in a direction that is different than (e.g., orthogonal to) the lengthwise direction of fins 222A-222E. For example, dummy gate stacks 280 extend substantially parallel to one another along the y-direction, having a length defined in the y-direction, a width defined in the x-direction, and a height defined in the z-direction. Dummy gate stacks 280 are disposed over channel regions (C) of multigate device 200 and between source/drain regions (S/D) of multigate device 200. In the X-Z plane, dummy gate stacks 280 are disposed on top surfaces of fins 222A-222E (in particular, top surfaces of semiconductor layer stacks 210), tops of gate isolation fins 270A-270D, and sidewalls of gate isolation fins 270A-270D, such that dummy gate stacks 280 wrap tops of gate isolation fins 270A-270D in channel regions of multigate device 200. In the Y-Z plane, dummy gate stacks 280 are disposed over top surfaces of respective channel regions of fins 222A-222E, such that dummy gate stacks 280 interpose respective source/drain regions of fins 222A-222E. Each dummy gate stack 280 includes a dummy gate dielectric 282, a dummy gate electrode 284, and a hard mask 286 (including, for example, a first mask layer 287 and a second mask layer 288). Dummy gate dielectric 282 includes a dielectric material, such as silicon oxide, a high-k dielectric material, other suitable dielectric material, or combinations thereof. In some embodiments, dummy gate dielectric 282 includes an interfacial layer (including, for example, silicon oxide) and a high-k dielectric layer disposed over the interfacial layer. Dummy gate electrode 284 includes a suitable dummy gate material, such as polysilicon, and hard mask 286 (including first mask layer 287 and second mask layer 288) includes any suitable hard mask material. In some embodiments, dummy gate stacks 280 include numerous other layers, for example, capping layers, interface layers, diffusion layers, barrier layers, or combinations thereof. Dummy gate stacks 280 are formed by deposition processes, lithography processes, etching processes, other suitable processes, or combinations thereof. For example, a first deposition process is performed to form a dummy gate dielectric layer over multigate device 200, a second deposition process is performed to form a dummy gate electrode layer over the dummy gate dielectric layer, and a third deposition process is performed to form a hard mask layer over the dummy gate electrode layer. The deposition processes include CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the hard mask layer, the dummy gate electrode layer, and the dummy gate dielectric layer to form dummy gate stacks 280, which include dummy gate dielectric 282, dummy gate electrode 284, and hard mask 286 as depicted in FIGS. 10A-10D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching processes, or combinations thereof.

Figure 11A:
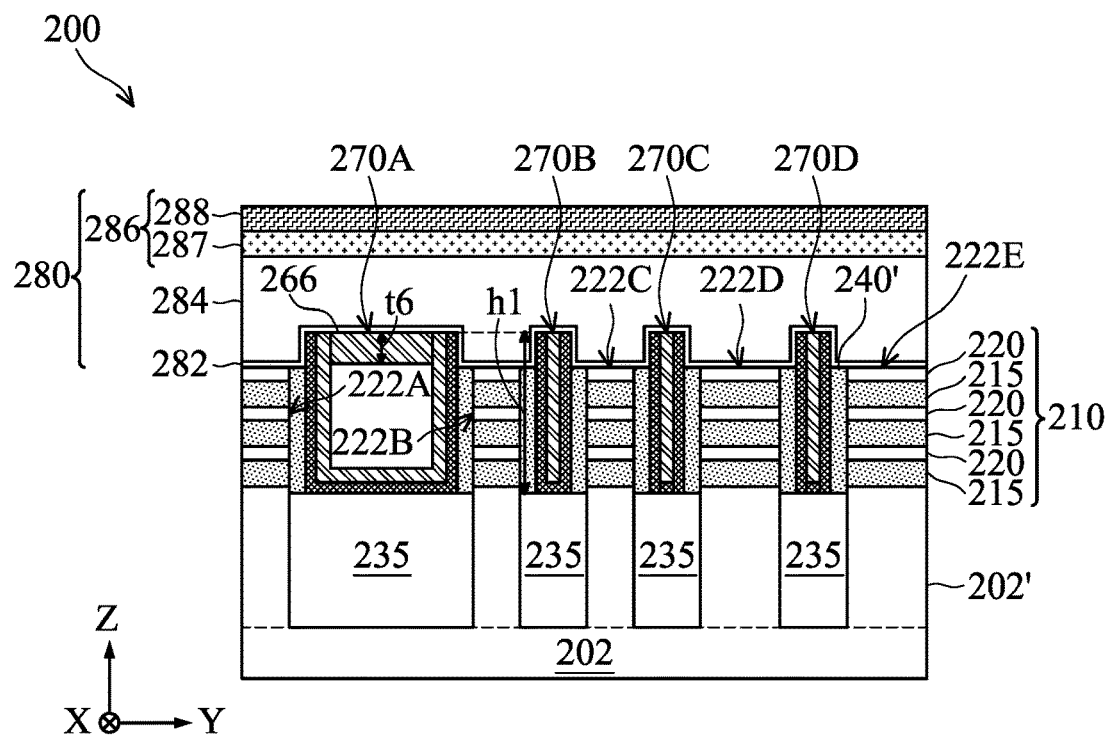
Figure 11B:
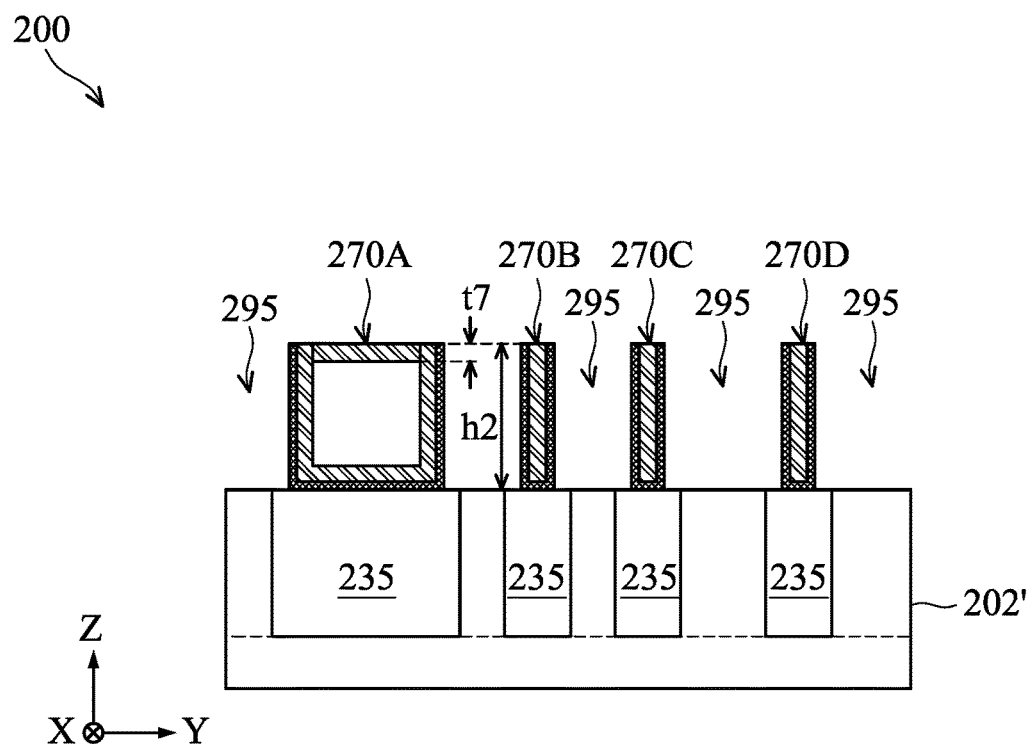
Figure 11C:
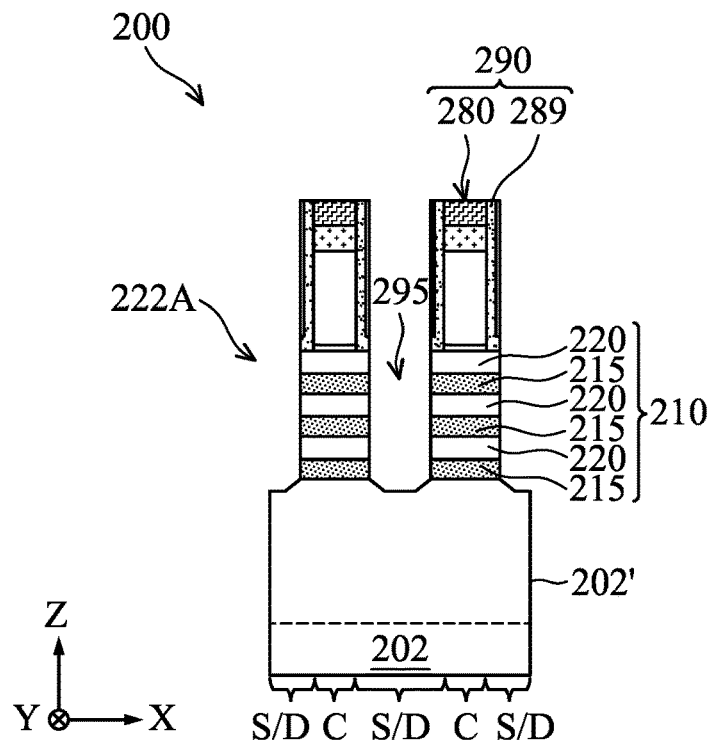
Figure 11D:
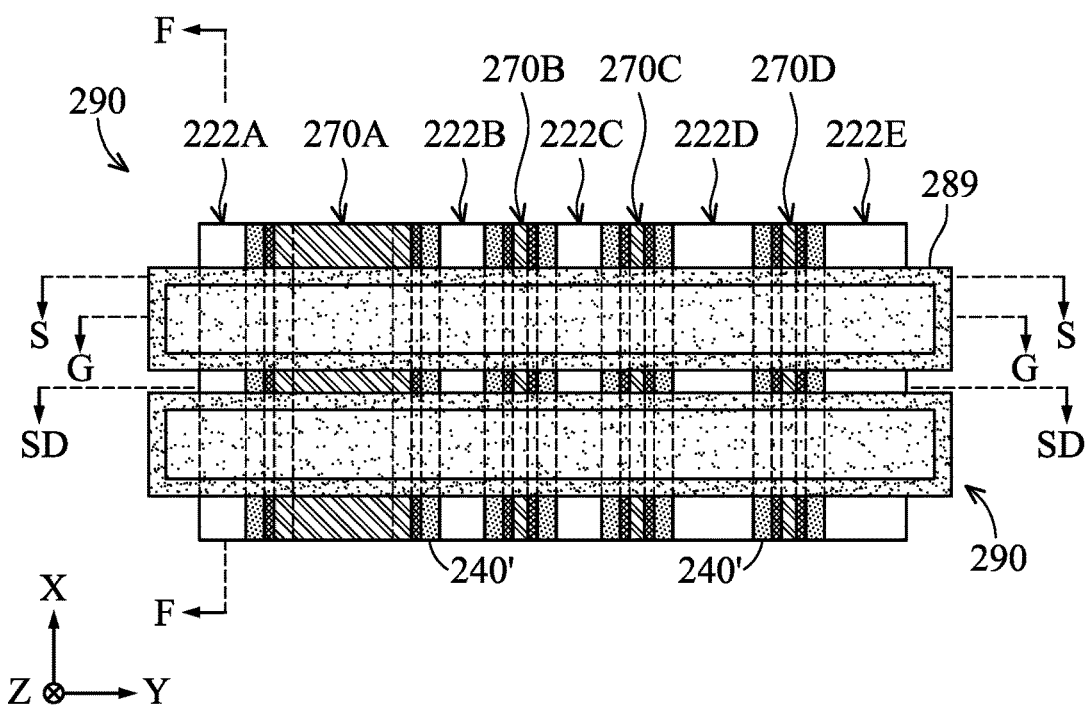
Figure 12A:
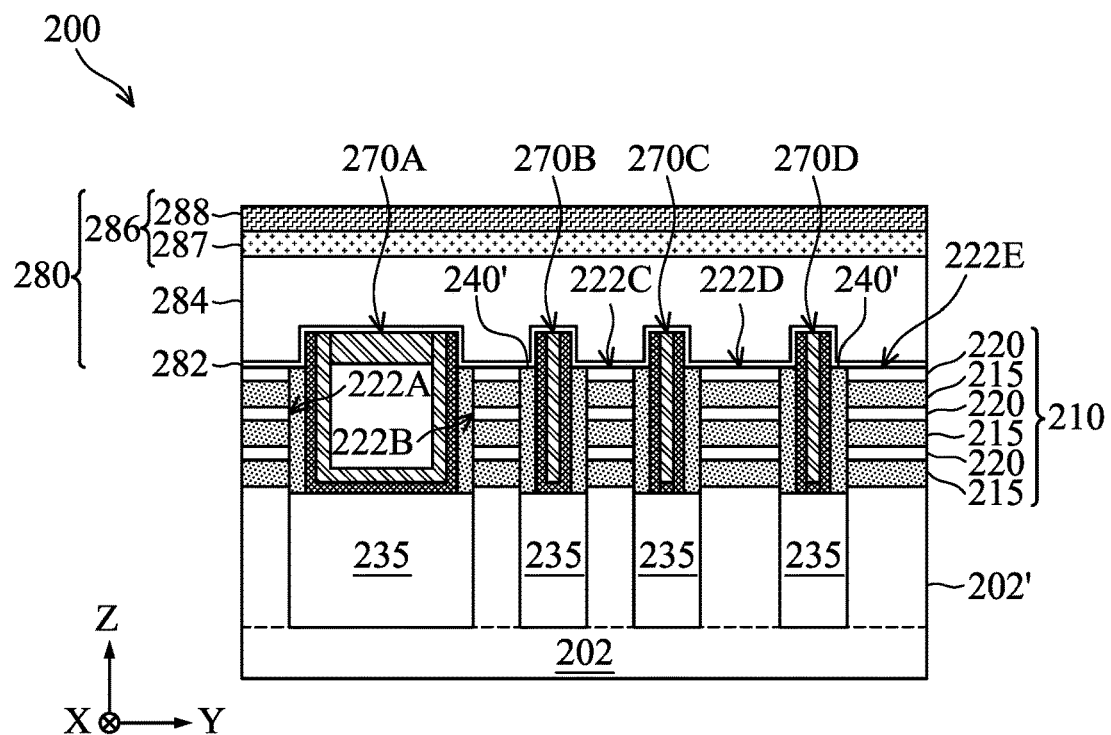
Figure 12B:
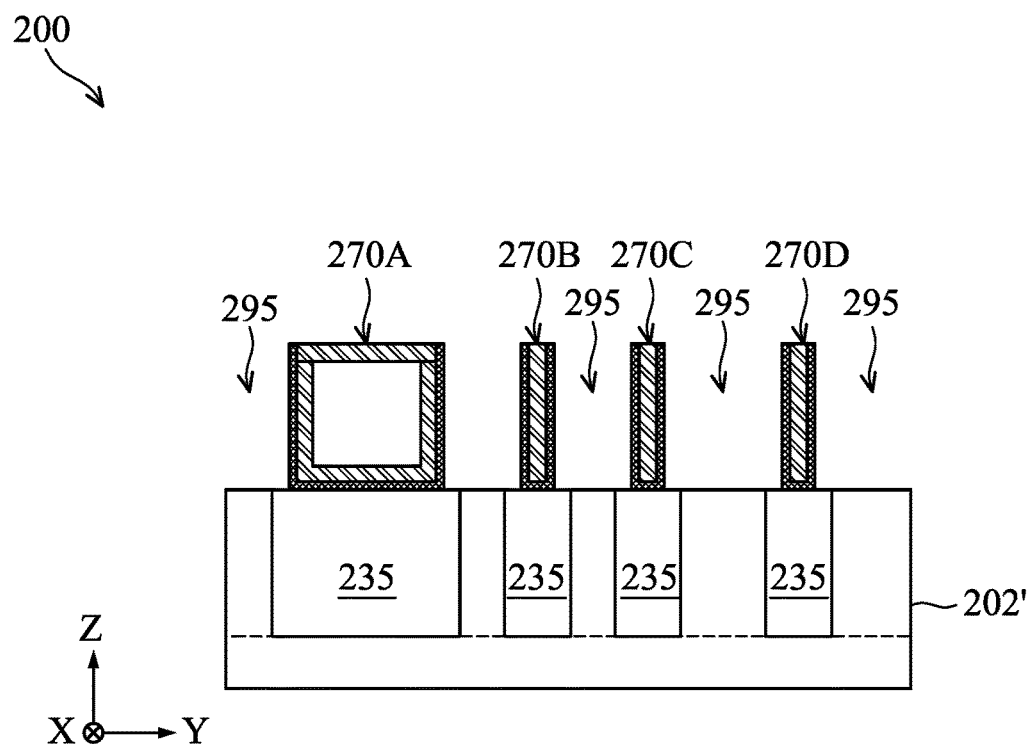
Figure 12C:
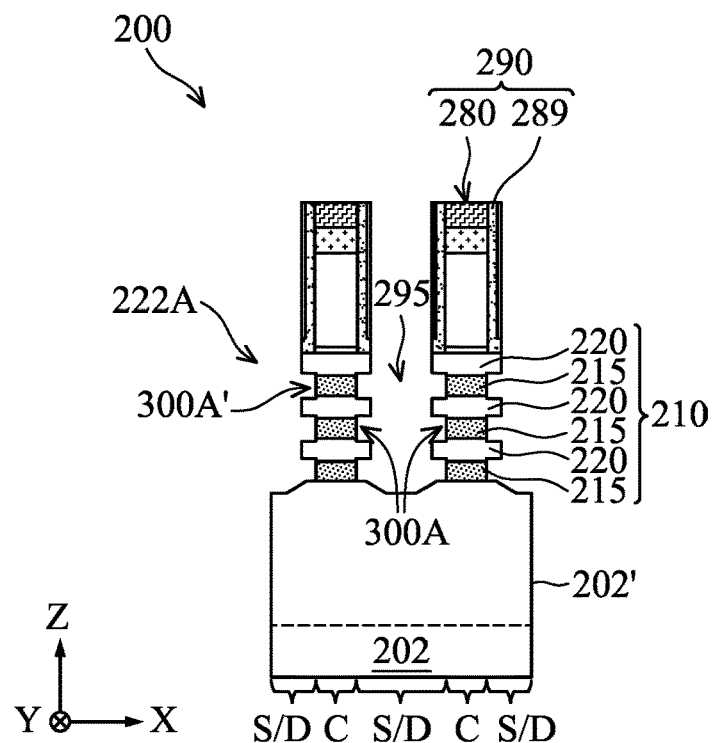
Figure 12D:
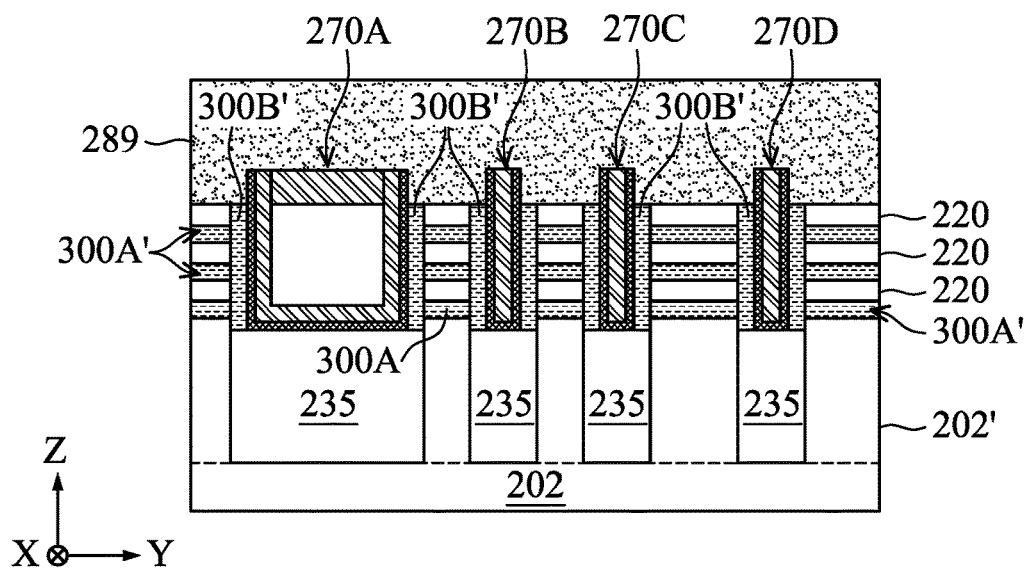
Figure 13A:
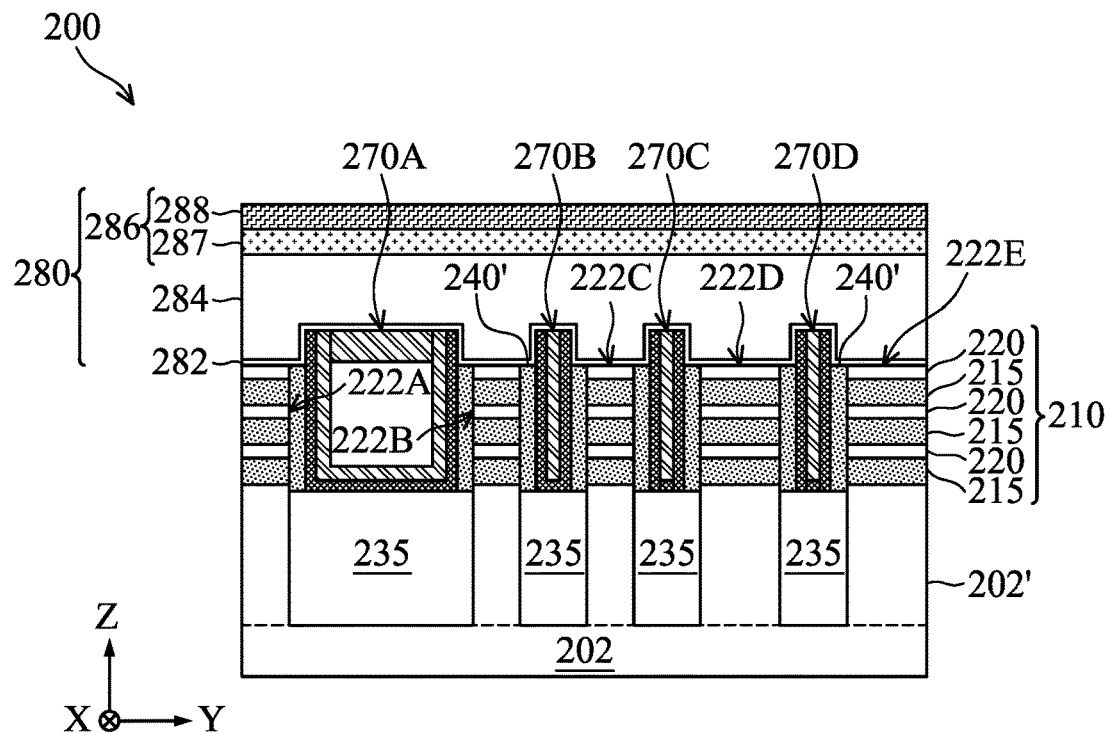
Figure 13B:
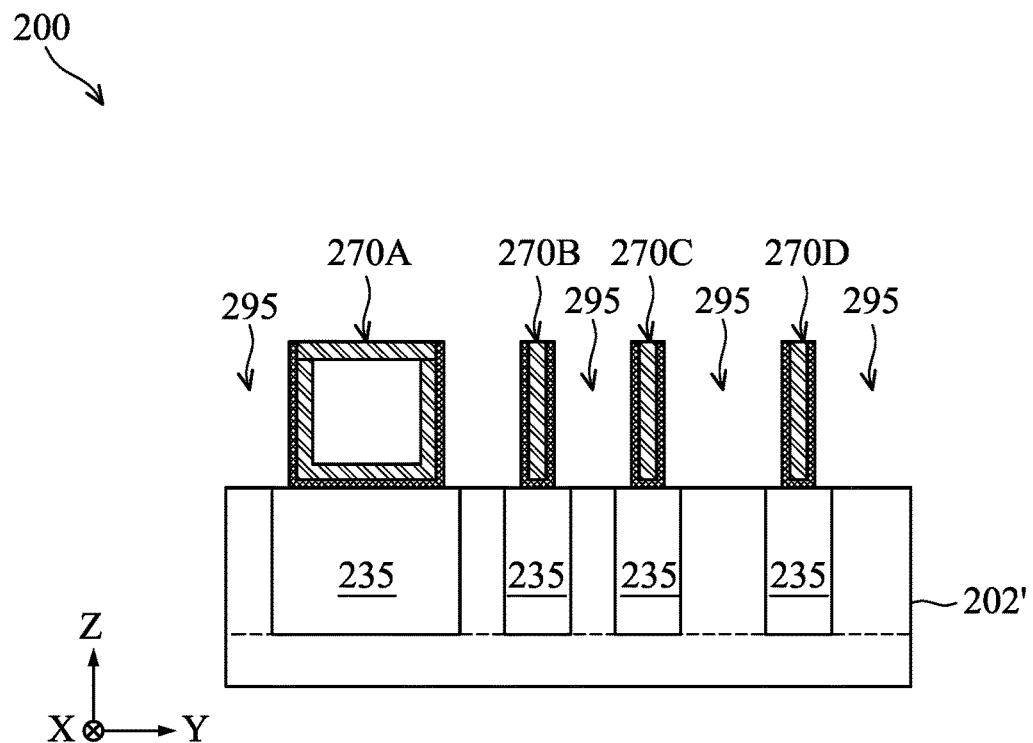
Figure 13C:
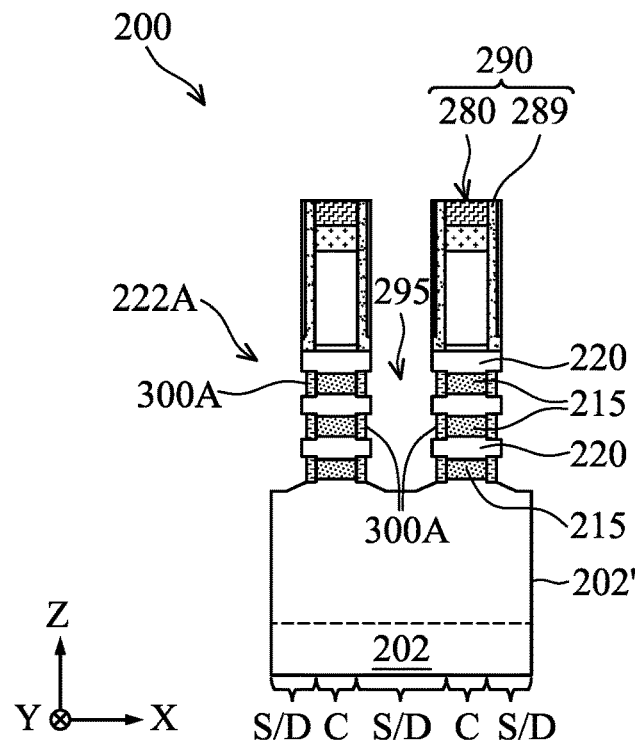
Figure 13D:
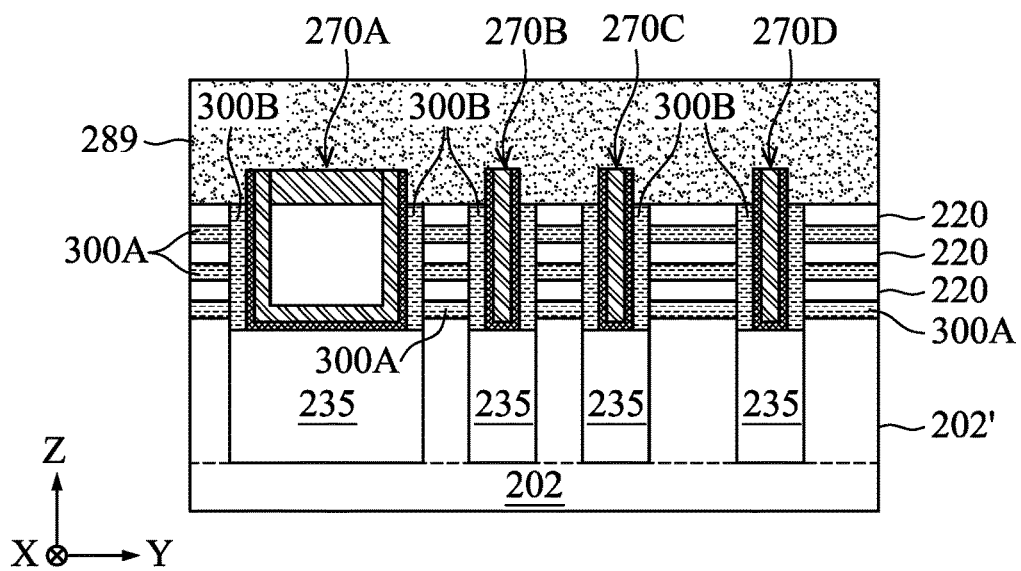
Figure 20A:
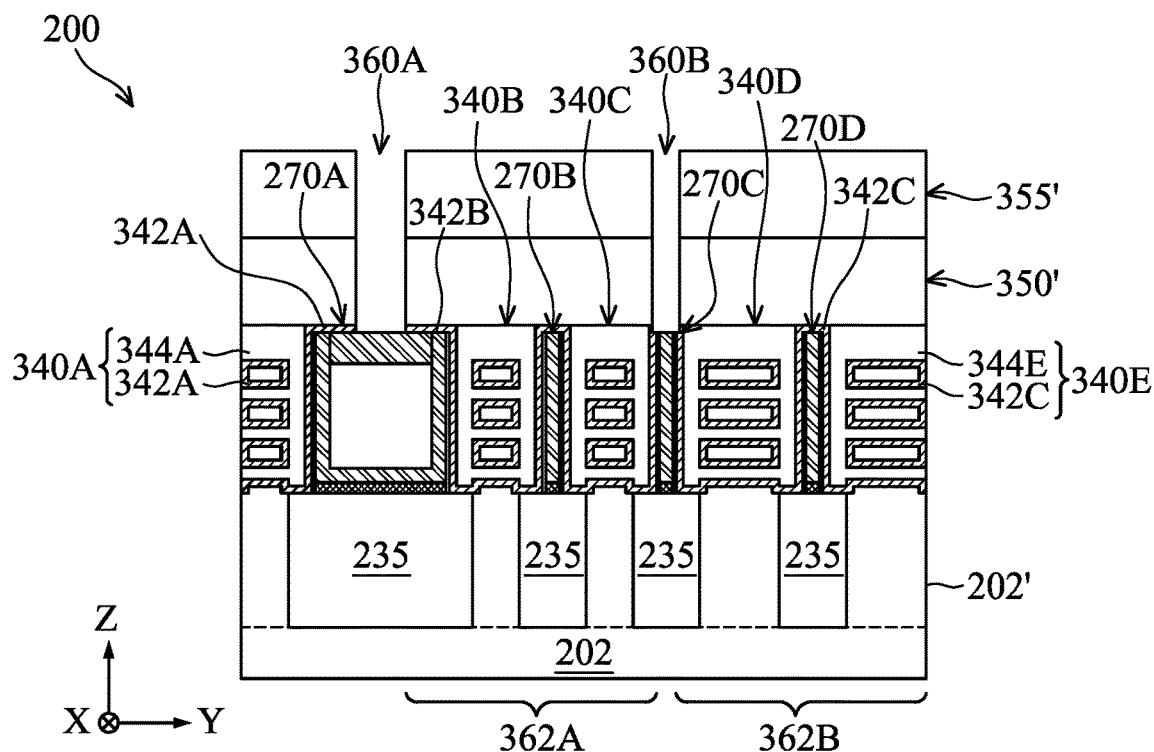
Figure 20B:
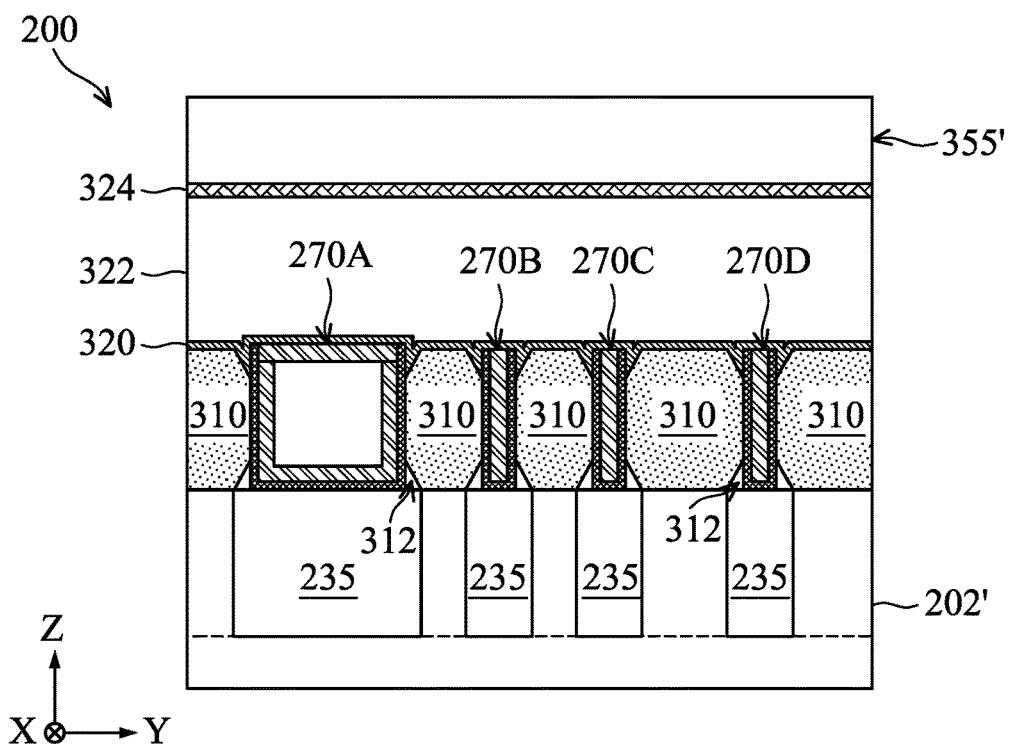
Figure 20C:
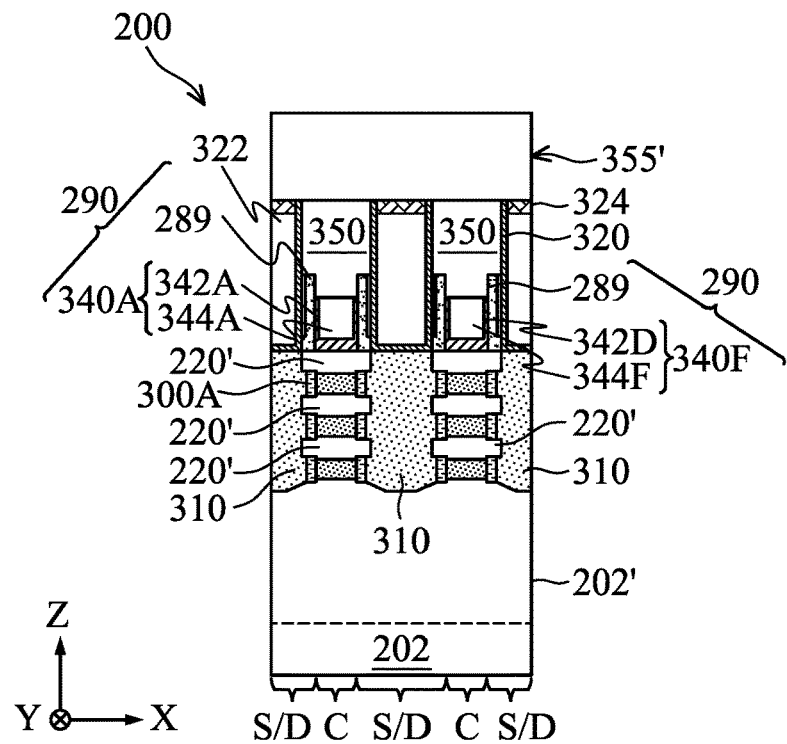
Figure 20D:
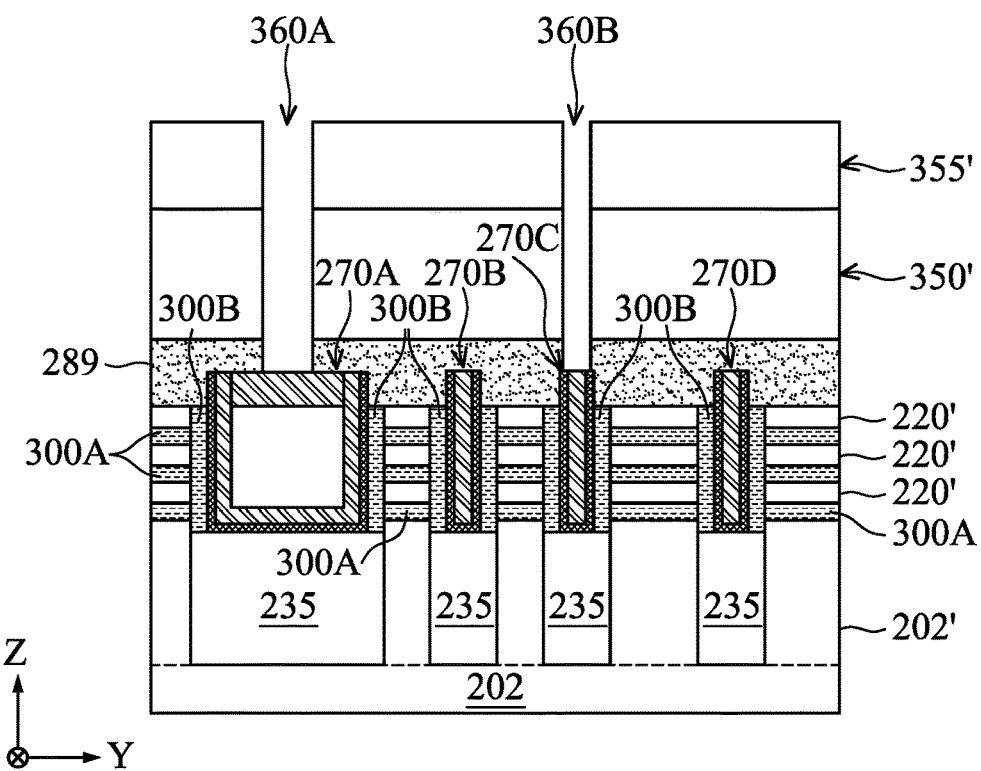
Figure 20E:
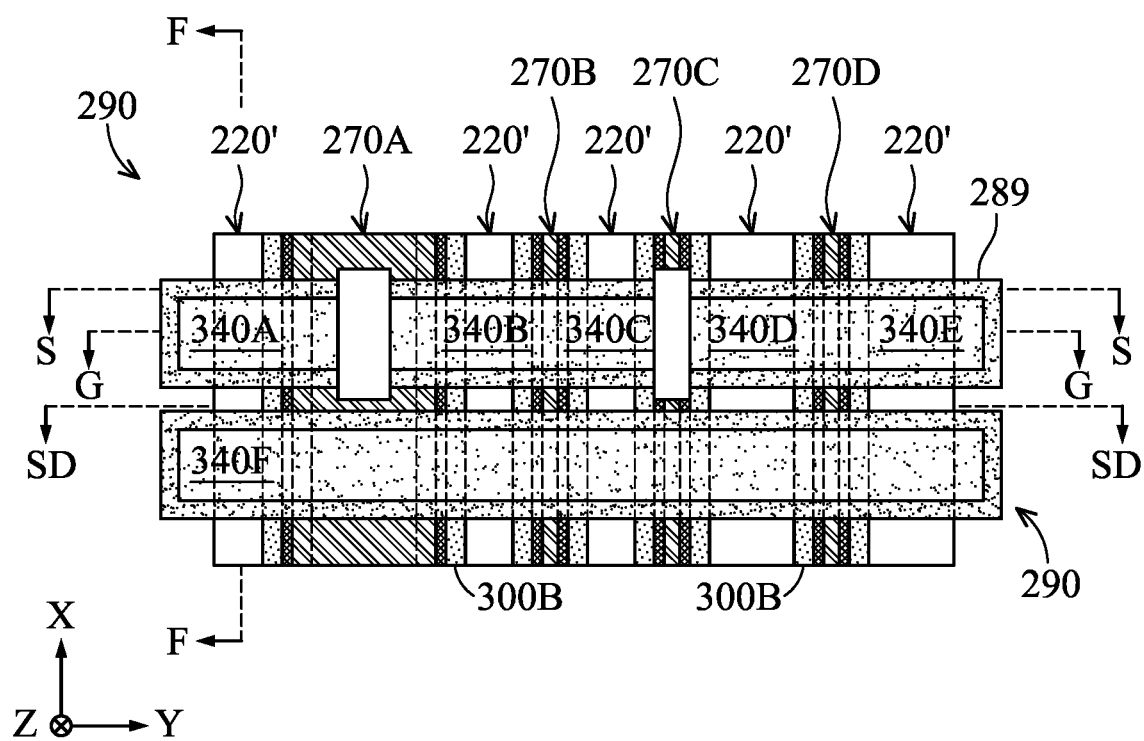
Figure 21A:
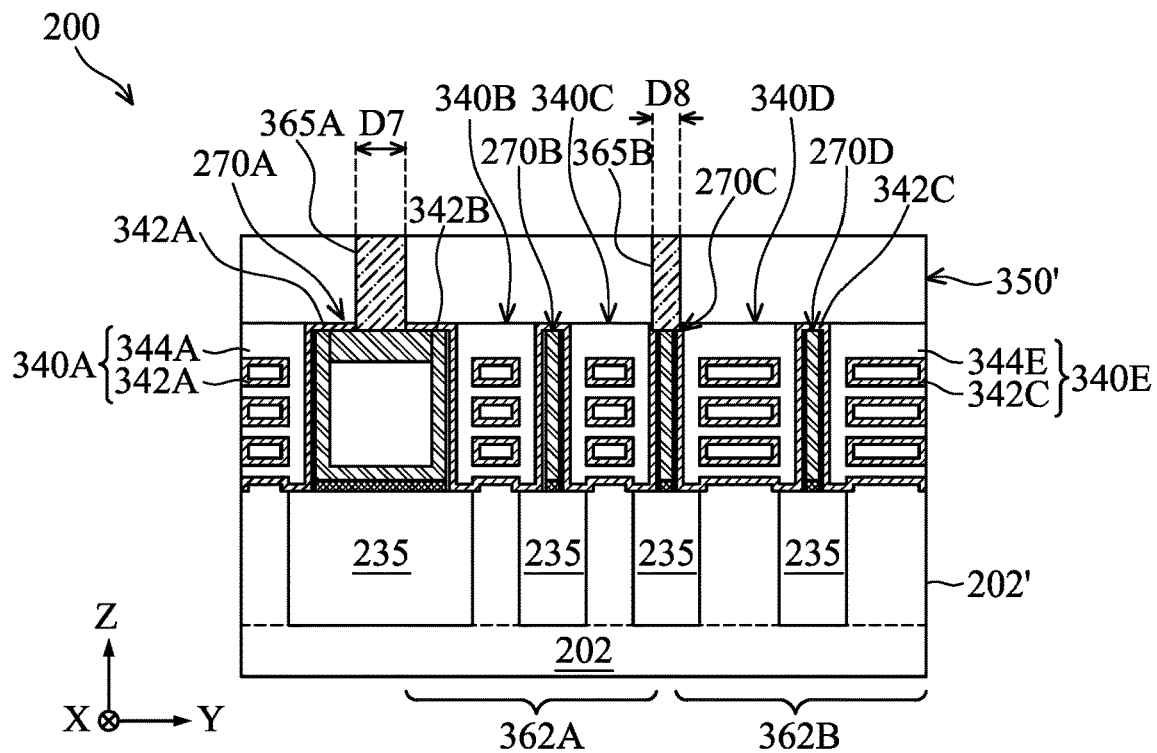
Figure 21B:
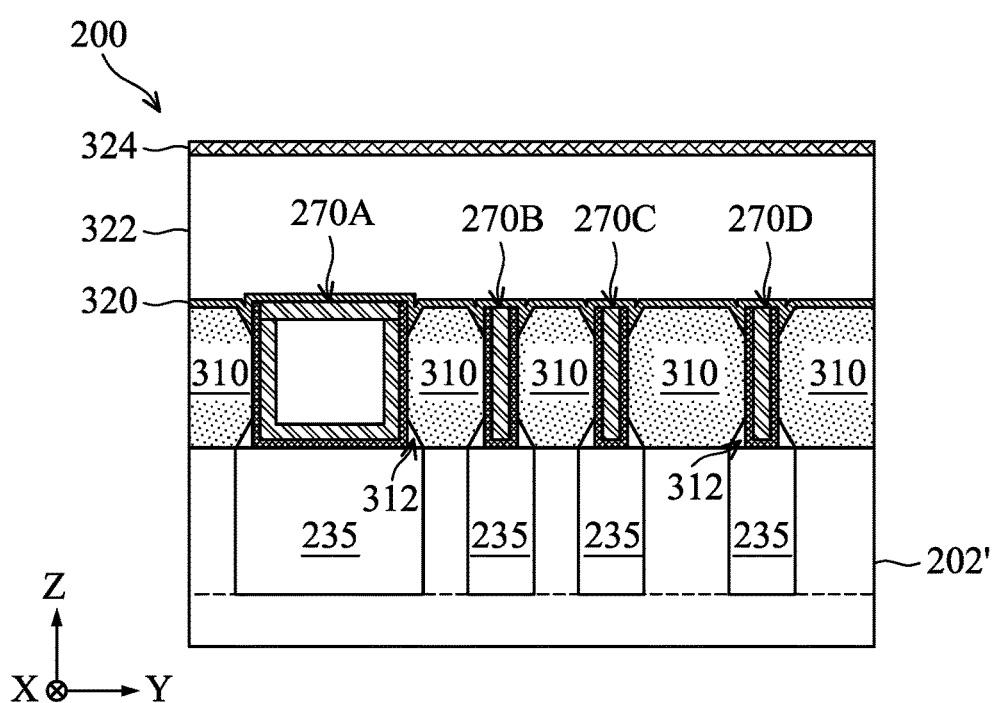
Figure 21C:
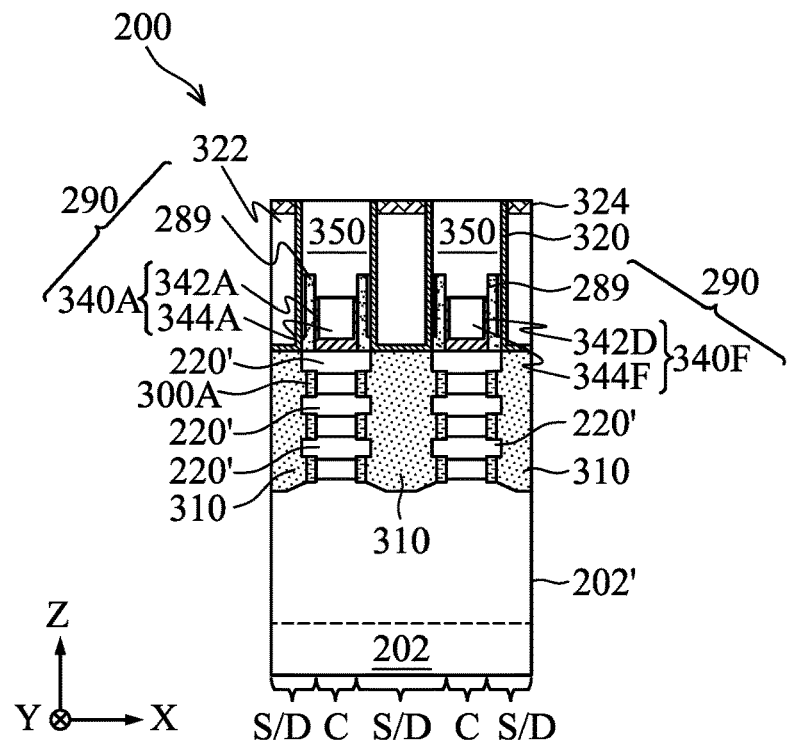
Figure 21D:
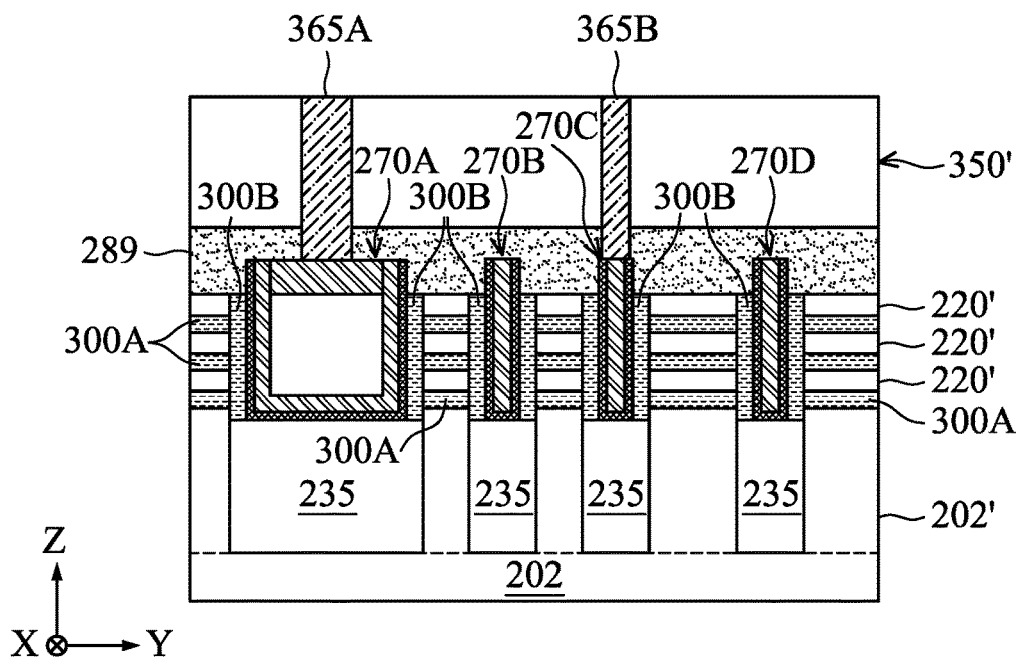
Figure 22A:
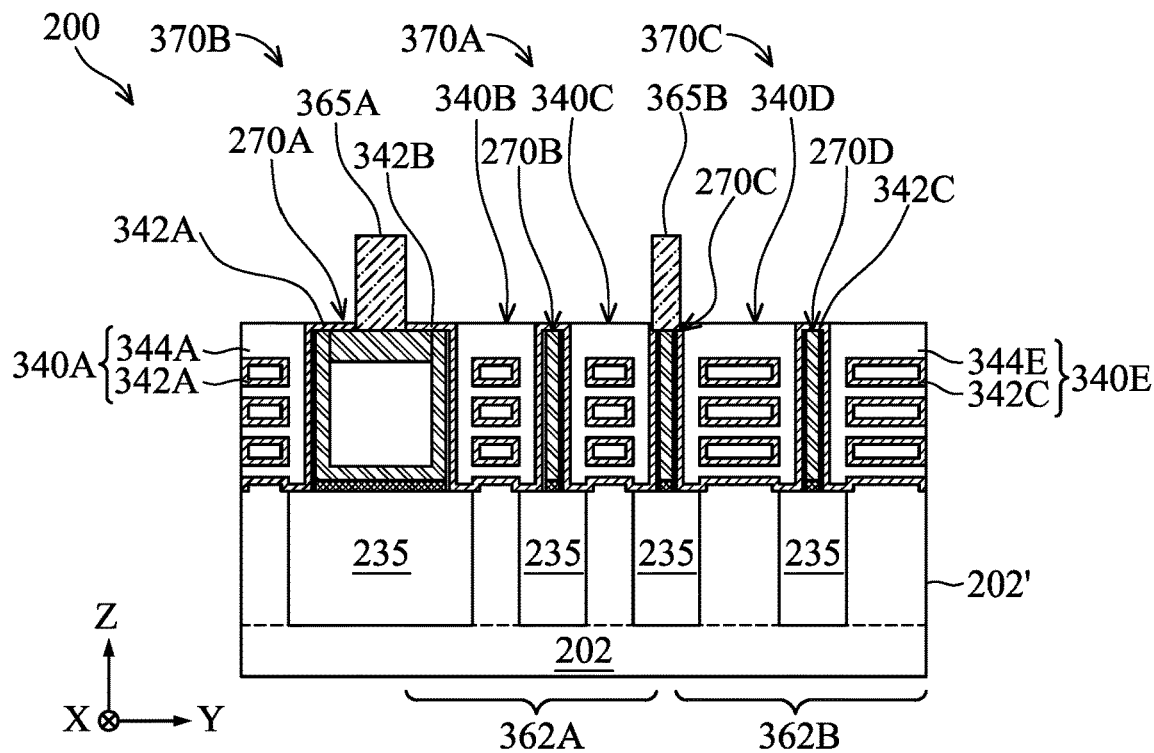
Figure 22B:
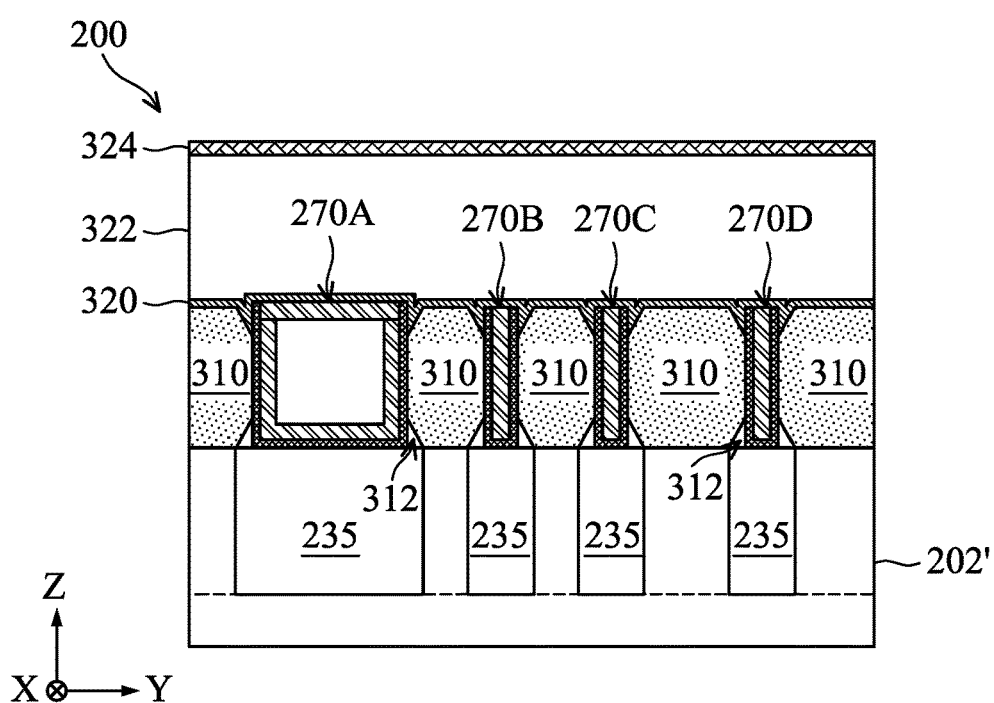
Figure 22C:
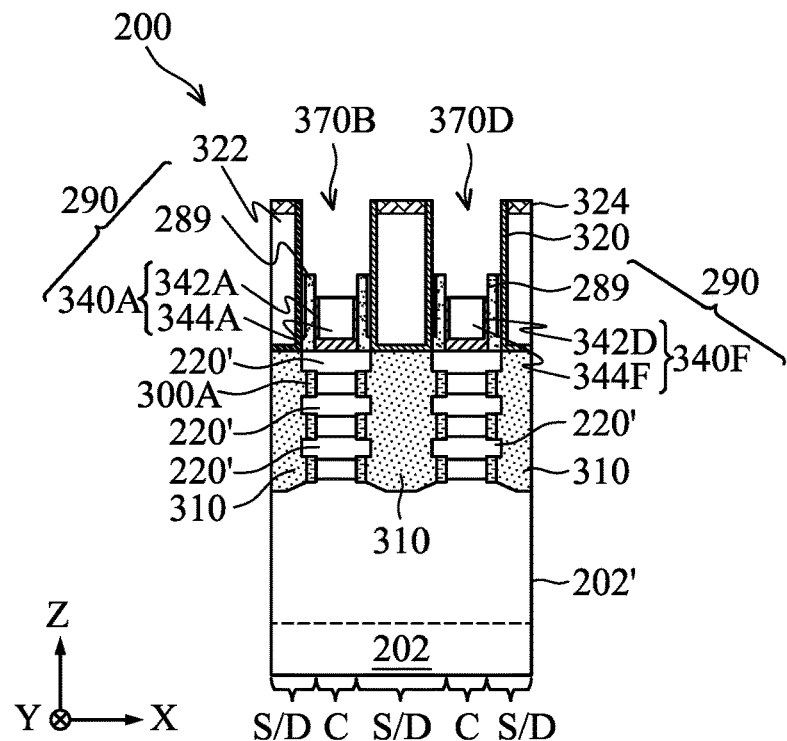
Figure 22D:
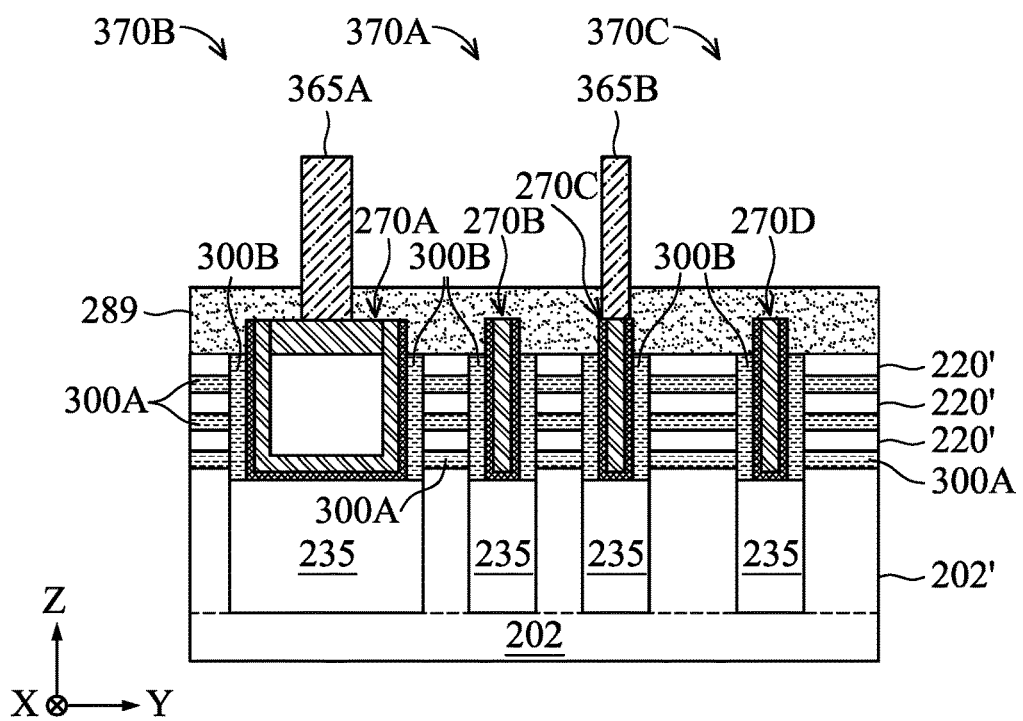
Figure 23A:
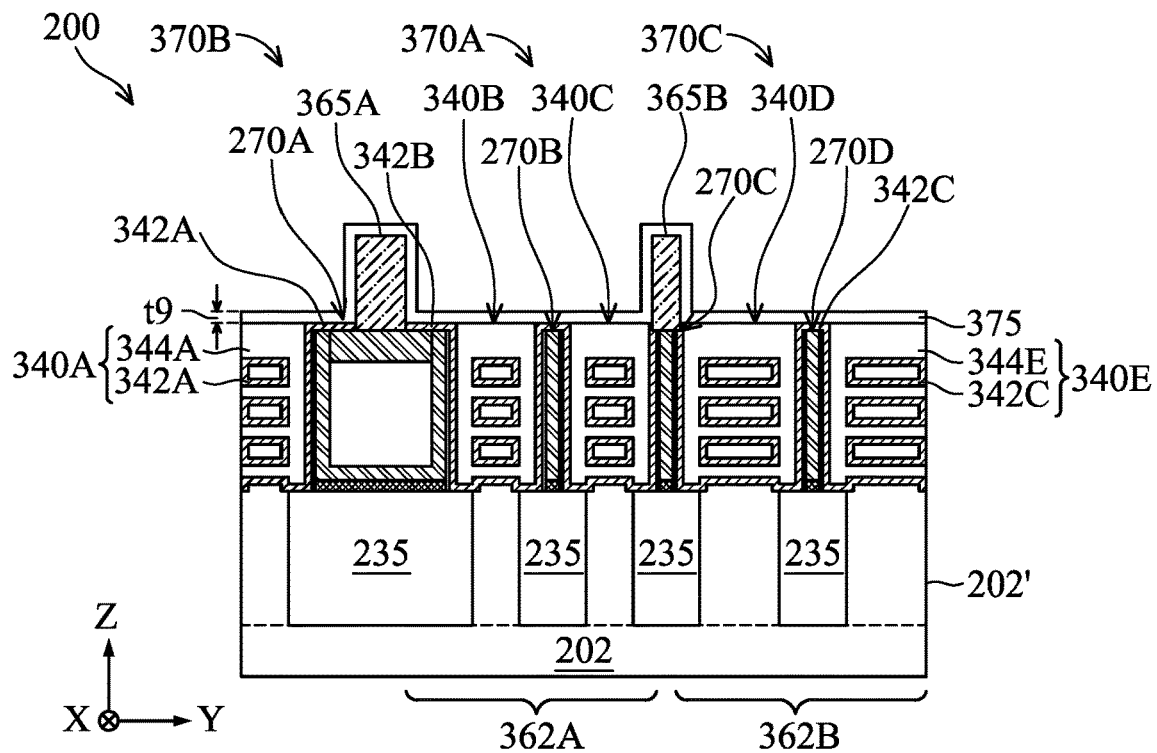
Figure 23B:
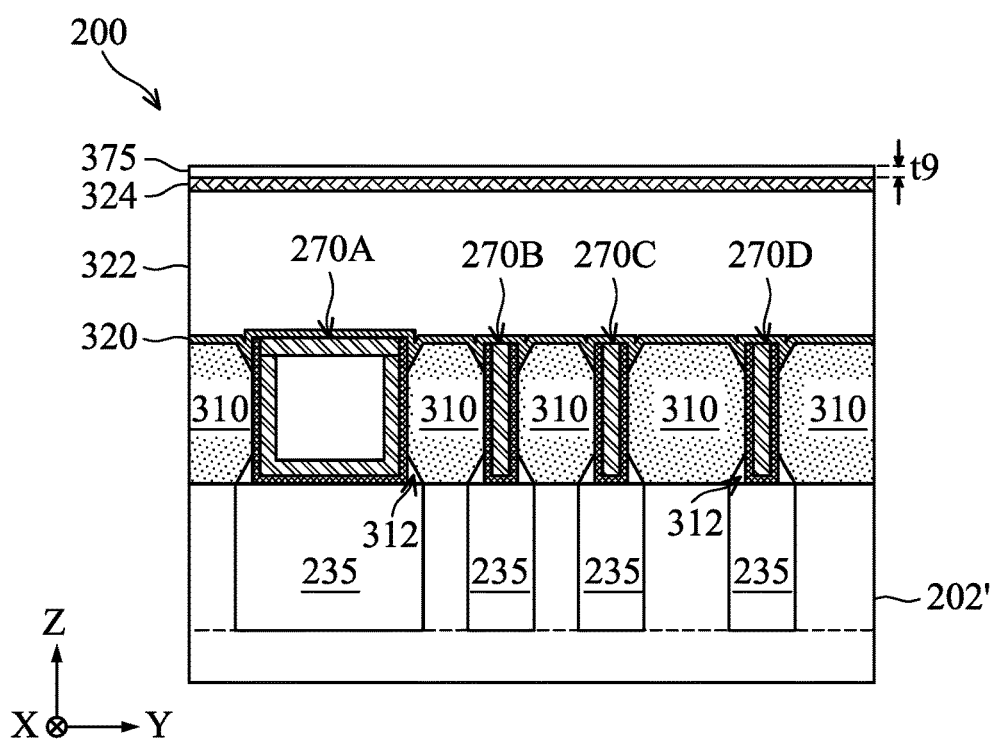
Figure 23C:
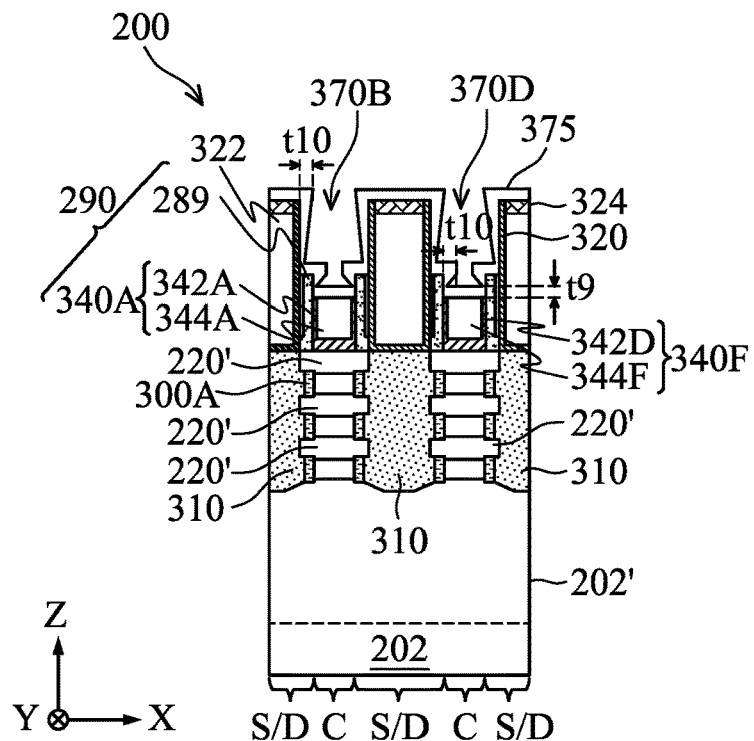
Figure 23D:
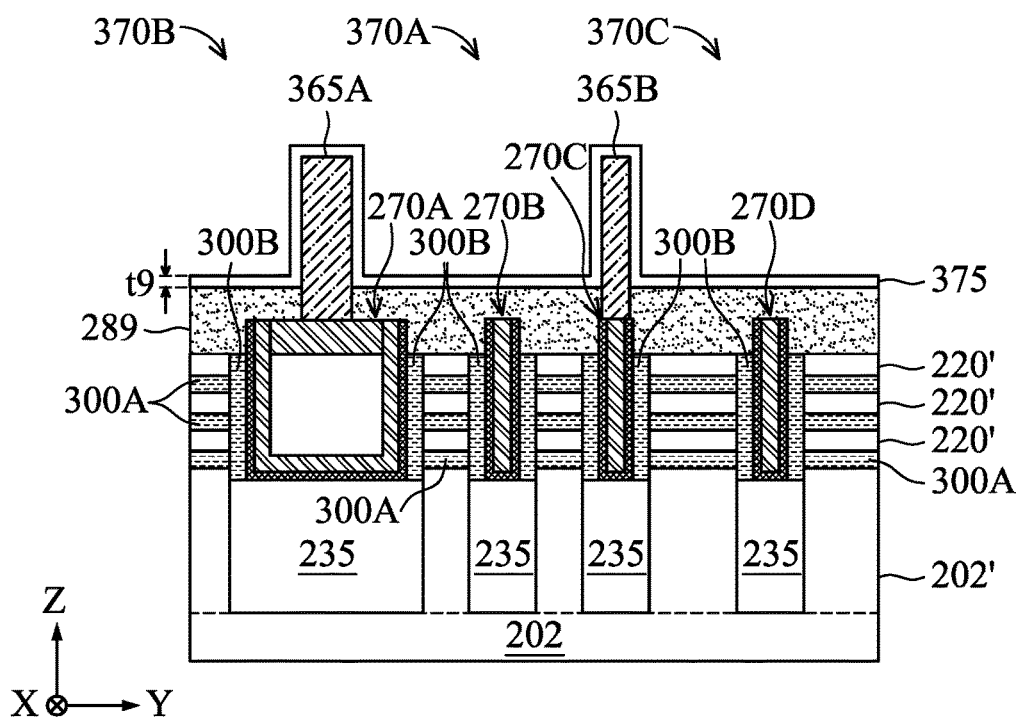

Turning to FIGS. 11A-11D, gate spacers 289 are formed along sidewalls of dummy gate stacks 280, thereby forming gate structures 290 (which collectively refers to dummy gate stacks 280 and gate spacers 289), and portions of fins 222A-222E in source/drain regions of multigate device 200 (i.e., source/drain regions of fins 222A-222E that are not covered by gate structures 290) are also at least partially removed to form source/drain recesses (trenches) 295. For ease of description and understanding, FIG. 11D is a top view of multigate device 200 after undergoing processing associated with FIGS. 2-9, FIGS. 10A-10D, and FIGS. 11A-11D; FIG. 11A is a metal gate cut cross-sectional view along line G-G in FIG. 11D; FIG. 11B is a source/drain cut cross-sectional view along line SD-SD in FIG. 11D; and FIG. 10C is a fin cut cross-sectional view along line F-F in FIG. 11D. Further, for purposes of the following discussion and ease of description and understanding, FIGS. 12A-26A are metal gate cut cross-sectional views of multigate device 200 during processing taken along line G-G in FIG. 11D (e.g., taken through one of gate structure 290); FIGS. 12B-26B are source/drain cut cross-sectional views of multigate device 200 during processing along line SD-SD in FIG. 11D (e.g., taken through the source/drain region disposed between gate structures 290); FIGS. 12C-26C are fin cut cross-sectional views of multigate device 200 during processing along line F-F in FIG. 11D (e.g., taken through fin 222A); FIG. 12D, FIG. 13D, and FIGS. 18D-26D are gate spacer cut cross-sectional views of multigate device 200 during processing along line S-S in FIG. 11D (e.g., taken through gate spacers 289 of the one of gate structures 290); and FIG. 20E is a top view of multigate device 200 during processing associated with FIGS. 20A-20E.

In FIGS. 11A-11D, processing associated with forming gate spacers 289 and/or source/drain recesses 295 reduces a height of exposed portions of gate isolation fins 270A-270D (e.g., portions of gate isolation fins 270A-270D in source/drain regions of multigate device 200) relative to unexposed portions of gate isolation fins 270A-270D (e.g., portions of gate isolation fins 270A-270D in channel regions of multigate device 200). For example, gate isolation fins 270A-270D have a height h1 (FIG. 11A), and etching processes implemented to form gate spacers 289 and/or source/drain recesses 295 reduce, intentionally or unintentionally, a height of exposed portions of gate isolation fins 270A-270D from height h1 to height h2 (FIG. 11B). In some embodiments, height h1 is about 40 nm to about 80 nm, and height h2 is about 25 nm to about 75 nm. In some embodiments, a ratio of height h1 to height h2 is about 1.06:1 to about 1.6:1. Accordingly, portions of gate isolation fins 270A-270D disposed in channel regions of multigate device 200 under gate structures 290 have height h1 while portions of gate isolation fins 270A-270D disposed in source/drain regions of multigate device 200 and not disposed under gate structures 290 have height h2. In such embodiments, thickness of dielectric capping layer 266 of gate isolation fin 270A may be reduced by the etching processes from thickness t6 to a thickness t7 that is less than thickness t6. In some embodiments, thickness t7 is about 5 nm to about 30 nm. In some embodiments, where multigate device 200 has multiple gate isolation fins having dielectric capping layers, the etching process may consume varying amounts of the dielectric capping layers and result in the dielectric capping layers of the gate isolation fins having different thicknesses across multigate device 200.

Gate spacers 289 are disposed adjacent to (i.e., along sidewalls of) respective dummy gate stacks 280. Gate spacers 289 are formed by any suitable process and include a dielectric material. The dielectric material can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonnitride). For example, a dielectric layer including silicon and nitrogen, such as a silicon nitride layer, is deposited over multigate device 200 and etched (e.g., anisotropically etched) to form gate spacers 289. In some embodiments, gate spacers 289 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 280. In such embodiments, the various sets of spacers can include materials having different etch rates. For example, a first dielectric layer including silicon and oxygen (e.g., silicon oxide) is deposited and etched to form a first spacer set adjacent to sidewalls of dummy gate stacks 280, and a second dielectric layer including silicon and nitrogen (e.g., silicon nitride) is deposited and etched to form a second spacer set adjacent to the first spacer set.

In the depicted embodiment, an etching process completely removes semiconductor layer stacks 210 in source/drain regions of multigate device 200, thereby exposing fin portions 202' in source/drain regions of multigate device 200. The etching process also completely removes portions of silicon germanium sacrificial layers 240 that are disposed along sidewalls of semiconductor layer stacks 210 in source/drain regions of multigate device 200. Each source/drain recess 295 thus has a first sidewall defined by one of gate isolation fins 270A-270D (or other gate isolation fin), a second sidewall defined by one of gate isolation fins 270A-270D (or other gate isolation fin), and a third sidewall (or sidewalls) defined by remaining portions of semiconductor layer stacks 210 and remaining portions of silicon germanium sacrificial layers 240 that are disposed under gate structures 290. Each source/drain recess 295 further has a bottom defined by a respective fin portion 202' and a respective isolation feature 235. In some embodiments, the etching process removes some, but not all, of semiconductor layer stacks 210, such that source/drain recesses 295 have bottoms defined by respective semiconductor layers 215 or semiconductor layer 220. In some embodiments, the etching process further removes some, but not all, of fin portions 202', such that source/drain recesses 295 extend below top surfaces of isolation features 235. The etching process can include a dry etching process, a wet etching process, other suitable etching process, or combinations thereof. In some embodiments, the etching process is a multi-step etch process. For example, the etching process may alternate etchants to separately and alternately remove semiconductor layers 215, semiconductor layers 220, and/or silicon germanium layers 240. In some embodiments, parameters of the etching process are configured to selectively etch semiconductor layer stacks 210 with minimal (to no) etching of gate structures 290 (i.e., dummy gate stacks 280 and gate spacers 289), gate isolation fins 270A-270D, and/or isolation features 235. In some embodiments, a lithography process, such as those described herein, is performed to form a patterned mask layer that covers gate structures 290 and/or gate isolation fins 270A-270D, and the etching process uses the patterned mask layer as an etch mask. In such embodiments, heights of gate isolation fins 270A-270D are not reduced in the source/drain regions of multigate device 200, such that gate isolation fins 270A-270D have the height h1 in both channel regions and source/drain regions of multigate device 200 after forming gate spacers 289 and source/drain recesses 295.

Turning to FIGS. 12A-12D and FIGS. 13A-13D, inner spacers 300A and inner spacers 300B are formed under gate structures 290 along sidewalls of semiconductor layers 215 and semiconductor layers 215 under dummy gate stacks 280. Under gate spacers 289, inner spacers 300A separate semiconductor layers 220 from one another and bottommost semiconductor layers 220 from fin portions 202', while inner spacers 300B separate sidewalls of semiconductor layers 220 and sidewalls of semiconductor layers 215 from gate isolation fins 270A-270D. In FIGS. 12A-12D, a first etching process is performed that selectively etches semiconductor layers 215 exposed by source/drain trenches 295 with minimal (to no) etching of semiconductor layers 220, fin portions 202', isolation features 235, gate isolation fins 270A-270D, and gate structures 290, such that gaps 300A' are formed between semiconductor layers 220 and between fin portions 202' and semiconductor layers 220. The first etching process further selectively etches silicon germanium sacrificial spacers 240' that are exposed by source/drain recesses 295, such that gaps 300B' are formed between semiconductor layers 220 and gate isolation fins 270A-270D. Gaps 300A' and gaps 300B' are disposed under gate spacers 289. Semiconductor layers 220 are thus suspended under gate spacers 289, separated from one another by gaps 300A' and separated from gate isolation fins 270A-270D by gaps 300B'. In some embodiments, gaps 300A' and/or gaps 300B' extend at least partially under dummy gate stacks 280. The first etching process is configured to laterally etch (e.g., along the x-direction and/or the y-direction) semiconductor layers 215 and silicon germanium spacers 240'. In the depicted embodiment, the first etching process reduces a length of semiconductor layers 215 and silicon germanium spacers 240' along the x-direction. The first etching process is a dry etching process, a wet etching process, other suitable etching process, or combinations thereof.

In FIGS. 13A-13D, a deposition process then forms a spacer layer over gate structures 290 and over features defining source/drain recesses 295 (e.g., semiconductor layers 215, semiconductor layers 220, fin portions 202', gate isolation fins 270A-270D, isolation features 235, and/or silicon germanium spacers 240'), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills source/drain recesses 295. The deposition process is configured to ensure that the spacer layer at least partially fills gaps 300A' and gaps 300B'. A second etching process is then performed that selectively etches the spacer layer to form inner spacers 300A, which fill gaps 300A', and inner spacers 300B, which fill gaps 300B', as depicted in FIGS. 13A-13D, with minimal (to no) etching of semiconductor layers 220, fin portions 202', isolation features 235, gate isolation fins 270A-270D, and gate structures 290. The spacer layer (and thus inner spacers 300A and inner spacers 300B) includes a material that is different than a material of semiconductor layers 220 and fin portions 202', a material of isolation features 235, a material of gate isolation fins 270A-270D, and/or materials of gate structures 290 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, and/or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that the spacer layer includes a doped dielectric material.

Figure 14A:
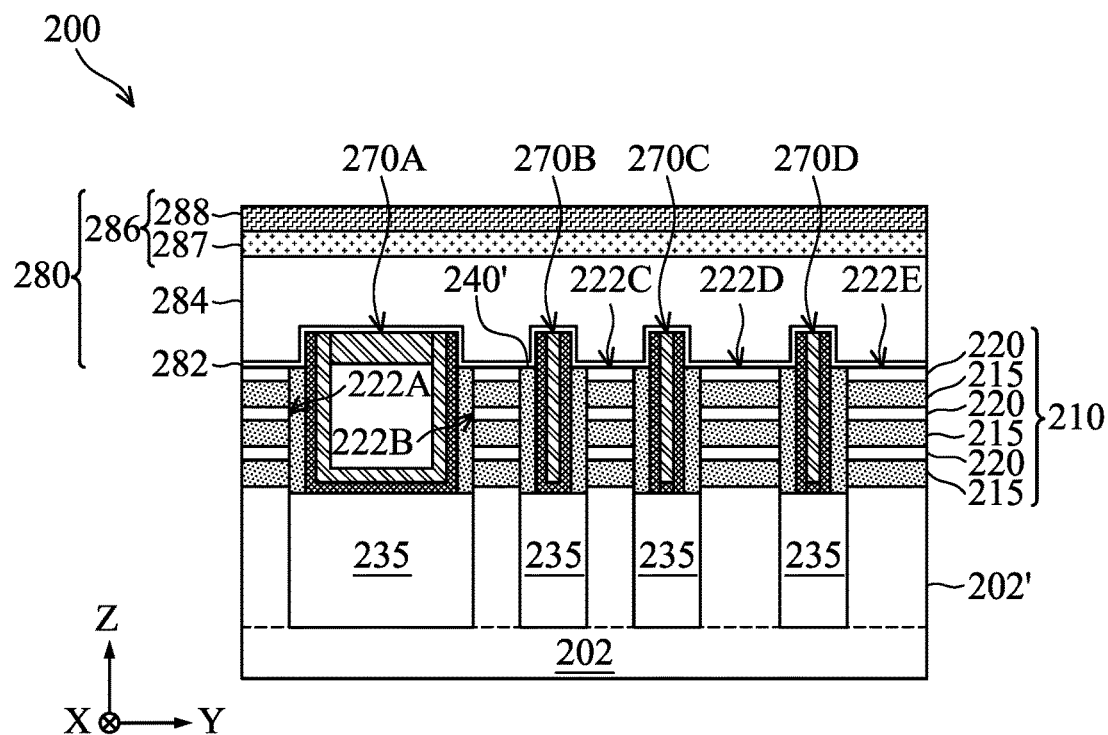
Figure 14B:
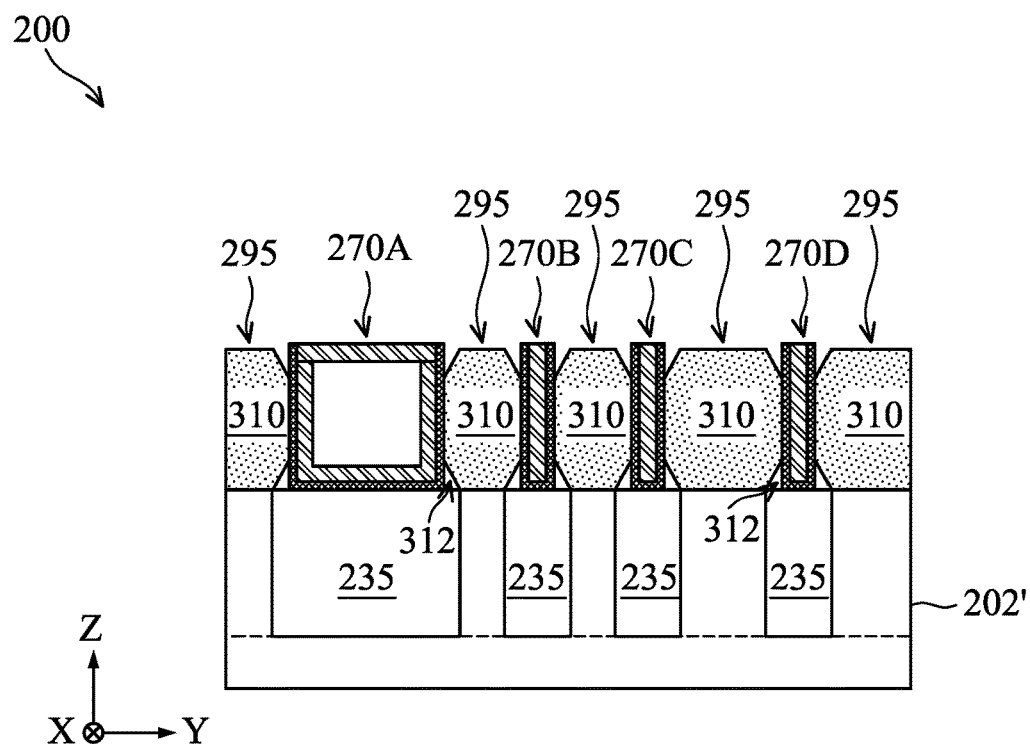
Figure 14C:
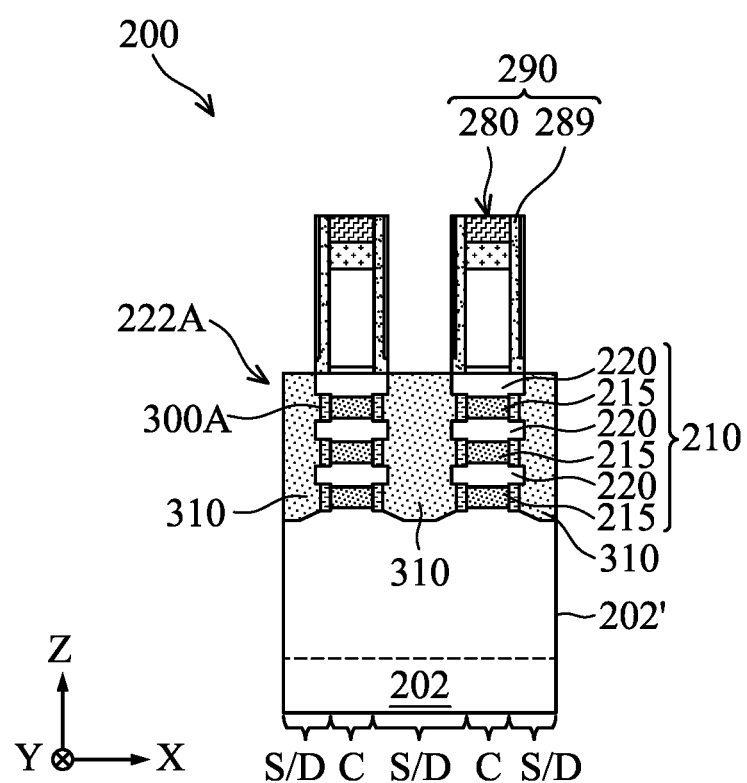

Turning to FIGS. 14A-14C, epitaxial source/drain features are formed in source/drain recesses 295. For example, a semiconductor material is epitaxially grown from fin portions 202' and semiconductor layers 220 exposed by source/drain recesses 295, thereby forming epitaxial source/drain features 310. In some embodiments, because semiconductor material does not grow from dielectric surfaces during an epitaxial growth process used to form epitaxial source/drain features 310, air gaps 312 may be formed between epitaxial source/drain features 310, gate isolation fins 270A-270D, and isolation features 235. In some embodiments, such as depicted, epitaxial source/drain features 310 do not completely fill source/drain recesses 295 in the Y-Z plane, such that top surfaces of epitaxial source/drain features 310 are lower than top surfaces of gate isolation fins 270A-270D relative to the top surface of substrate 202. In some embodiments, epitaxial source/drain features 310 completely fill source/drain recesses 295 in the Y-Z plane, such that top surfaces of epitaxial source/drain features 310 are substantially planar with top surfaces of gate isolation fins 270A-270D or higher than top surfaces of gate isolation fins 270A-270D relative to the top surface of substrate 202. An epitaxy process can use CVD deposition techniques (for example, LPCVD, VPE, and/or UHV-CVD), molecular beam epitaxy, other suitable epitaxial growth processes, or combinations thereof. The epitaxy process can use gaseous and/or liquid precursors, which interact with the composition of fin portions 202' and/or semiconductor layers 220. Epitaxial source/drain features 310 are doped with n-type dopants and/or p-type dopants. In some embodiments, for n-type transistors, epitaxial source/drain features 310 include silicon, which can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial source/drain features 310 include silicon germanium or germanium, which can be doped with boron, other p-type dopant, or combinations thereof (for example, forming Si:Ge:B epitaxial source/drain features). In some embodiments, epitaxial source/drain features 310 include more than one epitaxial semiconductor layer, where the epitaxial semiconductor layers can include the same or different materials and/or dopant concentrations. In some embodiments, epitaxial source/drain features 310 include materials and/or dopants that achieve desired tensile stress and/or compressive stress in respective channel regions of the n-type transistors and/or the p-type transistors. In some embodiments, epitaxial source/drain features 310 are doped during deposition by adding impurities to a source material of the epitaxy process (i.e., in-situ). In some embodiments, epitaxial source/drain features 310 are doped by an ion implantation process subsequent to a deposition process. In some embodiments, annealing processes (e.g., rapid thermal annealing and/or laser annealing) are performed to activate dopants in epitaxial source/drain features 310 and/or other source/drain regions (for example, heavily doped source/drain regions and/or lightly doped source/drain (LDD) regions). The present disclosure contemplates each of epitaxial source/drain features 310 being configured depending on a transistor region of multigate device 200 to which the respective epitaxial feature 310 corresponds, such that epitaxial source/drain features can have the same materials and/or different materials. For example, epitaxial source/drain features 310 corresponding with n-type transistor regions may include silicon and n-type dopants (e.g., phosphorous and/or carbon), while epitaxial source/drain features corresponding with p-type transistors may include silicon, germanium, and p-type dopants (e.g., boron).

Figure 15A:
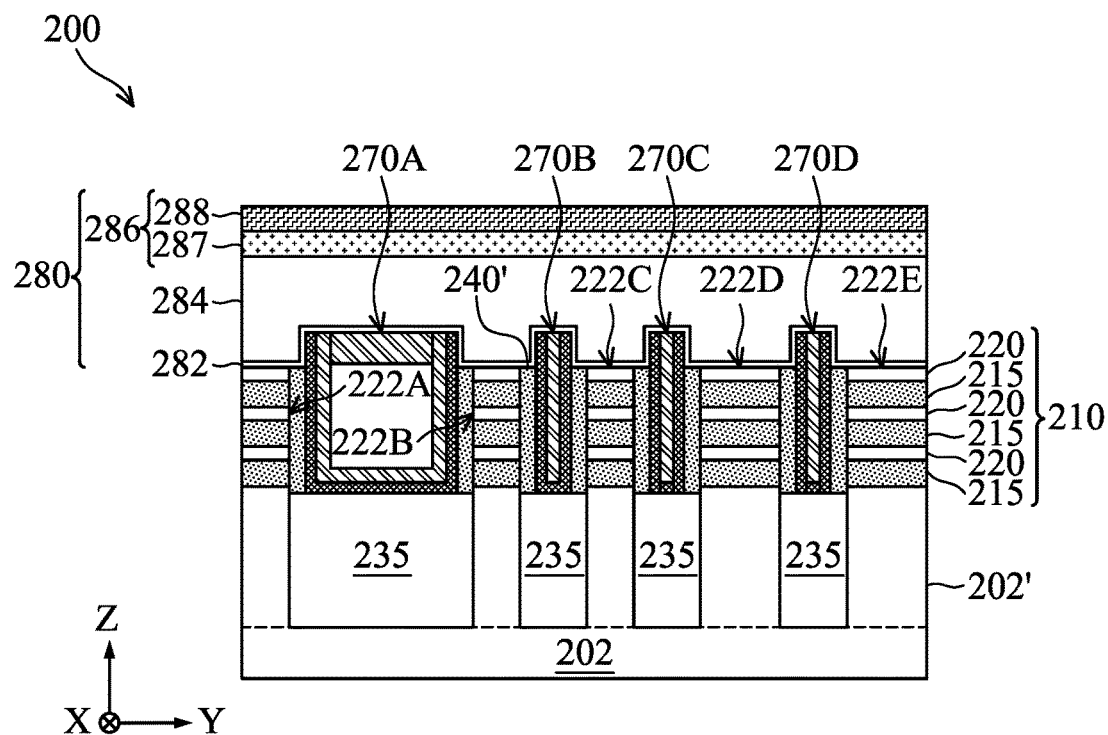
Figure 15B:
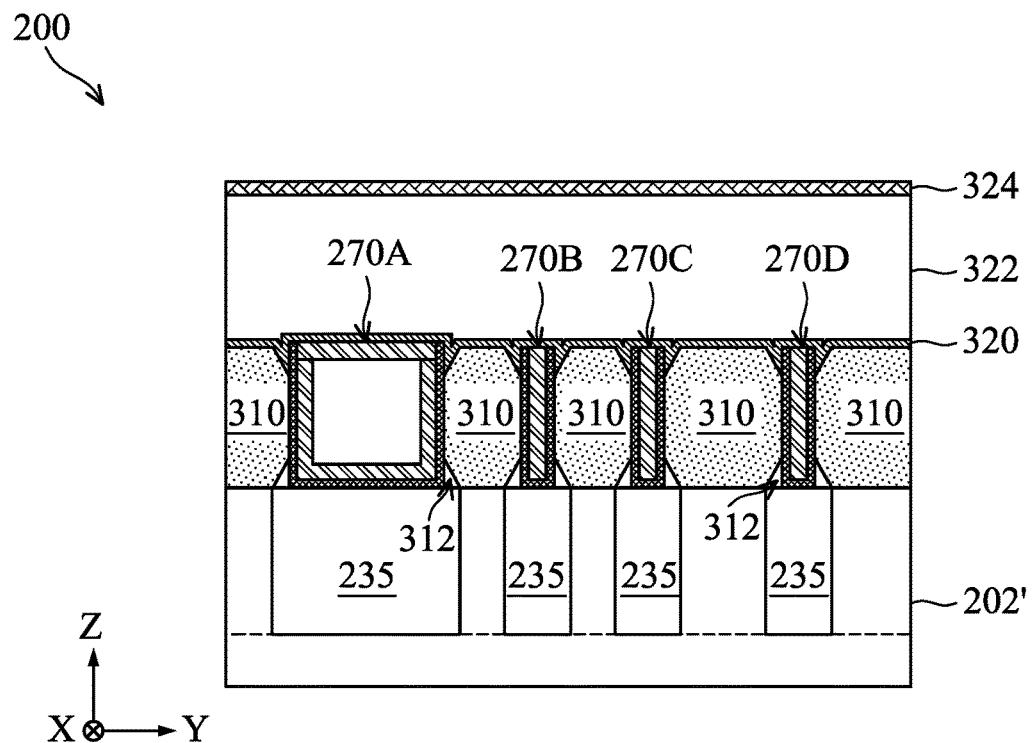
Figure 15C:
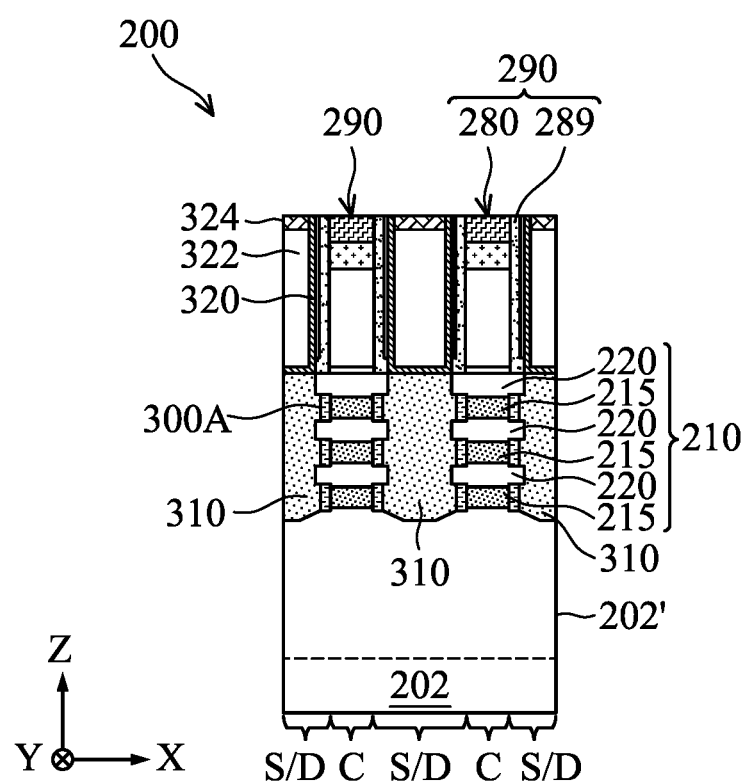

Turning to FIGS. 15A-15C, a contact etch stop layer (CESL) 320 is formed over multigate device 200, an interlayer dielectric (ILD) layer 322 is formed over CESL 320, an ILD protection layer 324 is formed over ILD layer 322, and a CMP process and/or other planarization process is performed until reaching (exposing) top portions (or top surfaces) of dummy gate stacks 280. CESL 320 and ILD layer 322 are disposed over epitaxial source/drain features 310 and gate isolation fins 270A-270D in source/drain regions of multigate device 200, and in the depicted embodiment, CESL 320 and ILD layer 322 fill a remainder of source/drain recesses 295. CESL 320, ILD layer 322, and ILD protection layer 324 are disposed between adjacent gate structures 290. In some embodiments, CESL 320 and/or ILD layer 322 are disposed on and physically contact facets of epitaxial source/drain features 310 that extend from gate isolation fins 270A-270D to top surfaces (facets) of epitaxial source/drain features 310, while facets of epitaxial source/drain features 310 that extend from gate isolation fins 270A-270D to bottom surfaces (facets) of epitaxial source/drain features 310 (i.e., surfaces disposed on fin portions 202') do not physically contact any dielectric material because of air gaps 312. CESL 320, ILD layer 322, and ILD protection layer 324 are formed by CVD, PVD, ALD, HDPCVD, HARP, FCVD, MOCVD, RPCVD, PECVD, LPCVD, ALCVD, APCVD, other suitable methods, or combinations thereof. In some embodiments, ILD layer 322 is formed by FCVD, HARP, HDPCVD, or combinations thereof. In some embodiments, the planarization process removes hard masks 286 of dummy gate stacks 280 to expose underlying dummy gate electrodes 284 of dummy gate stacks 280, such as polysilicon gate electrodes. ILD layer 322 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, Calif.), xerogel, aerogel, amorphous fluorinated carbon, parylene, BCB-based dielectric material, SiLK (Dow Chemical, Midland, Mich.), polyimide, other suitable dielectric material, or combinations thereof. In some embodiments, ILD layer 322 includes a dielectric material having a dielectric constant that is less than a dielectric constant of silicon dioxide (e.g., k<3.9). In some embodiments, ILD layer 322 includes a dielectric material having a dielectric constant that is less than about 2.5 (i.e., an extreme low-k (ELK) dielectric material), such as $SiO_2$ (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. ILD layer 322 can include a multilayer structure having multiple dielectric materials. CESL 320 includes a material different than ILD layer 322, such as a dielectric material that is different than the dielectric material of ILD layer 322. For example, where ILD layer 322 includes a dielectric material that includes silicon and oxygen and having a dielectric constant that is less than about the dielectric constant of silicon dioxide, CESL 320 can include silicon and nitrogen, such as silicon nitride or silicon oxynitride. ILD protection layer 324 includes a material that is different than the material of ILD layer 322 and that provides etching selectivity and/or planarization selectivity needed to fabricate multigate device 200 as described herein. In the depicted embodiment, ILD protection layer 324 includes a silicon-and-nitrogen comprising material, such as silicon nitride or silicon carbonitride. In some embodiments, ILD protection layer 324 includes silicon, silicon carbide, silicon oxynitride, silicon oxycarbonitride, silicon oxycarbide, other suitable material, or combinations thereof.

A gate replacement process is then performed to replace dummy gate stacks 280 with metal gate stacks. During the gate replacement process, a channel release process is performed to form suspended channel layers in channel regions of multigate device 200, where the metal gate stacks at least partially surround the suspended channel layers. For example, turning to FIGS. 16A-16C, gate openings 330 are formed in gate structures 290 by removing dummy gate stacks 280, thereby exposing semiconductor layer stacks 210 of fins 222A-222E in channel regions of multigate device 200 and silicon germanium spacers 240' disposed along sidewalls of semiconductor layer stacks 210 of fins 222A-222E in channel regions of multigate device 200. For example, an etching process is performed that removes hard masks 286, dummy gate electrodes 284, and dummy gate dielectrics 282. The etching process is configured to selectively remove hard masks 286, dummy gate electrodes 284, and/or dummy gate dielectrics 282 with respect to ILD protection layer 324, gate spacers 289, silicon germanium spacers 240', and/or semiconductor layers 220. In other words, the etching process substantially removes hard masks 286, dummy gate electrodes 284, and dummy gate dielectrics 282 but does not remove, or does not substantially remove, ILD protection layer 324, gate spacers 289, silicon germanium spacers 240', and/or semiconductor layers 220. The etching process is a dry etching process, a wet etching process, or combinations thereof. In some embodiments, the etching process includes multiple steps, such as a first etch step that selectively etches hard masks 286, a second etch stop that selectively etches dummy gate electrodes 284, and a third etch step that selectively etches dummy gate dielectrics 282 (e.g., the first, second, and third etch steps implement different etchants). In some embodiments, the etching process uses a patterned mask layer as an etch mask, where the patterned mask layer covers ILD protection layer 324 and/or gate spacers 289 but has openings therein that expose dummy gate stacks 280.

After removing dummy gate stacks 280, semiconductor layers 215 of semiconductor layer stacks 210 exposed by gate openings 330 are selectively removed from channel regions of multigate device 200, thereby forming suspended semiconductor layers 220' separated from one another and/or fin portions 202' by gaps 335A. Silicon germanium sacrificial spacers 240' are also selectively removed from channel regions of multigate device 200, thereby forming gaps 335B between suspended semiconductor layers 220' and gate isolation fins 270A-270D. As such, each transistor region of multigate device 200 has at least one suspended semiconductor layer 220'. For example, each transistor region of multigate device 200 includes three suspended semiconductor layers 220' vertically stacked along the z-direction for providing three channels through which current can flow between respective epitaxial source/drain features 310 during operation of transistors corresponding with the transistor regions. Suspended semiconductor layers 220' are thus referred to as channel layers 220' hereinafter, and the process for forming channel layers 220' can be referred to as a channel release process. In the depicted embodiment, top surfaces of topmost channel layers 220' are lower than top surfaces of gate isolation fins 270A-270D relative to a top surface of substrate 202 (i.e., channel heights of transistors of multigate device 200 are less than heights of gate isolation fins 270A-270D). For example, a height difference Δh between top surfaces of topmost channel layers 220' and top surfaces of gate isolation fins 270A-270D is about 5 nm to about 25 nm. A spacing s1 is defined between channel layers 220' along the z-direction, and a spacing s2 is defined between channel layers 220' and gate isolation fins 270A-270D along the y-direction. Spacing s1 and spacing s2 correspond with widths of gaps 335A and gaps 335B, respectively. In some embodiments, spacing s1 is about equal to a thickness t1 of semiconductor layers 215, and spacing s2 is about equal to a thickness of silicon germanium sacrificial spacers 240', though the present disclosure contemplates embodiments where spacing s1 is greater than or less than thickness t1 and spacing s2 is greater than or less than the thickness of silicon germanium spacers 240'. In some embodiments, spacing s1 is about 8 nm to about 15 nm. In some embodiments, spacing s2 is about 8 nm to about 15 nm. In some embodiments, each channel layer 220' has nanometer-sized dimensions and can be referred to as "nanostructures," alone or collectively. For example, each channel layer 220' can have a width along the x-direction that is about 8 nm to about 100 nm, a length along the y-direction that is about 8 nm to about 100 nm, and a thickness along the z-direction that is about 3 nm to about 10 nm. In some embodiments, channel layers 220' have sub-nanometer dimensions. Channel layers 220' can have cylindrical-shaped profiles (e.g., nanowires), rectangular-shaped profiles (e.g., nanobars), sheet-shaped profiles (e.g., nanosheets (e.g., dimensions in the X-Y plane are greater than dimensions in the X-Z plane and the Y-Z plane to form sheet-like structures), or any other suitable shaped profile.

In some embodiments, an etching process is performed to selectively etch semiconductor layers 215 and silicon germanium sacrificial spacers 240' with minimal (to no) etching of semiconductor layers 220, fin portions 202', isolation features 235, gate isolation fins 270A-270D, gate spacers 289, inner spacers 300A, inner spacers 300B, and/or ILD protection layer 324. In some embodiments, an etchant is selected for the etch process that etches silicon germanium (i.e., semiconductor layers 215 and silicon germanium sacrificial spacers 240') at a higher rate than silicon (i.e., semiconductor layers 220 and fin portions 202') and dielectric materials (i.e., isolation features 235, gate isolation fins 270A-270D, gate spacers 289, inner spacers 300A, inner spacers 300B, and/or ILD protection layer 324) (i.e., the etchant has a high etch selectivity with respect to silicon germanium). The etching process is a dry etching process, a wet etching process, or combinations thereof. In some embodiments, the etching process partially, but minimally, etches semiconductor layers 220 and fin portions 202'. For example, in FIGS. 16A-16C, the etching process reduces the lengths of semiconductor layers 220 along the y-direction, such that lengths of channel layers 220' are less than lengths of semiconductor layers 220 before the etching process. In such embodiments, the etching process may also reduce widths of portions of fin portions 202' extending above top surfaces of isolation features 235 along the y-direction, such that widths of the portions of fin portions 202' (which can be referred to as fin extensions) are less than widths of fin portions 202'. In some embodiments, the etching process is configured to intentionally etch semiconductor layers 220 along the y-direction to achieve target lengths of channel layers 220'. In some embodiments, before performing the etching process, an oxidation process can be implemented to convert semiconductor layers 215 and/or silicon germanium sacrificial spacers 240' into silicon germanium oxide features, where the etching process then removes the silicon germanium oxide features. In some embodiments, the etching process includes multiple steps, such as a first etch step configured to remove silicon germanium spacers 240' and a second etch step configured to remove semiconductor layers 215. In some embodiments, after removing semiconductor layers 215 and silicon germanium sacrificial spacers 240', an etching process is performed to modify a profile of channel layers 220' to achieve target dimensions and/or target shapes for channel layers 220'.

In FIGS. 16A-16D, a trimming process is performed on dielectric liners 260A-260D of gate isolation fins 270A-270D to increase spacing s2 between channel layers 220' and gate isolation fins 270A-270D. Increasing spacing s2 between channel layers 220' and gate isolation fins 270A-270D enlarges a metal gate fill window for forming metal gate stacks in gate openings 330, as described further below. The trimming process increases spacing s2 by reducing thickness t4 of dielectric liners 260A-260D along sidewalls of gate isolation fins 270A-270D to a thickness t8. In some embodiments, thickness t8 is about 1 nm to about 7 nm. Accordingly, dielectric liners 260A-260D have different thicknesses along sidewalls of gate isolation fins 270A-270D (e.g., thickness t8, which is less than thickness t4) and bottoms of gate isolation fins 270A-270D (e.g., thickness t4) in channel regions of multigate device 200, but substantially the same thicknesses along sidewalls of gate isolation fins 270A-270D and bottoms of gate isolation fins 270A-270D (e.g., thickness t4). Further, after the trimming process, gate isolation fins 270A-270D in channel regions are less than widths of gate isolation fins 270A-270D in source/drain regions. For example, gate isolation fin 270A separates active regions by spacing (width) D3 in source/drain regions and spacing (width) D4 in channel regions, and gate isolation fins 270B-270D separate active regions by spacing (width) D5 in source/drain regions and spacing (width) D6 in channel regions. Spacing D4 is less than spacing D3, spacing D6 is less than spacing D5, spacing D3 is less than spacing D1, and spacing D5 is less than spacing D2. In some embodiments, spacing (width) D5 is greater than about 15 nm. In some embodiments, spacing (width) D6 is about 5 nm to about 20 nm. In some embodiments, a ratio of spacing (width) D5 to spacing (width) D6 (D5/D6) is about 3 to about 20.

The trimming process is an etching process that selectively etches dielectric liners 260A-260D with minimal (to no) etching of dielectric liners 262A-262D, dielectric capping layer 266, channel layers 220', fin portions 202', isolation features 235, gate spacers 289, inner spacers 300A, inner spacers 300B, and/or ILD protection layer 324. In other words, the trimming process substantially removes dielectric liners 260A-260D but does not remove, or does not substantially remove, dielectric liners 262A-262D, dielectric capping layer 266, channel layers 220', fin portions 202', isolation features 235, gate spacers 289, inner spacers 300A, inner spacers 300B, and/or ILD protection layer 324. For example, an etchant is selected for the trimming process that etches high-k dielectric material (i.e., dielectric liners 260A-260D) at a higher rate than silicon (i.e., channel layers 220' and fin portions 202') and other dielectric materials (i.e., dielectric liners 262A-262D, dielectric capping layer 266, isolation features 235, gate spacers 289, inner spacers 300A, inner spacers 300B, and/or ILD protection layer 324) (i.e., the etchant has a high etch selectivity with respect to high-k dielectric material). The etching process is a dry etching process, a wet etching process, or combinations thereof. In some embodiments, the etching process is configured to etch substantially along the y-direction to reduce thicknesses of dielectric liners 260A-260D along the y-direction. In some embodiments, the etching process is a plasma etching process.

Figure 17A:
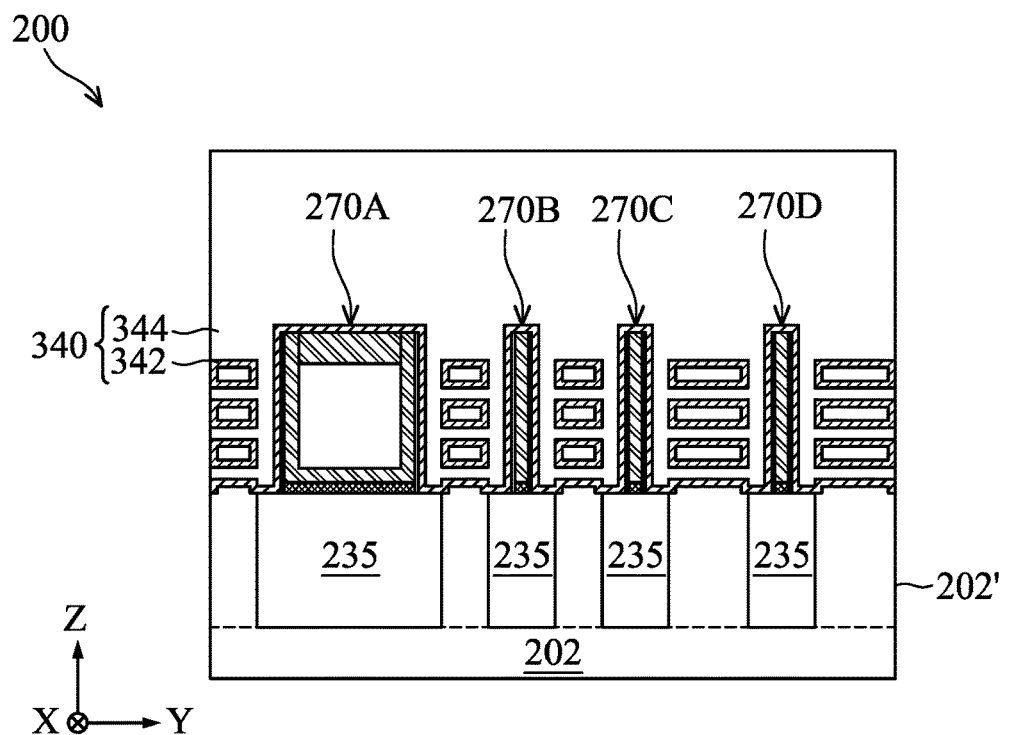
Figure 17B:
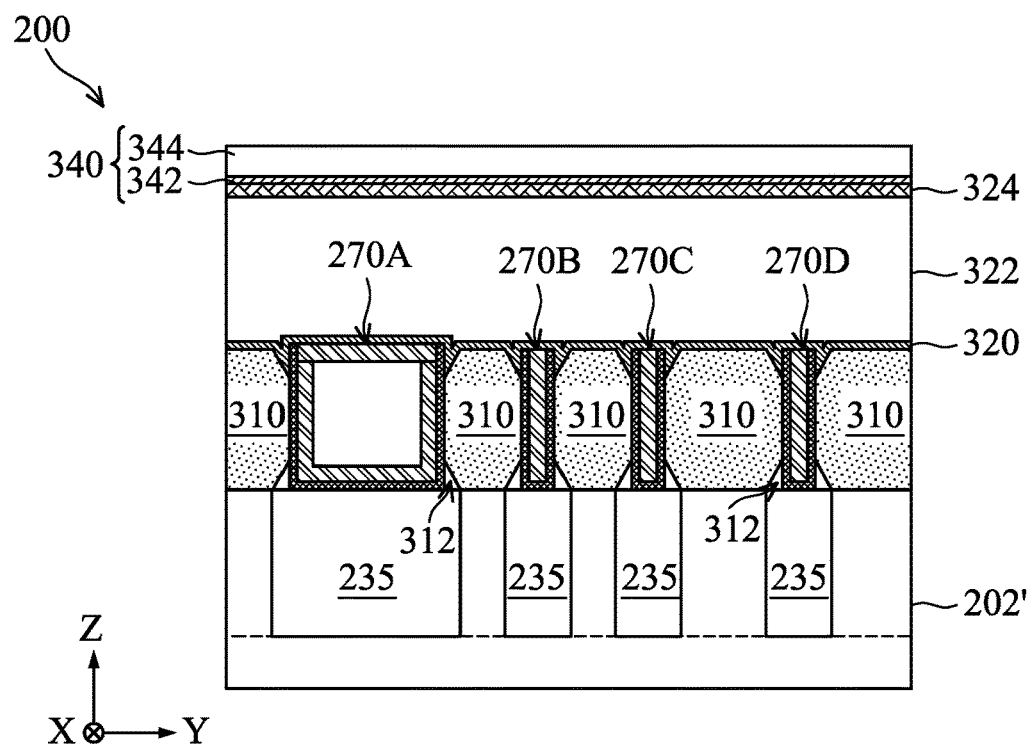
Figure 17C:
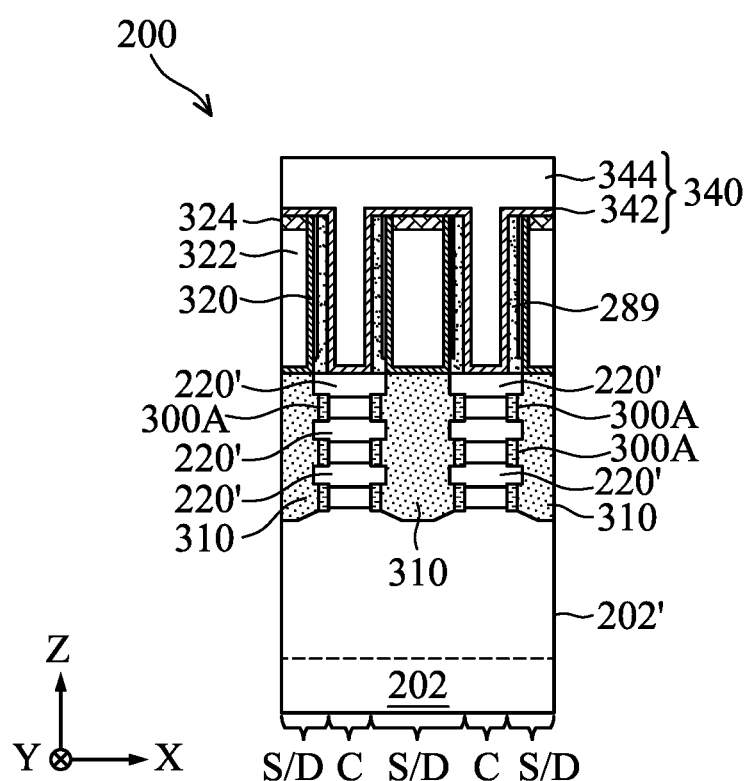

Turning to FIGS. 17A-17C, a metal gate stack 340 (also referred to as a metal gate and/or a high-k/metal gate) is formed over multigate device 200 and fills gate openings 330. Metal gate stack 340 includes a gate dielectric 342 (for example, a gate dielectric layer) and a gate electrode 344 (for example, a work function layer and a bulk metal layer). Metal gate stack 340 may include numerous other layers. In some embodiments, forming metal gate stack 340 includes depositing a gate dielectric layer over multigate device 200 that partially fills gate openings 330, depositing a gate electrode layer over the gate dielectric layer that fills a remainder of gate openings 330, and performing a planarization process on the gate electrode layer, thereby forming metal gate stack 340 having gate dielectric 342 and gate electrode 344. Gate dielectric 342 and gate electrode 344 extend uninterrupted along the y-direction. Metal gate stack 340 is configured to achieve desired functionality according to design requirements of multigate device 200. Since metal gate stack 340 may span different transistor regions of multigate device 200, metal gate stack 340 may have different layers in the different transistor regions. For example, a number, configuration, and/or materials of layers of gate dielectric 342 and/or gate electrode 344 corresponding with a first transistor region of multigate device 200 (e.g., an n-type transistor region) may be different than a number, configuration, and/or materials of layers of gate dielectric 342 and/or gate electrode 344 corresponding with a second transistor region of multigate device 200 (e.g., a p-type transistor region).

Gate dielectric 342 partially fills gate openings 330 and wraps respective channel layers 220', such that gate dielectric 342 partially fills gaps 335A and gaps 335B. In the depicted embodiment, gate dielectric 342 covers exposed surfaces of channel layers 220', such that gate dielectric 342 is disposed along top surfaces, bottom surfaces, and sidewalls of channel layers 220'. For example, gate dielectric 342 surrounds channel layers 220', such that each channel layer 220' is wrapped and/or surrounded by a respective gate dielectric (i.e., portion of gate dielectric 342). In some embodiments, gate dielectric 342 is further disposed over fin portions 202', isolation features 235, and gate isolation fins 270A-270D in channel regions. In the depicted embodiment, gate dielectric 342 extends uninterrupted between transistor regions of multigate device 200. Gate dielectric 342 includes a high-k dielectric layer, which includes a high-k dielectric material, which for purposes of metal gate stack 340 refers to a dielectric material having a dielectric constant that is greater than that of silicon dioxide (k≈3.9). For example, the high-k dielectric layer includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. For example, an ALD process deposits the high-k dielectric layer. In some embodiments, the ALD process is a conformal deposition process, such that a thickness of the high-k dielectric layer is substantially uniform (conformal) over the various surfaces of multigate device 200. In some embodiments, gate dielectric 342 includes an interfacial layer disposed between the high-k dielectric layer and channel layers 220'. The interfacial layer includes a dielectric material, such as $SiO_2$, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof. For example, the interfacial layer is formed by a chemical oxidation process that exposes exposed surfaces of channel layers 220' to hydrofluoric acid. In some embodiments, the interfacial layer is formed by a thermal oxidation process that exposes the exposed surfaces of channel layers 220' to an oxygen and/or air ambient. In some embodiments, the interfacial layer is formed after forming the high-k dielectric layer. For example, in some embodiments, after forming the high-k dielectric layer, multigate device 200 may be annealed in an oxygen and/or nitrogen ambient (e.g., nitrous oxide).

Gate electrode 344 is formed over gate dielectric 342, filling a remainder of gate openings 330 and wrapping respective channel layers 220', such that gate electrode 344 fills remainders of gaps 335A and gaps 335B. Because the trimming process increases spacing S2 (and thus increases lateral spacing between channel layers 220' and gate isolation fins 270A-270D), gate electrode 344 can better fill gaps 335B from top to bottom. For example, when spacing S2 is too small, gate electrode 344 may fill portions of gaps 335B between channel layers 220' and gate isolation fins 270A-270D before filling portions of gaps 335B between gaps 335A and gate isolation fins 270A-270D, which can result in voids within gate electrode 344 and/or some layers of gate electrode 344 not surrounding channel layers 220', both of which can degrade transistor performance. By increasing spacing S2 with trimming process, filling of gaps 335B is more uniform from top to bottom, preventing void formation within gate electrode 344 and ensuring various layers of gate electrode 344, as needed, properly wrap and/or surround channel layers 220'. In the depicted embodiment, gate electrode 344 is disposed along top surfaces, bottom surfaces, and sidewalls of channel layers 220', such that gate electrode 344 surrounds channel layers 220'. Gate electrode 344 is further disposed over fin portions 202', isolation features 235, and gate isolation fins 270A-270D in channel regions. Gate electrode 344 includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrode 344 includes a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrode 344 is formed by any of the processes described herein, such as ALD, CVD, PVD, plating, other suitable process, or combinations thereof.

Figure 18A:
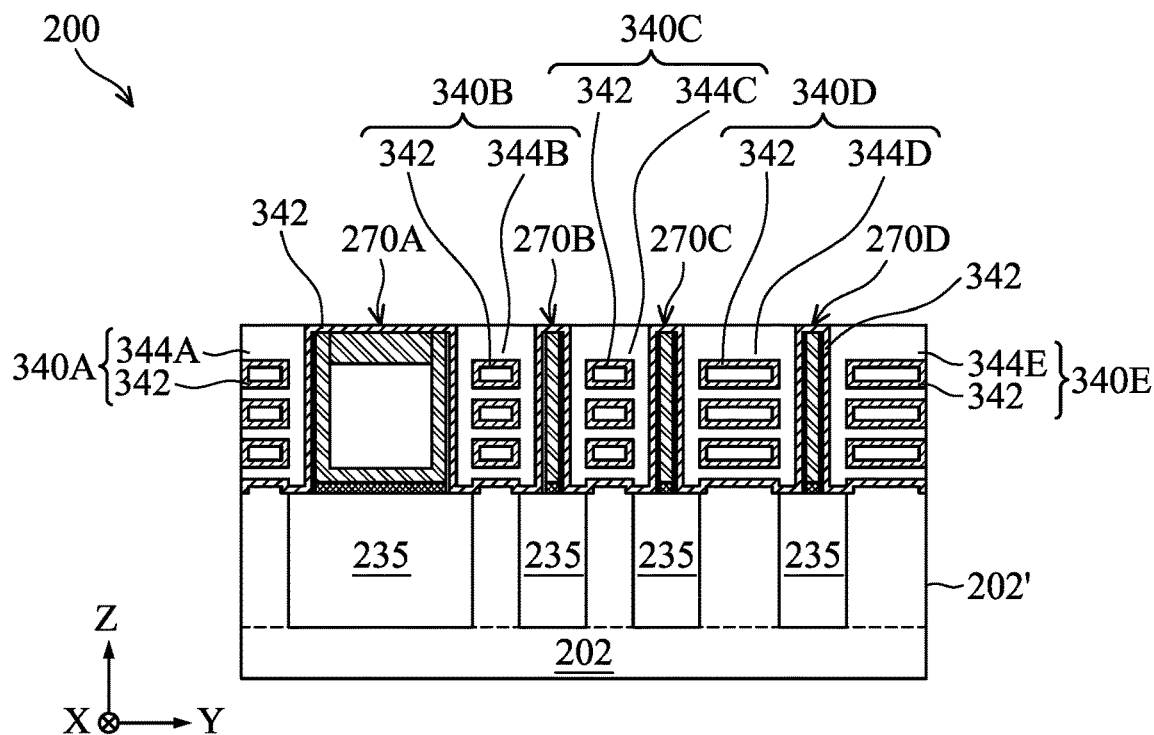
Figure 18B:
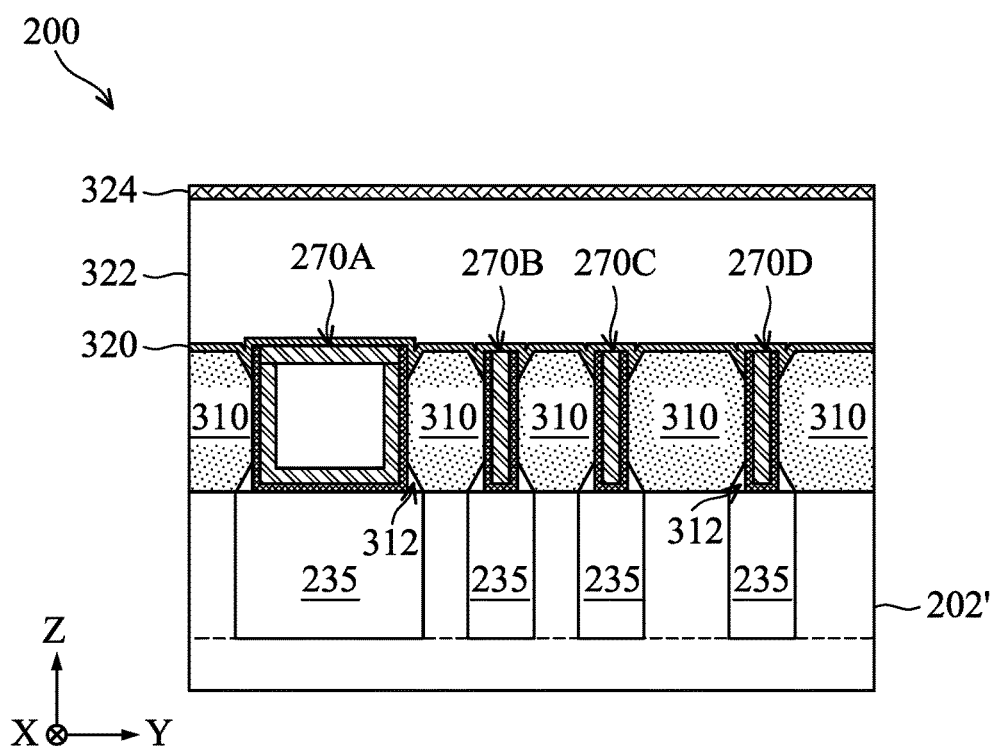
Figure 18C:
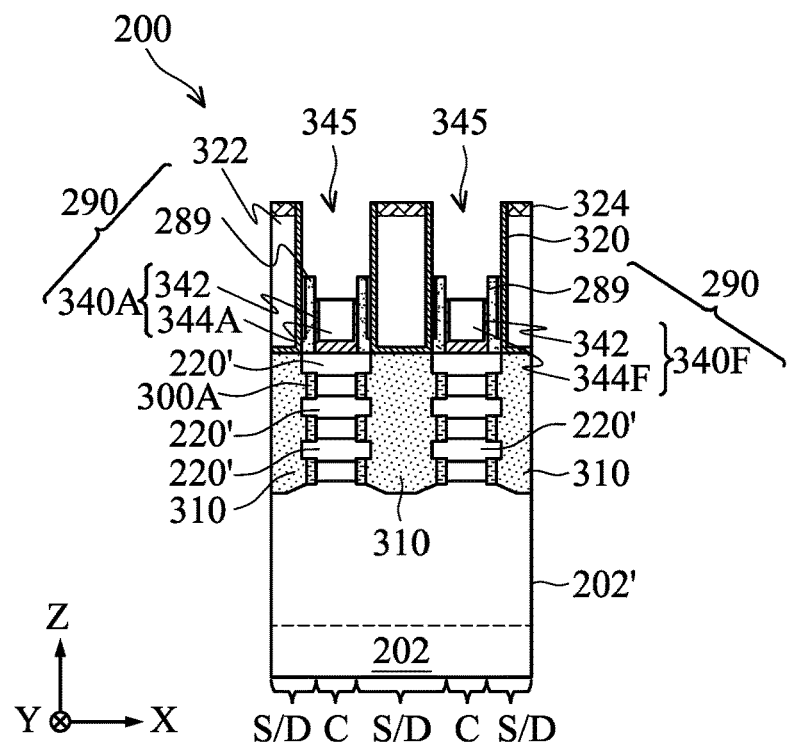
Figure 18D:
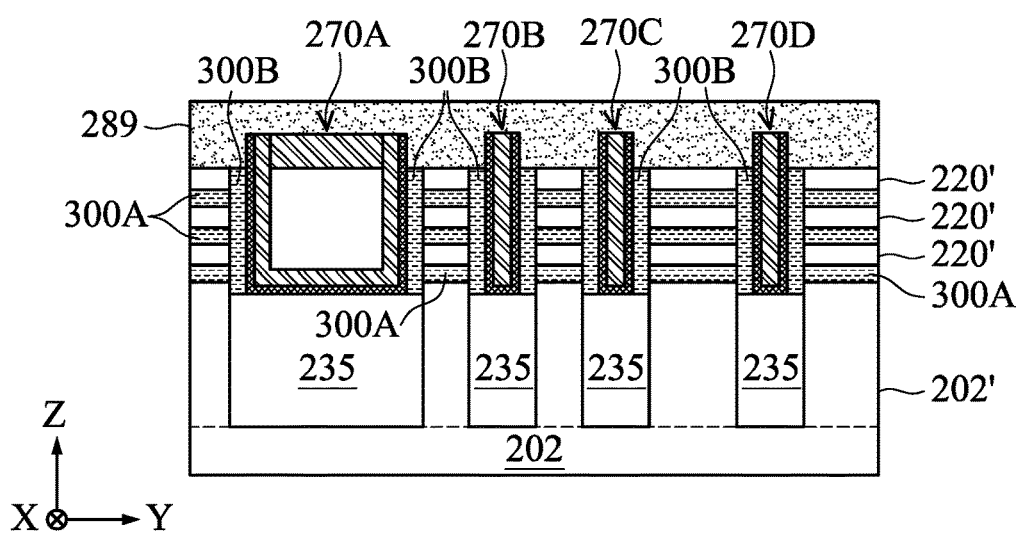
Figure 19A:
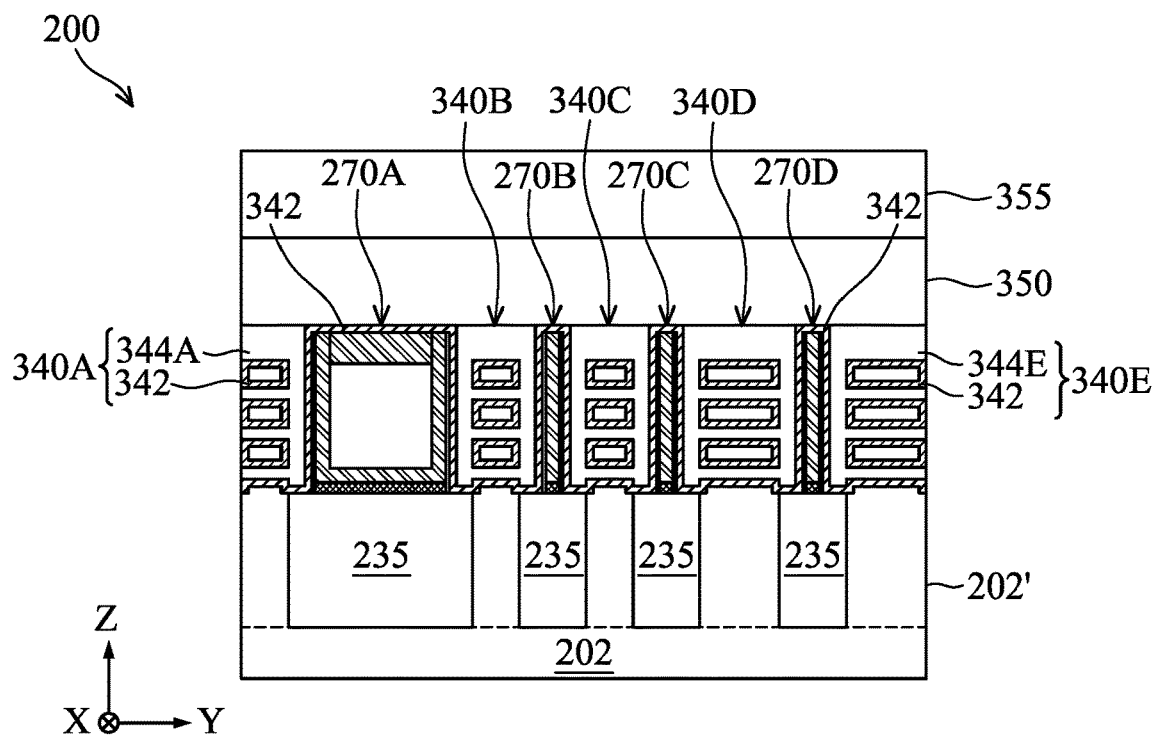
Figure 19B:
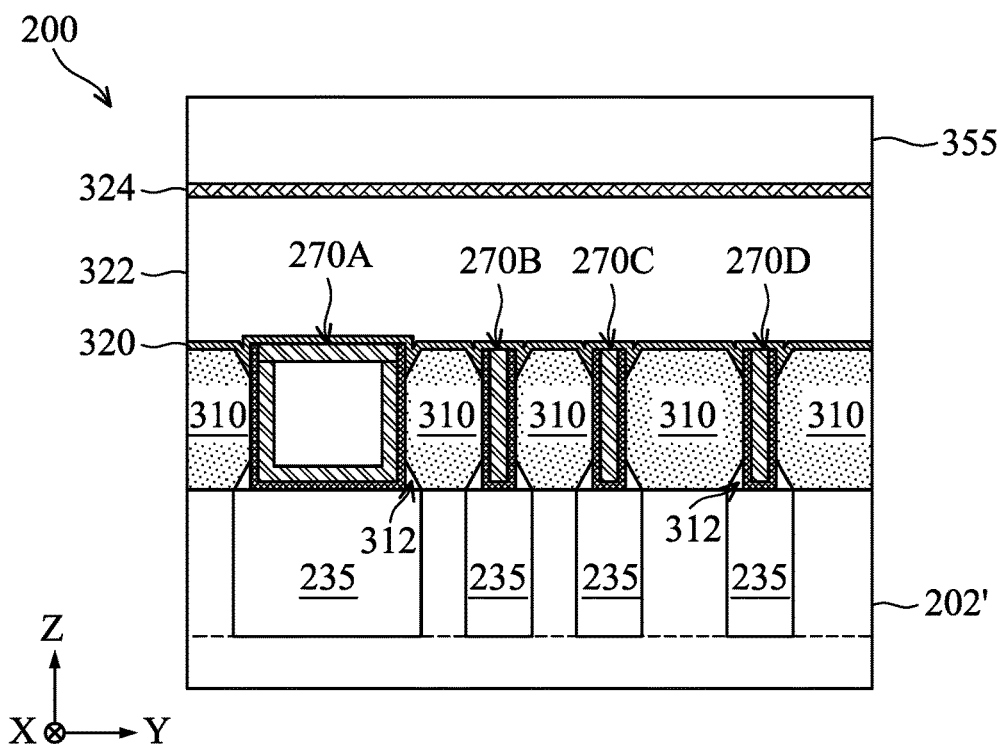
Figure 19C:
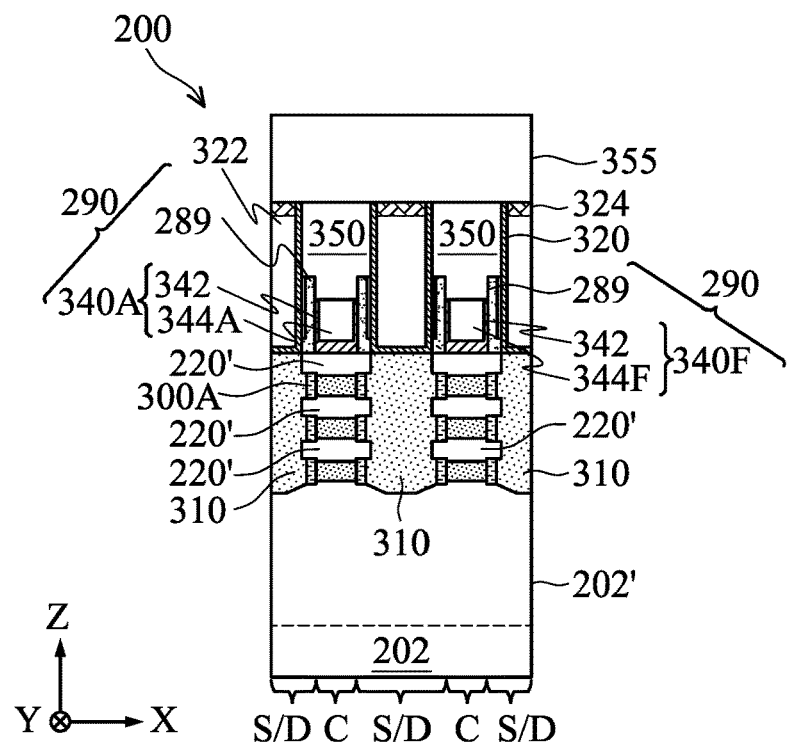
Figure 19D:
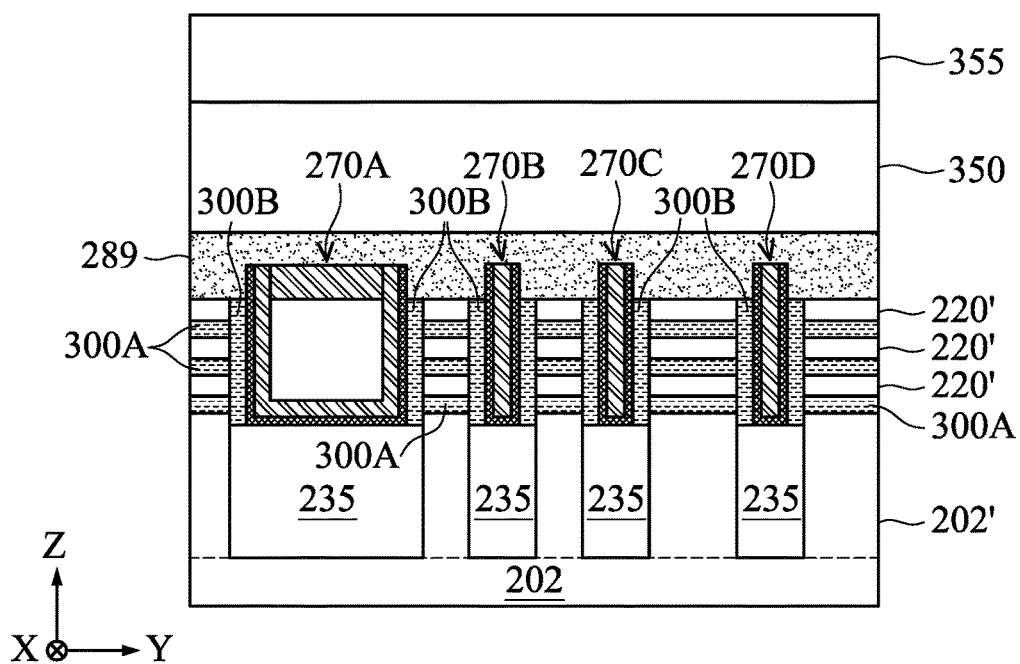

Turning to FIGS. 18A-18D, a self-aligned metal gate cut process is performed that removes portions of metal gate stack 340 to form metal gates of multigate device 200, such as a metal gate 340A, a metal gate 340B, a metal gate 340C, a metal gate 340D, a metal gate 340E, and a metal gate 340F. The metal gate cut process is referred to as "self-aligned" because gate isolation fins 270A-270D are aligned between metal gates 340A-340E without having to perform a lithography process after forming metal gate stack 340. For example, an etch back (recess) process removes portions of gate electrode 344 that are disposed over top surfaces of gate isolation fins 270A-270D, thereby forming a gate electrode 344A, a gate electrode 344B, a gate electrode 344C, a gate electrode 344D, a gate electrode 344E, and a gate electrode 344F. The etch back process also removes portions of gate dielectric 342 that are disposed over ILD protection layer 324 but not from over top surfaces of gate isolation fins 270A-270D. Accordingly, after the etch back process, gate electrode 344 no longer extends uninterrupted along the y-direction, while gate dielectric 342 still extends uninterrupted along the y-direction, and metal gates 340A-340F include respective portions of gate dielectric 342 and a respective one of gate electrodes 344A-344F. In the metal gate cut view (FIG. 18A), gate isolation fins 270A-270D separate adjacent metal gates of multigate device 200. For example, gate isolation fin 270A separates and isolates metal gate 340A from metal gate 340B, gate isolation fin 270B separates and isolates metal gate 340B from metal gate 340C, gate isolation fin 270C separates and isolates metal gate 340C from metal gate 340D, gate isolation fin 270D separates and isolates metal gate 340D from metal gate 340E. In the fin cut view (FIG. 18C), ILD layer 322 and CESL 322 separate adjacent metal gates of multigate device 200. For example, ILD layer 322 and CESL 320 separate and isolate metal gate 340A from metal gate 340F. In some embodiments, the etch back process may slightly etch gate dielectric 342 over top surfaces of gate isolation fins 270A-270D. In such embodiments, a thickness of gate dielectric 342 over top surfaces of gate isolation fins 270A-270D is less than a thickness of gate dielectric 342 wrapping channel layers 220' and/or a thickness of gate dielectric 342 along sidewalls of gate isolation fins 270A-270D. The etch back process also removes portions of gate spacers 289 (e.g., reduces a height of gate spacers 289 along the z-direction) and forms openings 345 having bottoms defined by metal gates 340A-340F and sidewalls defined by CESL 320 and remainders of gate spacers 289. In the depicted embodiment, the etch back process removes gate electrode 344 and gate dielectric 342 at a faster rate than gate spacers 289, resulting in top surfaces of metal gates 340A-340F that are lower than top surfaces of gate spacers 289 relative to a top surface of substrate 202 (FIG. 18C). The etch back process is configured to selectively remove gate electrode 344 with respect to ILD protection layer 324 and CESL 320. In other words, the etch back process substantially removes gate electrode 344 but does not remove, or does not substantially remove, ILD protection layer 324 and CESL 320. For example, an etchant is selected for the etch process that etches metal materials (e.g., gate electrode 344) at a higher rate than nitrogen-comprising materials (e.g., ILD protection layer 324 and CESL 320) (i.e., the etchant has a high etch selectivity with respect to metal materials and oxide materials). In the depicted embodiment, the etch back process also has a low etch selectivity with respect to dielectric materials (e.g., gate dielectric 342 (including high-k dielectric) and gate spacers 289 (including silicon, oxygen, and/or carbon), which results in some etching of gate dielectric 342 and gate spacers 289 by the etch back process. The etch back process is a dry etching process, a wet etching process, other suitable etching process, or combinations thereof.

Turning to FIGS. 19A-19D, FIGS. 20A-20E, FIGS. 21A-21D, and FIGS. 22A-22D, fabrication can proceed with forming gate isolation end caps over one or more of gate isolation fins 270A-270D depending on design requirements of multigate device 200. In FIGS. 19A-19D, fabricating gate isolation end caps includes depositing a hard mask layer 350 over multigate device 200 that fills openings 345; planarizing (for example, by CMP) hard mask layer 350; and depositing a hard mask layer 355 over hard mask layer 350. ILD protection layer 324 functions as a planarization (e.g., CMP) stop layer, such that the planarization process is performed until reaching and exposing ILD protection layer 324. Hard mask layer 350 includes a material that is different than a material of hard mask layer 355 and a material of ILD protection layer 324 to achieve etching selectivity and/or planarization (polishing) selectivity. In the depicted embodiment, hard mask layer 350 is an amorphous silicon layer or a spin-on-carbon (SOC) layer, and hard mask layer 355 is a silicon nitride layer. The present disclosure contemplates hard mask layer 350 and hard mask layer 355 including any other materials that can provide the etching selectivity and/or the planarization selectivity needed to form gate isolation end caps as described herein. Hard mask layer 350 and/or hard mask layer 355 can be formed by CVD, PVD, ALD, HDPCVD, MOCVD, RPCVD, PECVD, LPCVD, ALCVD, APCVD, other suitable methods (e.g., spin coating), or combinations thereof.

In FIGS. 20A-20E, a patterning process is performed to form gate isolation end cap openings, such as a gate isolation end cap opening 360A and a gate isolation end cap opening 360B, in hard mask layer 355 and hard mask layer 350, which are referred to hereinafter as a patterned hard mask layer 355' and a patterned hard mask layer 350'. In the metal gate cut view (FIG. 20A), gate isolation end cap opening 360A and gate isolation end cap opening 360B further extend through gate dielectric 342 to expose gate isolation fin 270A and gate isolation fin 270C, respectively, in channel regions of multigate device 200, such that gate dielectric 342 no longer extends uninterrupted along the y-direction. For example, gate isolation end cap openings (e.g., gate isolation end cap openings 360A, 360B) separate gate dielectric 342 into a gate dielectric 342A, a gate dielectric 342B, a gate dielectric 342C, and a gate dielectric 342D. In the gate spacer cut view (FIG. 20D), gate isolation end cap openings 360A, 360B extend through gate spacers 289 to expose gate isolation fin 270A and gate isolation fin 270C, respectively. Gate isolation end cap openings 360A, 360B define locations and dimensions of gate isolation end caps to be formed for multigate device 200, such as areas of multigate device 200 where metal gates will be electrically separated and isolated from one another, such as metal gates of different transistors. In some embodiments, patterned hard mask layer 355' and patterned hard mask layer 350' define self-aligned contact (SAC) areas of multigate device 200, in which metal capping layers and/or dielectric capping layers can be formed as described below. In some embodiments, patterned hard mask layer 355' and patterned hard mask layer 350' define metal gate connection areas of multigate device 200, such as a metal connection area 362A and a metal connection area 362B. As described further below, in metal connection area 362A and metal connection area 362B, metal capping layers are formed that physically and electrically connect adjacent metal gates, such as gate electrode 344B of metal gate 340B to gate electrode 344C of metal gate 340D in metal connection area 362A and gate electrode 344D of metal gate 340D to gate electrode 344E of metal gate 340E in metal connection area 362B.

The patterning process includes a lithography process and/or an etching process. The lithography process can include forming a resist layer over hard mask layer 355 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes exposed portions of an underlying layer (here, hard mask layer 355 and/or hard mask layer 350) using the patterned resist layer as an etch mask. In some embodiments, a first etching process removes exposed portions of hard mask layer 355 using the patterned resist layer as an etch mask to form patterned hard mask layer 355', and a second etching process removes exposed portions of hard mask layer 350 using patterned hard mask layer 355' and/or the patterned resist layer as an etch mask to form patterned hard mask layer 350'. In some embodiments, the second etching process also removes portions of gate dielectric 342 and/or portions of gate spacers 289 underlying the exposed portions of hard mask layer 350. In some embodiments, a third etching process removes the exposed portions of gate dielectric 342 and/or the exposed portions of gate spacers 289 using patterned hard mask layer 350', patterned hard mask layer 355', and/or the patterned resist layer as an etch mask. The etching process can include a dry etching process, a wet etching process, other suitable etching process, or combinations thereof. In some embodiments, the patterned resist layer is removed by the first etching process, the second etching process, and/or the third etching process. In some embodiments, the patterned resist layer is removed after the first etching process, the second etching process, and/or the third etching process, for example, by a resist stripping process.

In FIGS. 21A-21D, a deposition process and a planarization process are performed to form a gate isolation end cap 365A and a gate isolation end cap 365B, which can also be referred to as gate end isolation plugs or gate end isolation layers. Gate isolation end cap 365A is disposed on and physically contacts gate isolation fin 270A, and gate isolation end cap 365B is disposed on and physically contacts gate isolation fin 270B. Gate isolation end cap 365A separates metal gate regions (and/or SAC regions) by a spacing (width) D7. In the depicted embodiment, since spacing D7 is less than spacing (width) D4 of gate isolation fin 270A, gate isolation end cap 365A is disposed between a portion of gate dielectric 342A and a portion of gate dielectric 342B that are disposed over the top surface of gate isolation fin 270A. In some embodiments, spacing (width) D7 is about 5 nm to about 20 nm. Gate isolation end cap 365B separates metal gate regions (and/or SAC regions) by a spacing (width) D8. In the depicted embodiment, since spacing D8 is substantially the same as spacing (width) D6 of gate isolation fin 270C, gate isolation end cap 365B is disposed between a portion of gate dielectric 342B disposed along a first sidewall of gate isolation fin 270C and a portion of gate dielectric 342C disposed along a second sidewall of gate isolation fin 270C. In some embodiments, spacing (width) D8 is about 5 nm to about 20 nm. In some embodiments, spacing D8 is less than spacing D6, such that gate isolation end cap 365B is disposed between a portion of gate dielectric 342B and a portion of gate dielectric 342C that are disposed over the top surface of gate isolation fin 270C. In some embodiments, spacing D7 is substantially the same as spacing D4. In some embodiments, a gate isolation end cap material is deposited over multigate device 200 that fills gate isolation end cap openings 360A, 360B and a planarization process (e.g., CMP) is performed on the gate isolation end cap material and patterned hard mask layer 355' until reaching patterned hard mask layer 350', which functions as a planarization stop layer. In such embodiments, the planarization process completely removes patterned hard mask layer 355'. The gate isolation end cap material is different than a material of patterned hard mask layer 350' to achieve etching selectivity during subsequent processing. In some embodiments, the gate isolation end cap material includes the same material as patterned hard mask layer 355', such as silicon nitride. The present disclosure contemplates the gate isolation end cap material also being different than the material of patterned hard mask layer 355' so long as the gate isolation end cap material can provide the etching selectivity needed for subsequently removing patterned hard mask layer 350'. For example, the gate isolation end cap material can be silicon nitride, silicon carbonitride (SiCN), silicon oxycarbonitride (SiOCN), silicon oxycarbide (SiOC), silicon carbide, or other suitable material. The gate isolation end cap material can be formed by CVD, PVD, ALD, HDPCVD, MOCVD, RPCVD, PECVD, LPCVD, ALCVD, APCVD, other suitable methods (e.g., spin coating), or combinations thereof.

In FIGS. 22A-22D, patterned hard mask layer 350' is removed from multigate device 200, for example, by an etching process. The etching process is configured to selectively remove patterned hard mask layer 350' with respect to gate isolation end caps 365A, 365B, ILD protection layer 324, CESL 320, and/or gate structures 290 (i.e., gate spacers 289 and metal gate stacks 340A-340F). In other words, the etching process substantially removes patterned hard mask layer 350' but does not remove, or does not substantially remove, gate isolation end caps 365A, 365B, ILD protection layer 324, CESL 320, and/or gate structures 290. For example, an etchant is selected for the etch process that etches amorphous silicon or spin-on-carbon (i.e., patterned hard mask layer 350') at a higher rate than silicon-and-nitrogen comprising materials (i.e., gate isolation end caps 365A, 365B, ILD protection layer 324, and/or CESL 320), metal materials (i.e., gate electrodes 344A-344F), and other dielectric materials (i.e., gate dielectrics 342A-342C, gate dielectric 342, and/or gate spacers 289) (i.e., the etchant has a high etch selectivity with respect to amorphous silicon or spin-on-carbon). The etching process is a dry etching process, a wet etching process, other suitable etching process, or combinations thereof. In the depicted embodiment, removing patterned hard mask layer 350' defines openings for forming SAC capping layers that can protect metal gates 340A-340F from damage during subsequent processing, such as self-aligned contact etching processes implemented to form gate contacts and/or source/drain contacts. For example, an opening 370A, an opening 370B, an opening 370C, and an opening 370D are defined for forming SAC capping layers. Openings 370A-370D have sidewalls defined by gate isolation end caps (e.g., gate isolation end cap 365A and/or gate isolation end cap 365B), CESL 320, and/or gate spacers 289 and bottoms defined by gate spacers 289 and/or metal gates 340A-340F. In some embodiments, as described below, one or more of the SAC capping layers can electrically connect metal gates 340A-340F.

Turning to FIGS. 23A-23D, FIGS. 24A-24D, FIGS. 25A-25D, and FIGS. 26A-26D, SAC capping layers are formed in openings 370A-370D. In FIGS. 23A-23D, fabrication proceeds with depositing a metal cap seed layer 375 over multigate device 200 by, for example, PVD. Metal cap seed layer 375 includes a metal-comprising material that facilitates growth and/or deposition of metal cap layers in openings 370A-370D and promotes adhesion of the metal cap layers and metal gates 340A-340F. The metal-comprising material can include titanium, titanium alloy, tantalum, tantalum alloy, cobalt, cobalt alloy, ruthenium, ruthenium alloy, molybdenum, molybdenum alloy, palladium, palladium alloy, other suitable constituent, or combinations thereof. For example, metal cap seed layer 375 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In the depicted embodiment, metal cap seed layer 375 is a titanium nitride layer. Metal cap seed layer 375 has a thickness that is less than a depth of openings 370A-370D, such that metal cap seed layer 375 partially fills openings 370A-370D. In the depicted embodiment, the thickness of metal cap seed layer 375 varies over multigate device 200, such that metal cap seed layer 375 has a thickness t9 along bottoms of openings 370A-370D and a thickness t10 along sidewalls of openings 370A-370D. For example, portions of metal cap seed layer 375 disposed on top surfaces of metal gates 340A-340D and top surfaces of gate spacers 289 (both of which define bottoms of openings 370A-370D), top surfaces of gate isolation end caps 365A, 365B, and top surface of ILD protection layer 324 have thickness t9, while portions of metal cap seed layer 375 disposed on sidewalls of gate isolation end caps 365A, 365B, portions of sidewalls of CESL 320, and portions of sidewalls of gate spacers 289 (all of which define sidewalls of openings 370A-370D) have thickness t10. In some embodiments, thickness t9 is about 1 nm to about 5 nm. In some embodiments, thickness t10 is less than or equal to about 1 nm. In some embodiments, thickness t10 is tapered along sidewalls of openings 370A-370D. For example, in FIG. 23C, thickness t10 decreases along sidewalls of opening 370A and opening 370D defined by CESL 320 and decreases along sidewalls of opening 370A and opening 370D defined by gate spacers 289. In some embodiments, the thickness of metal cap seed layer 375 is substantially uniform over the various surfaces of multigate device 200. In some embodiments, metal cap seed layer 375 is formed over multigate device 200 by CVD, ALD, HDPCVD, MOCVD, RPCVD, PECVD, LPCVD, ALCVD, APCVD, other suitable methods (e.g., spin coating), or combinations thereof.

Figure 24A:
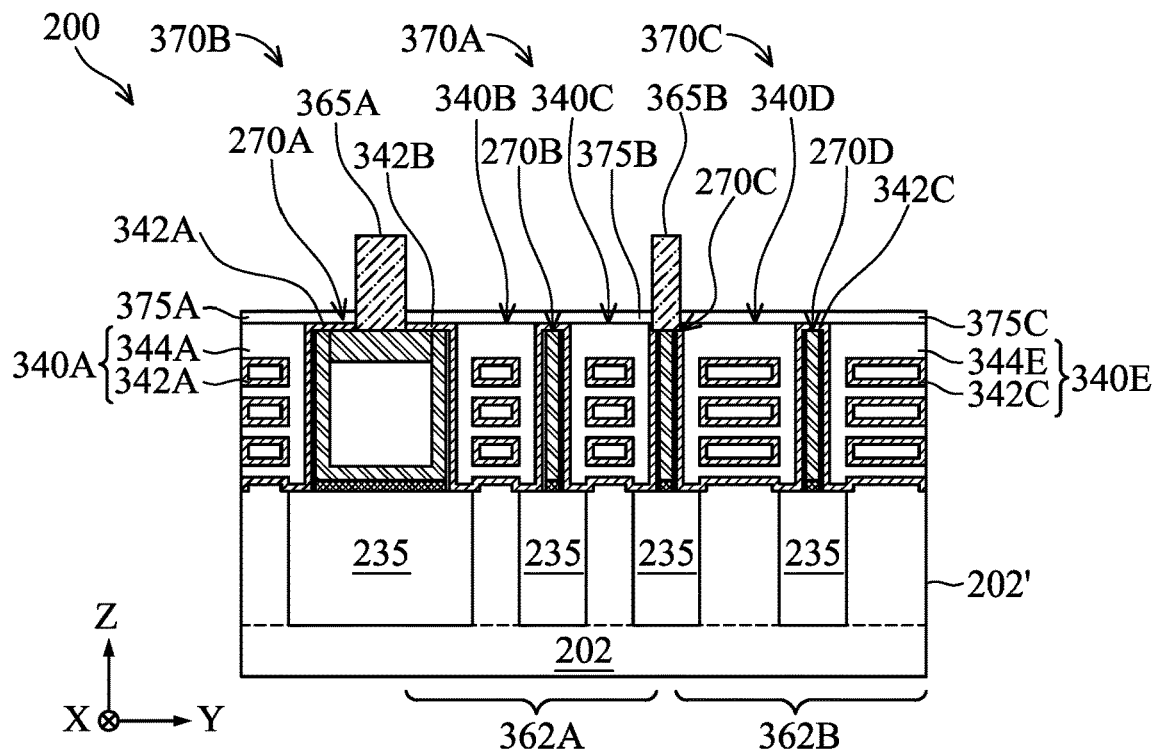
Figure 24B:
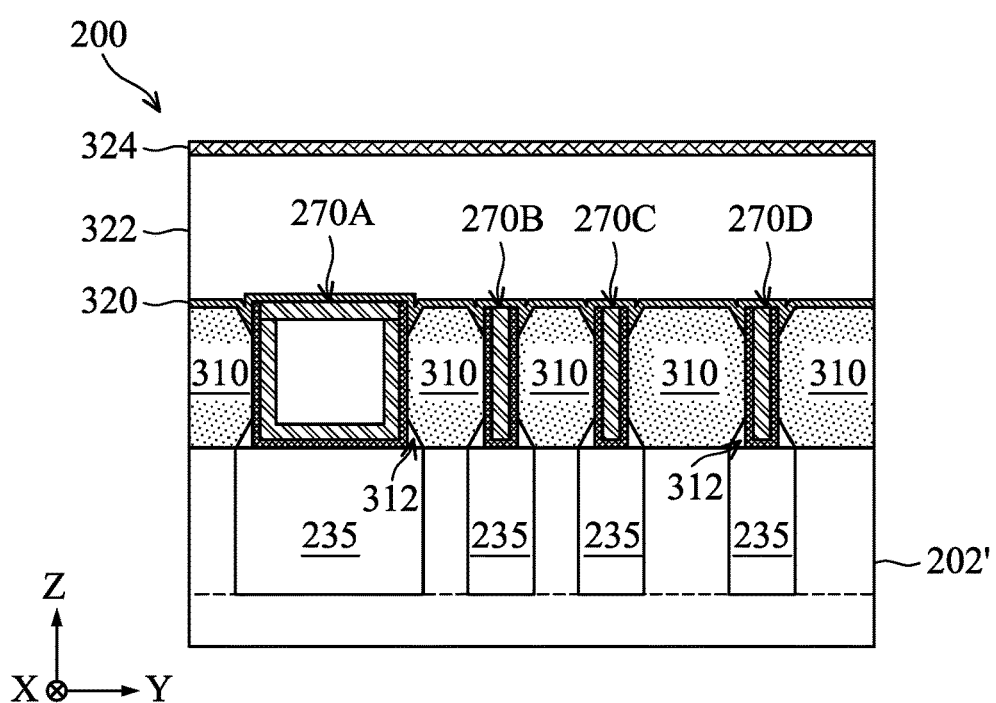
Figure 24C:
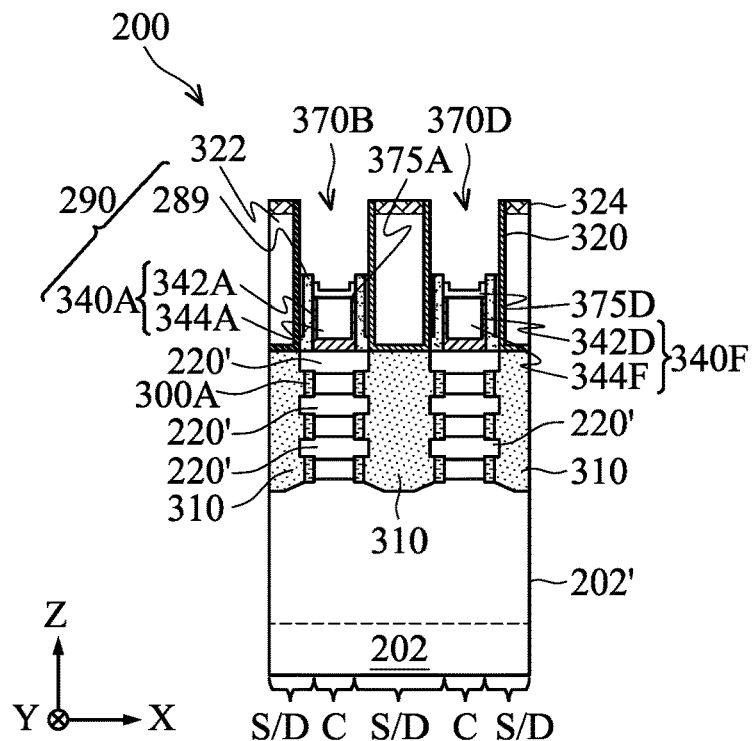
Figure 24D:
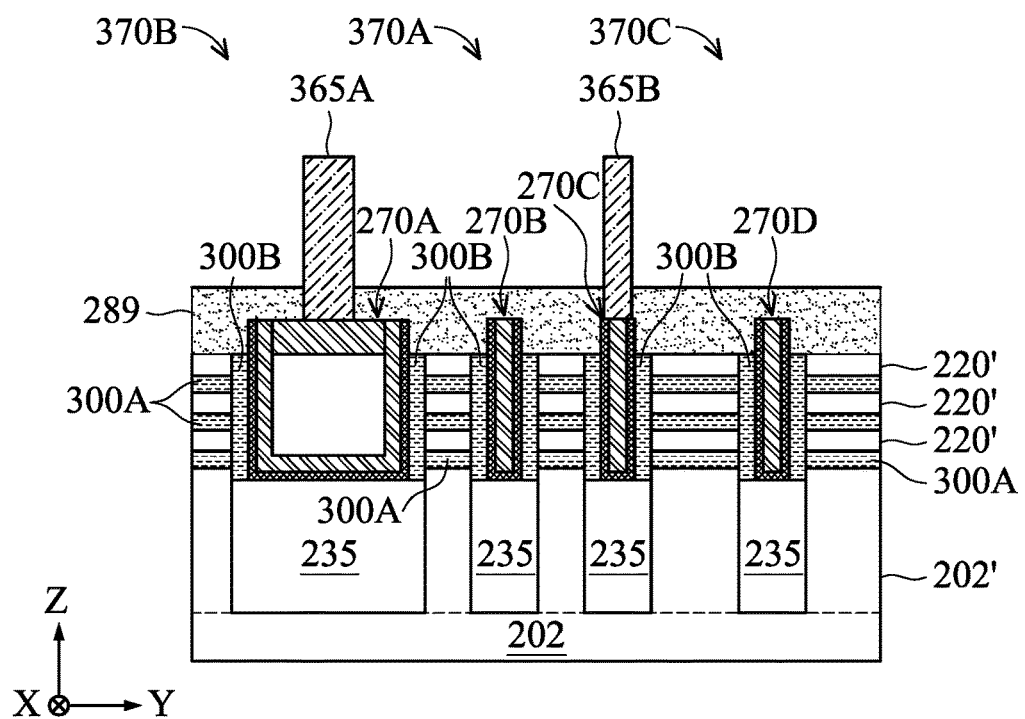
Figure 25A:
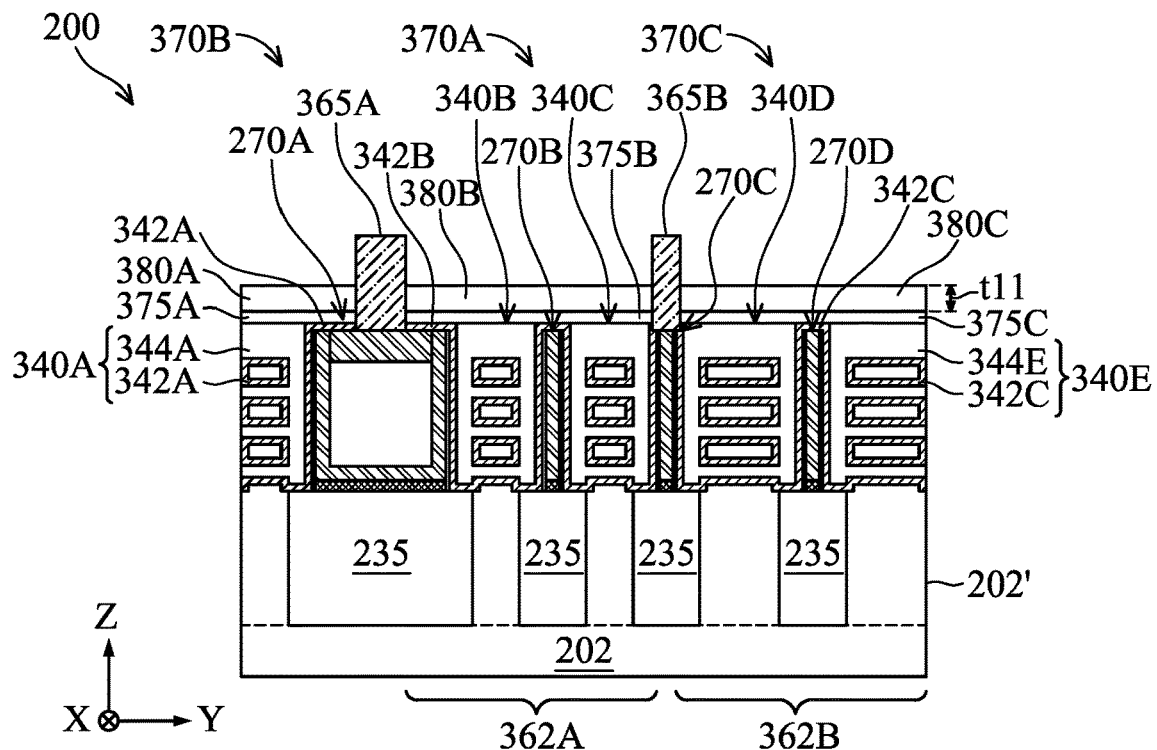
Figure 25B:
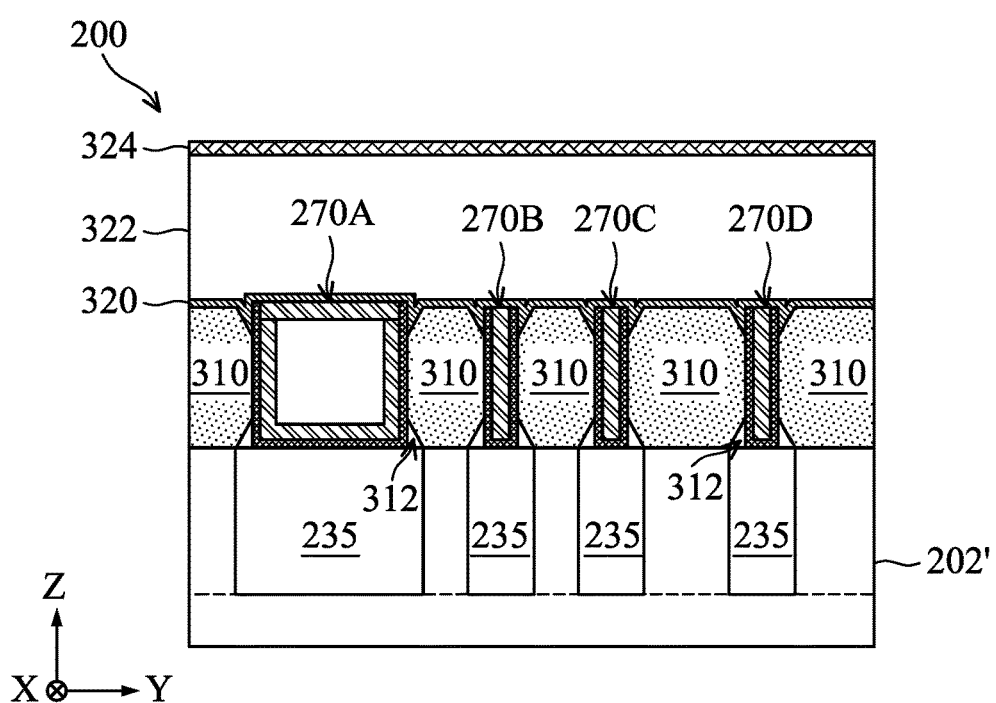
Figure 25C:
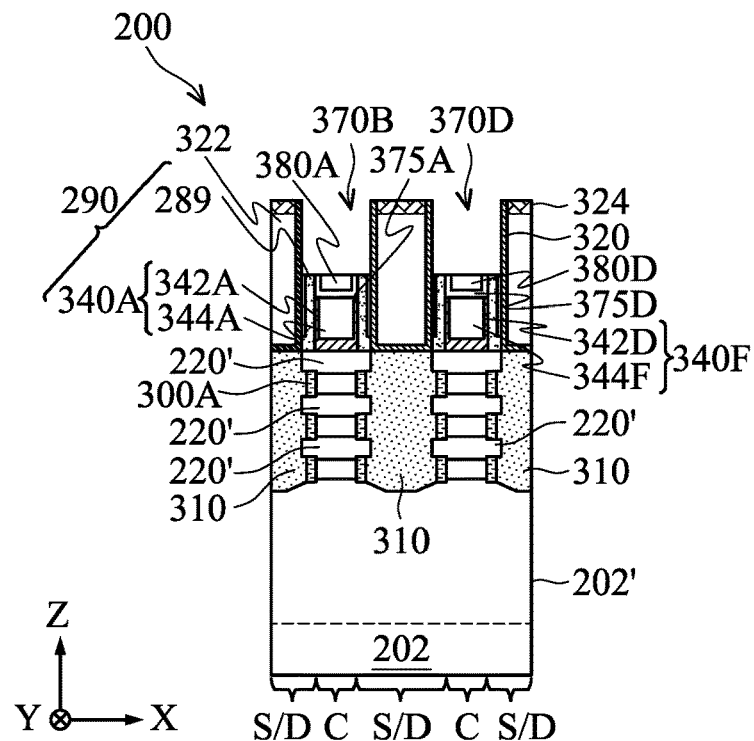
Figure 25D:
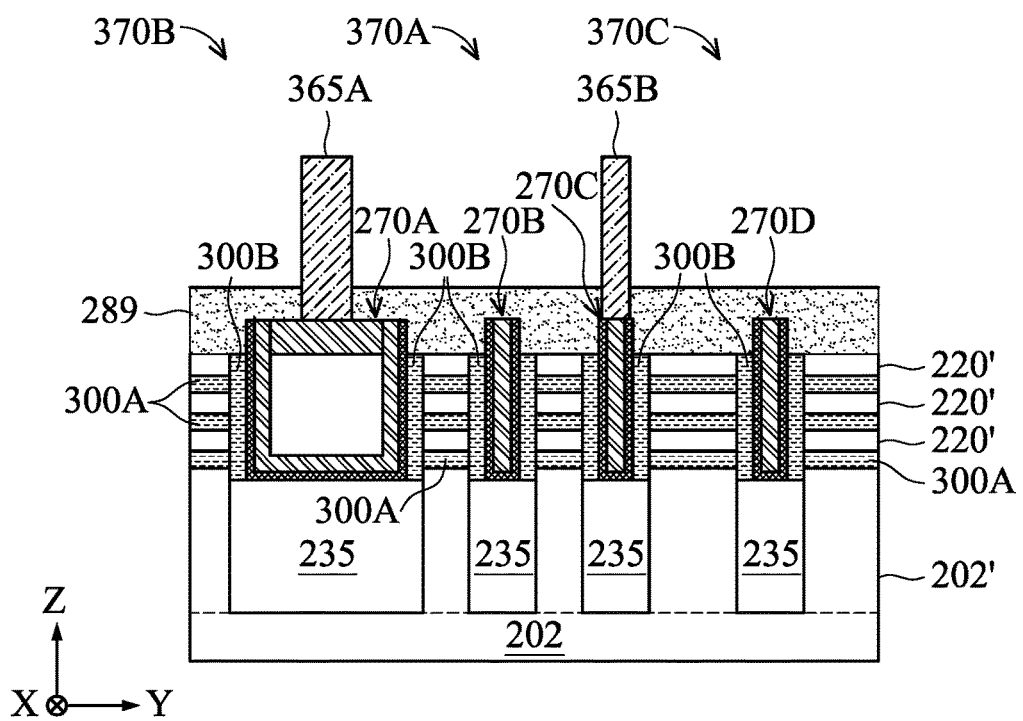
Figure 26A:
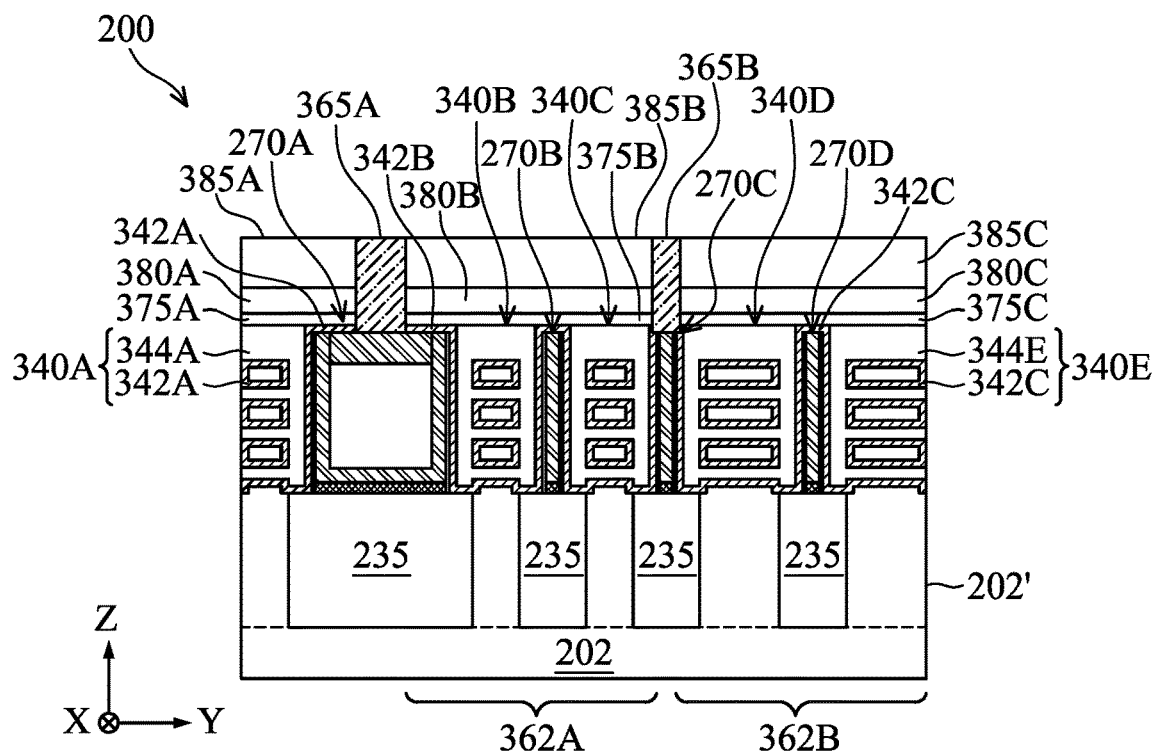
Figure 26B:
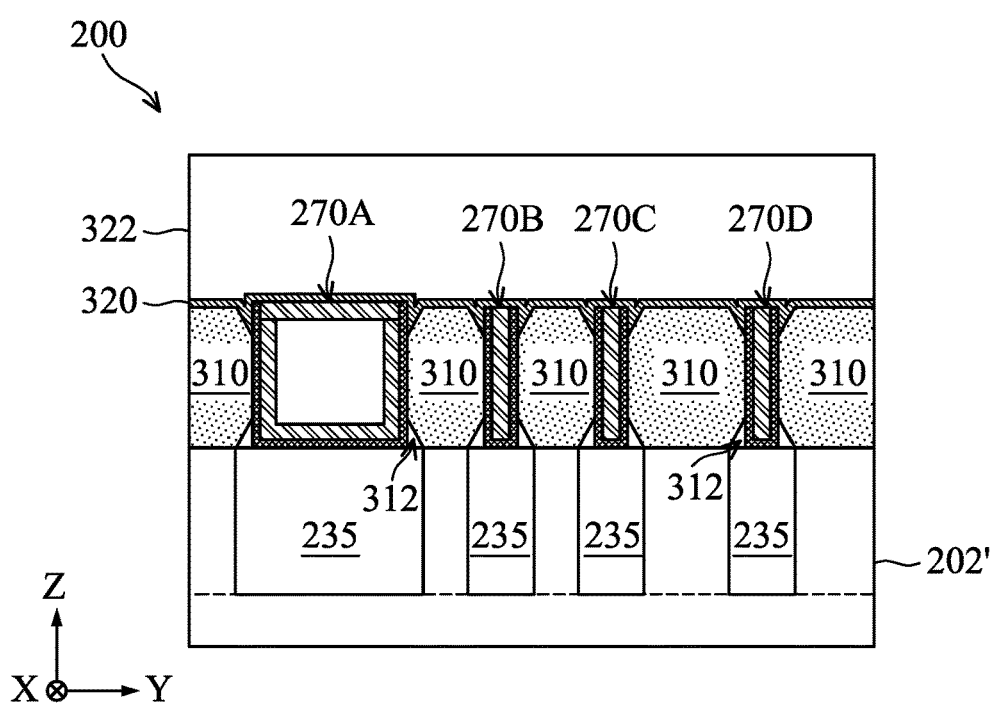
Figure 26C:
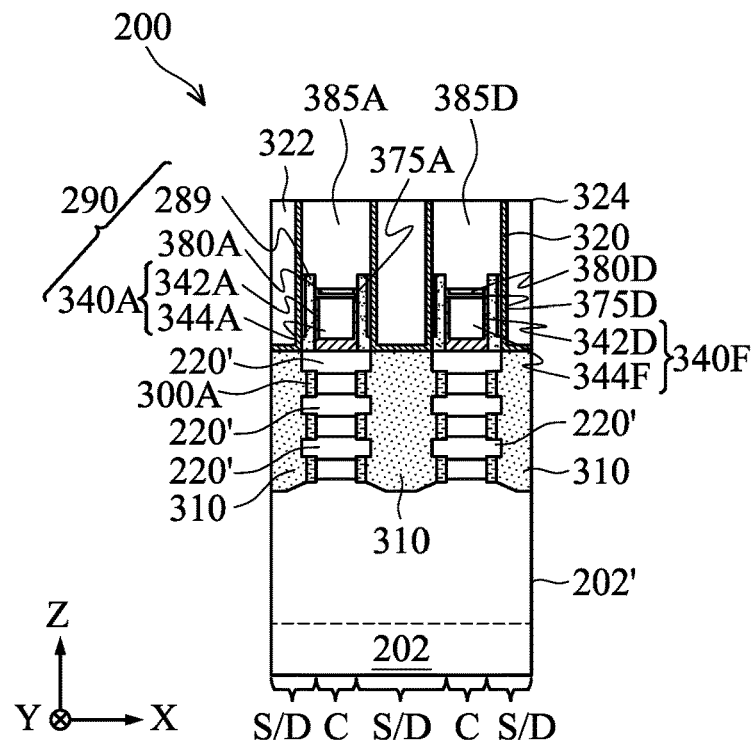
Figure 26D:
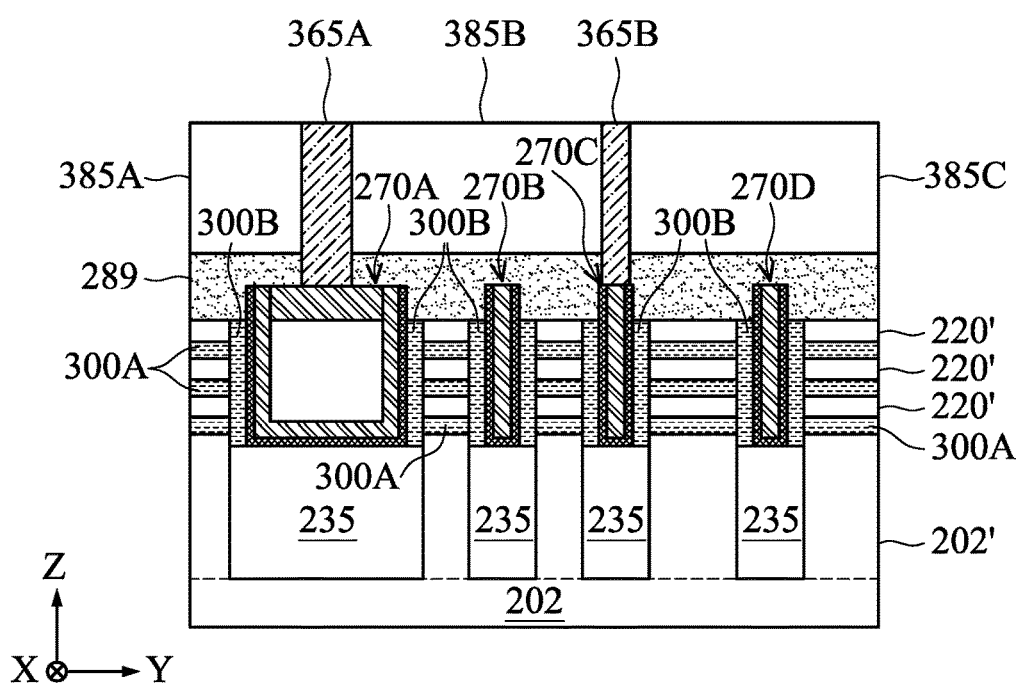
Figure 27A:
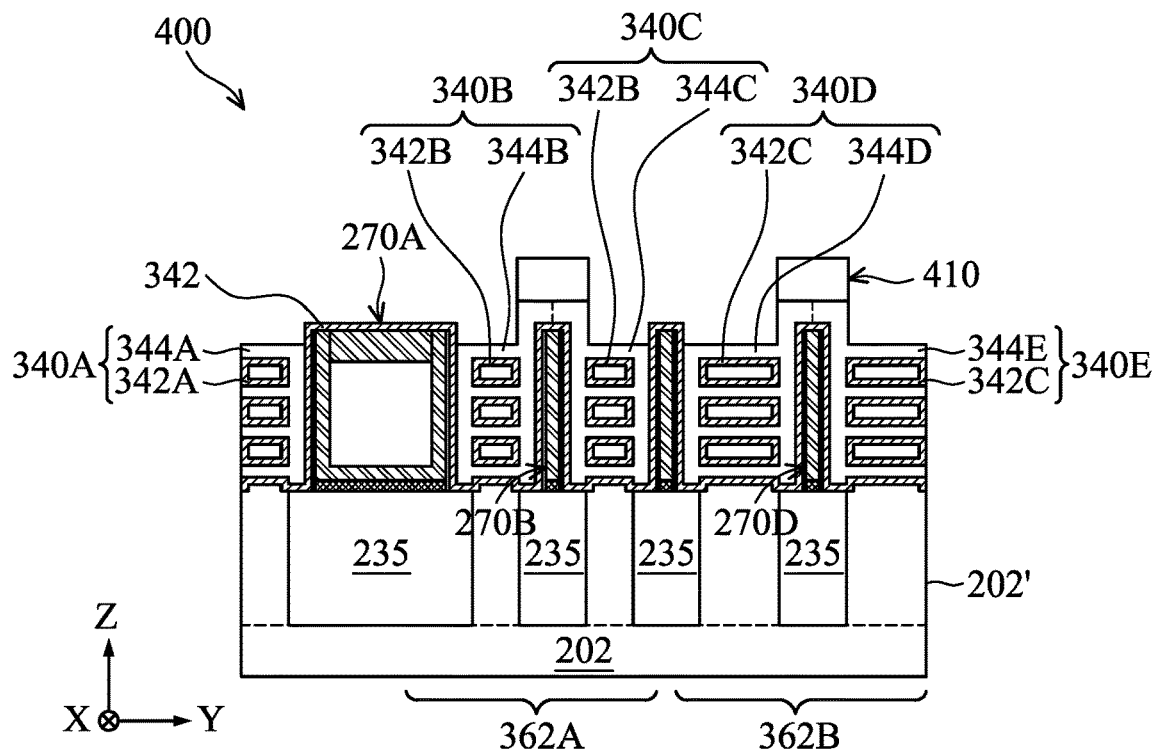
FIGS. 27A-27D, and FIGS. 28A-28D are fragmentary perspective views of another multigate device, in portion or entirety, at various fabrication stages (such as those associated with the method in FIG. 1) according to various aspects of the present disclosure.
Figure 27B:
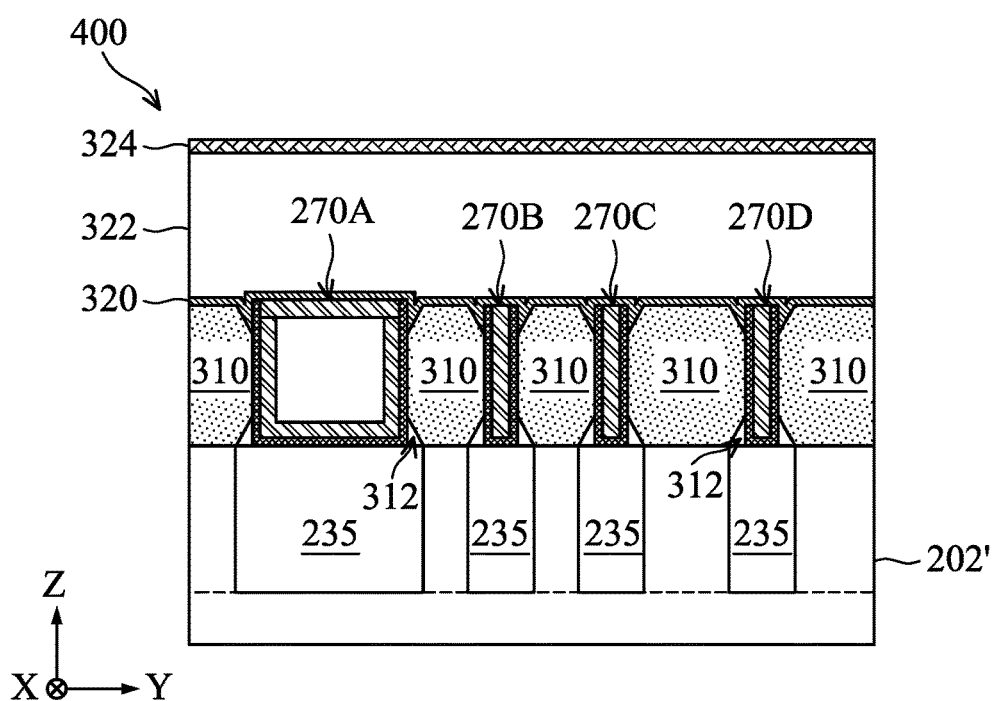
Figure 27C:
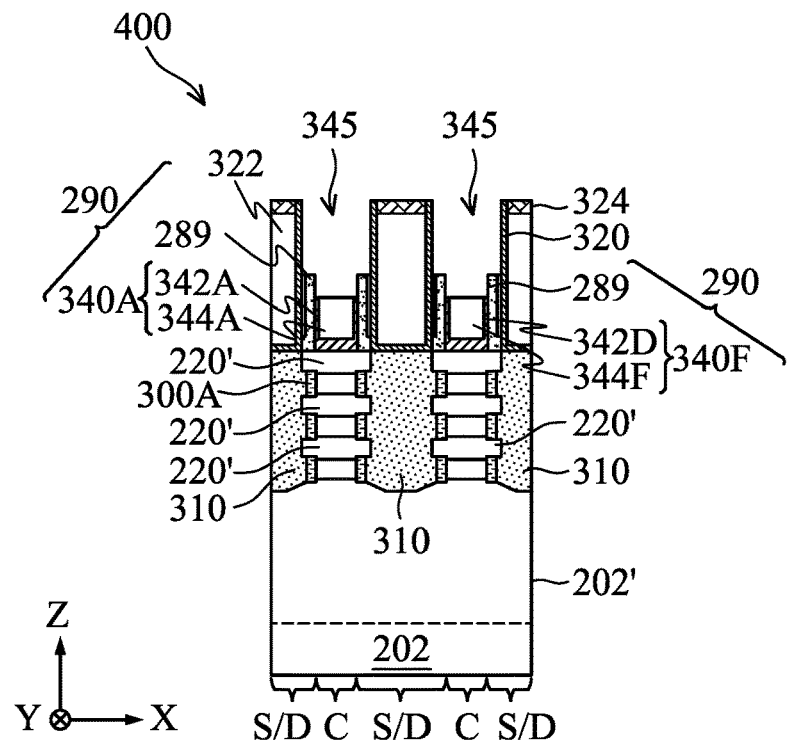
Figure 27D:
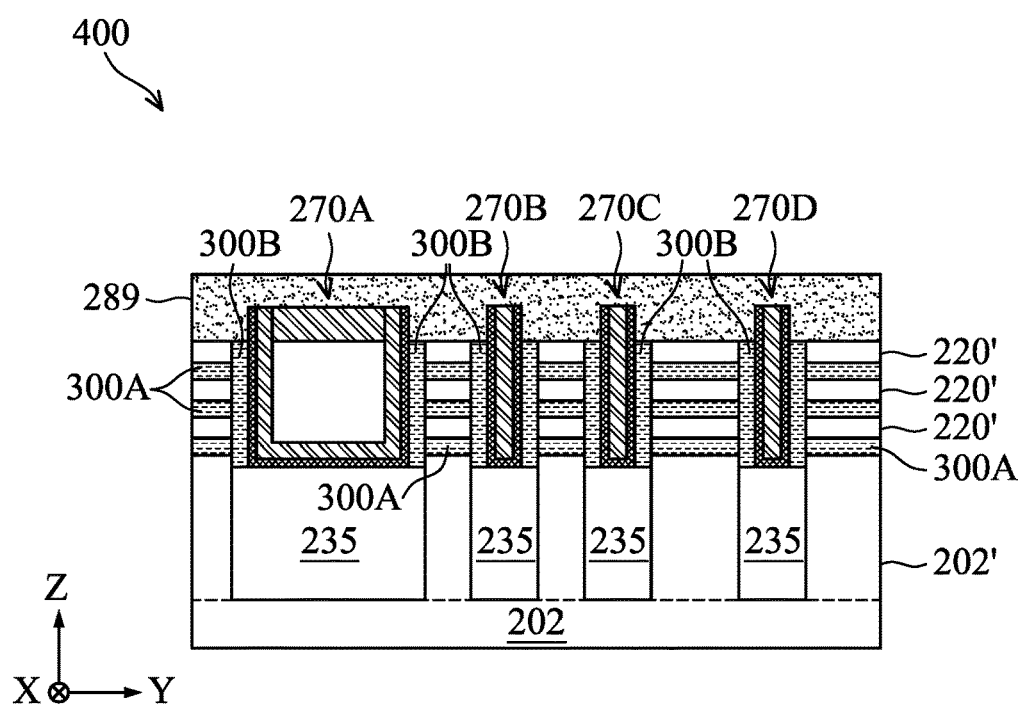
Figure 28A:
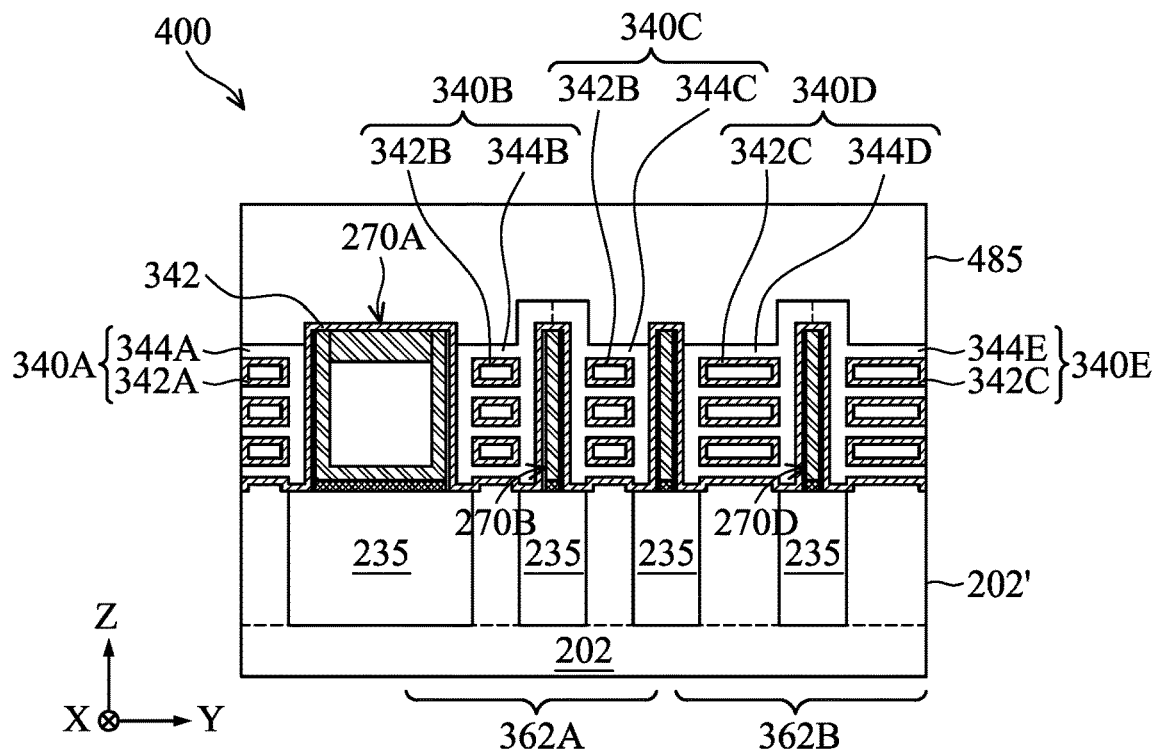
Figure 28B:
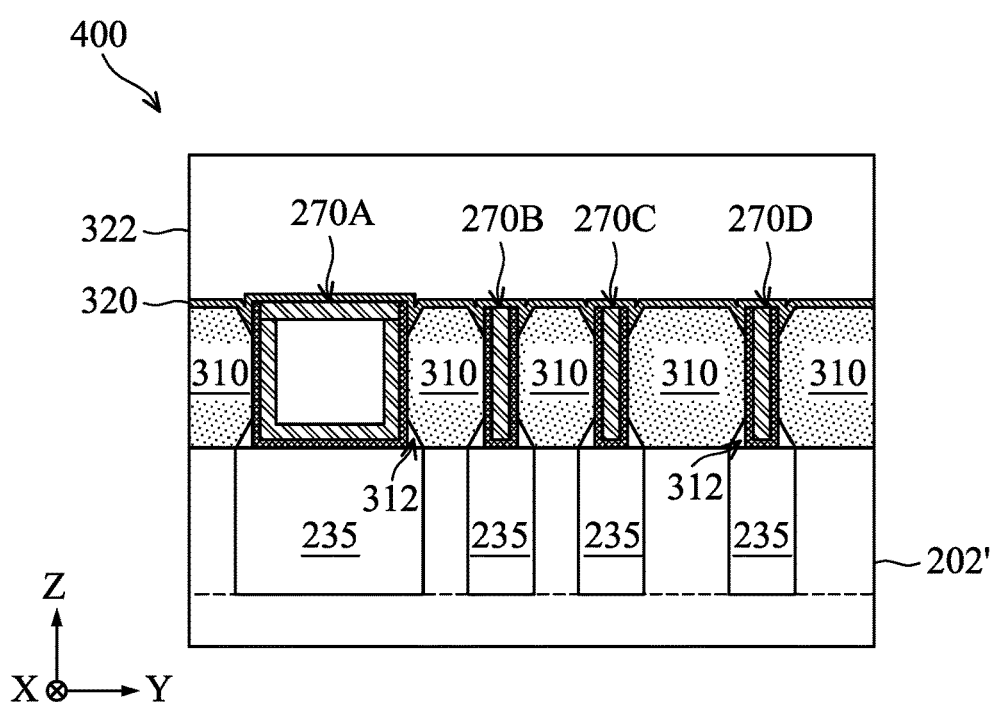
Figure 28C:
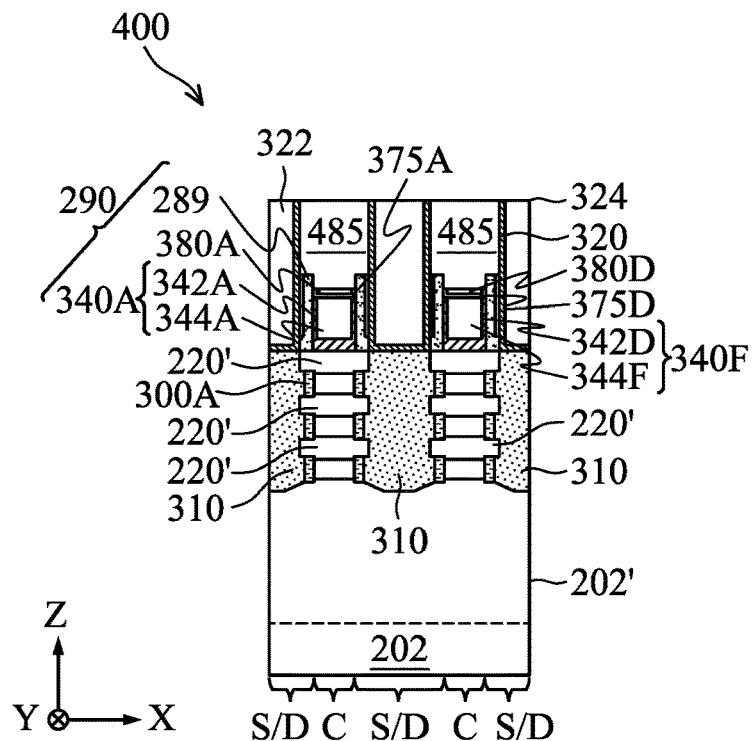
Figure 28D:
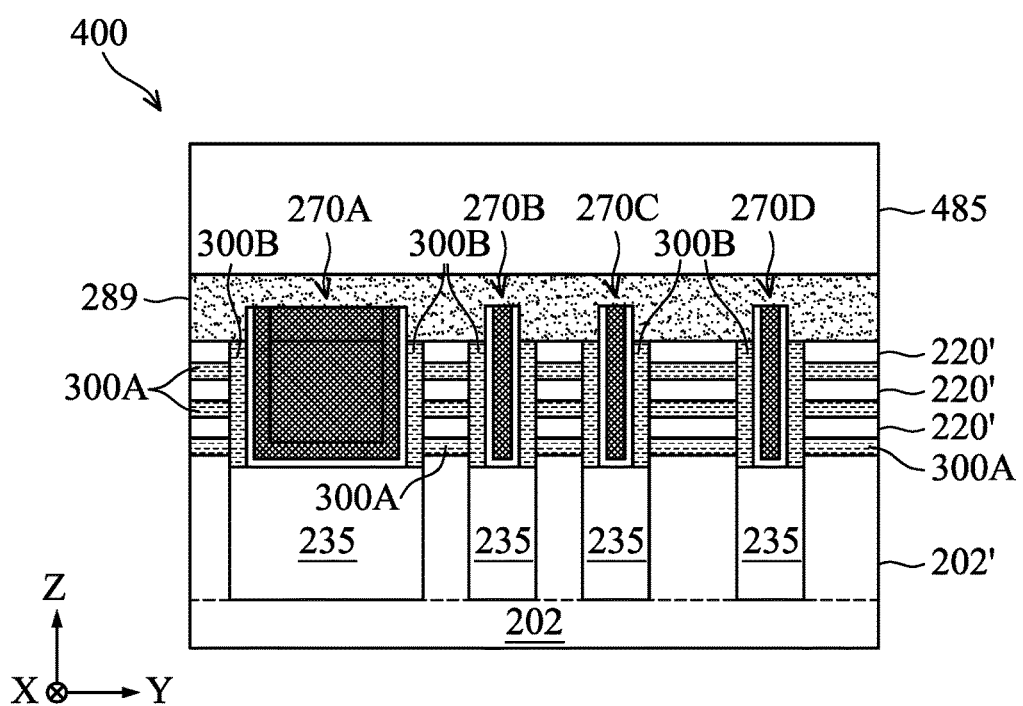

In FIGS. 24A-24D, a patterning process is performed on metal cap seed layer 375 to form a metal cap seed layer 375A, a metal cap seed layer 375B, a metal cap seed layer 375C, a metal cap seed layer 375D in openings 370A-370D, respectively. Metal cap seed layer 375A is disposed on and physically contacts metal gate 340A, such as gate electrode 344A and gate dielectric 342A. Metal cap seed layer 375B is disposed on and physically contacts metal gate 340B and metal gate 340C, such as gate electrode 344B, metal gate electrode 344C, and gate dielectric 342B. Metal cap seed layer 375C is disposed on and physically contacts metal gate 340D and metal gate 340E, such as gate electrode 344D, metal gate electrode 344E, and gate dielectric 342C. Metal cap seed layer 375B and metal cap seed layer 375C span metal connection area 362A and metal connection area 362B, respectively. Metal cap seed layer 375D is disposed on and physically contacts metal gate 340F, such as gate electrode 344F. The patterning process substantially removes portions of metal cap seed layer 375 disposed on dielectric surfaces, such as gate isolation end caps 365A, 365B, ILD protection layer 324, CESL 320, and gate spacers 289. The patterning process may leave small remnants of metal cap seed layer 375 along sidewalls gate spacers 289, such that metal cap seed layers 375A-375D may have u-shaped profiles formed by sidewall portions along gate spacers 289 and bottom portions along metal gates 340A-340F in the fin cut view (FIG. 24C). In some embodiments, thicknesses of the sidewall portions of metal cap seed layers 375A-375D is less than 1 nm. In some embodiments, the patterning process includes depositing a patterning layer over multigate device 200, etching back the patterning layer to expose portions of metal cap seed layer 375 (i.e., a thickness of the patterning layer is less than a height of gate isolation end caps 365A, 365B), etching back the exposed portions of metal cap seed layer 375 (thereby forming metal cap seed layers 375A-375D), and removing the patterning layer. In some embodiments, the patterning layer is a bottom antireflective coating (BARC) layer, such as a silicon oxycarbide layer.

In FIGS. 25A-25D, metal cap layers are formed in openings 370A-370D over metal cap seed layers 375A-375D. For example, a metal cap layer 380A, a metal cap layer 380B, a metal cap layer 380C, and a metal cap layer 380D are deposited over metal cap seed layers 375A-375D, respectively. Metal cap layers 380A-380D have a thickness t11 that is less than a depth of openings 370A-370D, such that metal cap layers 380A-380D partially fill openings 370A-370D. In some embodiments, thickness t11 is about 3 nm to about 10 nm. Metal cap layers 380A-380D includes tungsten, tungsten alloy, ruthenium, ruthenium alloy, cobalt, cobalt alloy, copper, copper alloy, aluminum, aluminum alloy, iridium, iridium alloy, palladium, palladium alloy, platinum, platinum alloy, nickel, nickel alloy, other low resistivity metal constituent and/or alloys thereof, or combinations thereof. Metal cap layers 380A-380D are formed in openings 370A-370D by a bottom-up deposition process, which generally refers to a deposition process that fills an opening from bottom to top (which can also be referred to as a bottom-up fill of an opening). In some embodiments, the bottom-up deposition process is selective CVD, where various parameters of the selective CVD are tuned to selectively grow tungsten, ruthenium, cobalt, or alloys thereof from metal cap seed layers 375A-375D while limiting (or preventing) growth of tungsten, ruthenium, cobalt, or alloys thereof from gate isolation end caps 365A, 365B, CESL 320, and/or ILD protection layer 324. The various parameters include deposition precursors (for example, metal precursors and/or reactants), deposition precursor flow rates, deposition temperature, deposition time, deposition pressure, other suitable deposition parameters, or combinations thereof. In the depicted embodiment, metal cap layers 380A-380D include tungsten, and various parameters of the selective CVD can be tuned to selectively grow polycrystalline tungsten on metal cap layers 375A-375D. In some embodiments, the selective CVD includes flowing a tungsten-containing precursor (for example, $WF_x$ (where x indicates a number of F atoms and x≥1), $WCl_y$ (where y indicates a number of Cl atoms and y≥1), other suitable tungsten-containing gas, or combinations thereof) and a reactant precursor (for example, $H_2$, other suitable reactant gas, or combinations thereof) into a process chamber to form metal cap layers 380A-380D. In the depicted embodiment, metal cap layers 380A-380F include fluorine-free tungsten. In such embodiments, the tungsten-containing precursor can be tungsten pentachloride (e.g., $WCl_5$). In some embodiments, metal cap layers 380A-380D are deposited by another suitable selective deposition process. In some embodiments, metal cap layers 380A-380D are formed by blanket depositing a metal cap material over multigate device 200 and patterning the metal cap material.

In FIGS. 26A-26D, dielectric cap layers are formed in openings 370A-370D over metal cap layers 380A-380D. For example, a dielectric cap layer 385A, a dielectric cap layer 385B, a dielectric cap layer 385C, and a dielectric cap layer 385D are formed over metal cap layers 380A-380D, respectively. Dielectric cap layers 385A-385D fill remainders of openings 370A-370D and can improve lithography process windows (e.g., increase overlay margins) associated with forming source/drain contacts to epitaxial source/drain features 310. In the gate cut view (FIG. 26A) and the gate spacer cut view (FIG. 26B), dielectric cap layers 385A-385D are disposed between and physically contact gate isolation end caps, such as gate isolation end cap 365A and gate isolation end cap 365B. In the fin cut view (FIG. 26C), dielectric cap layers 385A-385D are disposed between and physically contact CESL 320 and gate spacers 289. In some embodiments, such as depicted, widths of dielectric cap layers 385A-385D between CESL 320 are greater than widths of dielectric cap layers 385A-385B between gate spacers 289. Dielectric cap layers 385A-385D include a material that is different than a material of ILD layer 322 to achieve etching selectivity and/or planarization selectivity during subsequent processing. For example, where ILD layer 322 includes a silicon-and-oxygen comprising material, dielectric cap layers 385A-385D can include a silicon-and-nitrogen comprising material, such as silicon nitride or silicon carbonitride. In some embodiments, dielectric cap layers 385A-385D include silicon, silicon carbide, silicon oxycarbonitride, silicon oxycarbide, or other suitable material, or combinations thereof. In some embodiments, dielectric cap layer 385A-385D include a metal-and-oxygen comprising material, such as aluminum oxide (e.g., $Al_2O_3$), zirconium oxide ($ZrO_2$), other metal oxide, or combinations thereof. In some embodiments, a deposition process and a planarization process are performed to form dielectric capping layers 385A-385D over metal cap layers 380A-380D. For example, fabrication proceeds with depositing a dielectric cap material over multigate device 200 that fills remainders of openings 370A-370D and performing a planarization process (e.g., CMP) on the dielectric cap material until reaching and exposing ILD layer 322, which function as a planarization stop layer. The planarization process thus removes ILD protection layer 324 from over multigate device 200. The dielectric capping material can be formed by CVD, PVD, ALD, HDPCVD, MOCVD, RPCVD, PECVD, LPCVD, ALCVD, APCVD, other suitable methods (e.g., spin coating), or combinations thereof.

In FIGS. 26A-26D, multigate device 200 includes various transistors, such as a first transistor having metal gate 340A (which includes gate dielectric 342A and gate electrode 344A), a second transistor having metal gate 340B (which includes respective portions of gate dielectric 342B and gate electrode 344B), a third transistor having metal gate 340C (which includes respective portions of gate dielectric 342B and gate electrode 344C), a fourth transistor having metal gate 340D (which includes respective portions of gate dielectric 342C and gate electrode 344D), a fifth transistor having metal gate 340E (which includes respective portions of gate dielectric 342C and gate electrode 344E), and a sixth transistor having metal gate 340F (which includes gate dielectric 342D and gate electrode 344F). The first, second, third, fourth, fifth, and sixth transistor also each have respective epitaxial source/drain features 310, where metal gates 340A-340F of the first, second, third, fourth, fifth, and sixth transistors wrap respective channel layers 220' disposed between respective epitaxial source/drain features 310. Since metal gates 340A-340F completely surround their respective channel layers 220' in FIGS. 26A-26D, the first, second, third, fourth, fifth, and sixth transistors can be referred to as GAA transistors. In the depicted embodiment, metal gates 340A-340F cover four sides of their respective channel layers 220'. The present disclosure contemplates embodiments where metal gates 340A-340F cover more or less than four sides of their respective channel layers 220' depending on a configuration of channel layers 220' and/or multigate device 200. The first, second, third, fourth, fifth, and sixth transistors can be any combination of n-type transistors and p-type transistors depending on design considerations of multigate device 200.

Gate isolation fins 270A-270D and/or gate isolation end caps 365A, 365B separate and isolate metal gates 340A-340F of multigate device 200. For example, gate isolation fin 270A and gate isolation end cap 365A separate and isolate metal gate 340A of the first transistor from metal gate 340B of the second transistor, gate isolation fin 270B separates and isolates metal gate 340B of the second transistor from metal gate 340C of the third transistor, gate isolation fin 270C and gate isolation end cap 365B separate and isolate metal gate 340C of the third transistor from metal gate 340D of the fourth transistor, and gate isolation fin 270D separates and isolates metal gate 340D of the fourth transistor from metal gate 340E of the fifth transistor. As described above, gate isolation fins 270A-270D have heights that are greater than heights of channel layers 220', gate isolation fins 270A-270D have different configurations depending on spacing between active regions, and gate isolation fins 270A-270D each include at least a first dielectric layer (e.g., dielectric liners 260A-260D) and a second dielectric layer (e.g., dielectric liners 262A-262D) disposed over the first dielectric layer, where a dielectric constant of the first dielectric layer is greater than a dielectric constant of the second dielectric layer. Gate isolation fin 270A-270D, which is formed in an area of multigate device 200 having a larger spacing between active regions, further includes a third dielectric layer disposed over the second dielectric layer (e.g., oxide layer 264A) and a fourth dielectric layer disposed over the third dielectric layer (e.g., dielectric capping layer 266). Because thicknesses of the first dielectric layer along sidewalls of gate isolation fins 270A-270D are reduced to enlarge a metal gate fill window during gate replacement (i.e., when dummy gate stacks 280 are replaced with metal gates 340A-340F), gate isolation fins 270A-270D are configured differently in channel regions and source/drain regions of multigate device. For example, a thickness of the first dielectric layer of gate isolation fins 270A-270D in the channel regions is less than a thickness of the first dielectric layer of gate isolation fins 270A-270D in source/drain regions.

In furtherance of the example, gate isolation end cap 365A prevents electrical connection of metal gate 340A of the first transistor with metal gate 340B of the second transistor, and gate isolation end cap 365B prevents electrical connection of metal gate 340C of the third transistor with metal gate 340D of the fourth transistor. In the depicted embodiment, metal gate 340B of the second transistor and metal gate 340C of the third transistor share gate dielectric 342B, metal gate 340B of the second transistor is electrically connected to metal gate 340C of the third transistor by a metal capping layer (i.e., metal cap seed layer 375B and metal cap layer 380B), metal gate 340D of the fourth transistor and metal gate 340E of the fifth transistor share gate dielectric 342C, and metal gate 340D of the fourth transistor is electrically connected to metal gate 340E of the fifth transistor by a metal capping layer (i.e., metal cap seed layer 375C and metal cap layer 380C). In some embodiments, the second transistor and the third transistor can form a CMOS transistor, where the second transistor is an n-type transistor and the third transistor is a p-type transistor, or vice versa. In some embodiments, the fourth transistor and the fifth transistor can form a CMOS transistor, where the fourth transistor is an n-type transistor and the fifth transistor is a p-type transistor, or vice versa.

In some embodiments, instead of performing a self-aligned metal gate cut process as described with reference to FIGS. 18A-18D, a metal gate cut process uses lithography to define metal gates 340A-340F and metal connection areas 362A, 362B. In such embodiments, processing associated with forming gate isolation end caps 365A, 365B and metal capping layers (i.e., metal cap seed layers 375A-375D and metal cap layers 380A-380D) is omitted because metal gates 340A-340F are electrically connected, as needed, by gate electrodes 344A-344F instead of metal capping layers. For example, FIGS. 27A-27D and FIGS. 28A-28D are fragmentary perspective views of a multigate device 400, in portion or entirety, at various fabrication stages according to such embodiments. For clarity and simplicity, similar features of multigate device 400 and multigate device 200 described above are identified by the same reference numerals. FIGS. 27A-27D and FIGS. 28A-28D have been simplified for the sake of clarity to better understand the inventive concepts of the present disclosure. Additional features can be added in multigate device 400, and some of the features described below can be replaced, modified, or eliminated in other embodiments of multigate device 400.

Multigate device 400 has undergone processing similar to multigate device 200, such as that described with reference to FIGS. 2-9, FIGS. 10A-10D, FIGS. 11A-11D, FIGS. 12A-12D, FIGS. 13A-13D, FIGS. 14A-14D, FIGS. 15A-15D, FIGS. 16A-16D, and FIGS. 17A-17D. In contrast to fabrication of multigate device 200, in FIGS. 27A-27D, processing proceeds with a metal gate cut process that includes performing a lithography process, such as described herein, to form a patterned mask layer 410 over gate electrode 344 and performing an etch back process using patterned mask layer 410 as an etch mask to form gate electrodes 344A-344F. The etch back process can be similar to the etch back process described above with reference to FIGS. 18A-18D, except patterned mask layer 410 covers portions of gate electrode 344 that are disposed over gate isolation fins in metal connection areas (i.e., areas where metal gates will be electrically connected to one another), such as gate isolation fin 270B in metal connection area 362A and gate isolation fin 270D in metal gate connection area 362B, during the etch back process. In FIGS. 27A-27D, the etch back process removes portions of gate electrode 344 that are disposed over top surfaces of gate isolation fin 270A and gate isolation fin 270C, but not portions of gate electrode 344 that are disposed over top surfaces of gate isolation fin 270B and gate isolation fin 270D. Accordingly, after the etch back process gate electrode 344 still extends uninterrupted in metal connection areas 362A, 362B. For example, gate electrode 344B of metal gate 340B is physically connected to gate electrode 344C of metal gate 340C, and gate electrode 344D of metal gate 340D physically connected to gate electrode 344E of metal gate 340E. Though metal gate 340B is connected to metal gate 340C, a number, configuration, and/or materials of layers of gate electrode 344B corresponding with metal gate 340B may be different than a number, configuration, and/or materials of layers of gate electrode 344C corresponding with metal gate 340C, such as where metal gate 340B and metal gate 340C belong to different types of transistors. Further, though metal gate 340D is connected to metal gate 340E, a number, configuration, and/or materials of layers of gate electrode 344D corresponding with metal gate 340D may be different than a number, configuration, and/or materials of layers of gate electrode 344E corresponding with metal gate 340E, such as where metal gate 340D and metal gate 340E belong to different types of transistors.

The etch back process further recesses exposed portions of gate electrode 344 below top surfaces of gate isolation fins 270A-270D, such that metal gates in metal connection areas (e.g., metal gates 340B-340E) have first portions having top surfaces that are higher than top surfaces of gate isolation fins 270A-270D and second portions having top surfaces that are lower than top surfaces of gate isolation fins 270A-270D. In some embodiments, a first height difference can be defined between the first portions of metal gates 340B-340E and top surfaces of gate isolation fins 270A-270D and a second height difference can be defined between the second portions of metal gates 340B-340E and top surfaces of gate isolation fins 270A-270D. The first height difference and the second height difference can be the same or different. In some embodiments, such as depicted, gate isolation fin 270B and gate isolation fin 270D have top portions wrapped by gate electrode 344. The etch back process also removes portions of gate electrode 344 and gate dielectric 342 that are disposed over ILD protection layer 324, but not portions of gate dielectric 342 disposed over top surfaces of gate isolation fin 270A and gate isolation fin 270C. In such embodiments, gate dielectric 342 extends without interruption from metal gate 340A to metal gate 340E in multigate device 400, and metal gates 340A-340E share a gate dielectric. In some embodiments, the etch back process removes portions of gate dielectric 342 disposed over gate isolation fin 270A and gate isolation fin 270C, thereby forming separate gate dielectrics for metal gates 340A-340E, such as gate dielectric 342A, gate dielectric 342B, gate dielectric 342C, and gate dielectric 342D as described above.

Then, in FIGS. 28A-28D, fabrication can proceed with removing patterned mask layer 410 and forming a dielectric cap layer 485 over multigate device 400. In contrast to multigate device 200, multigate device 400 has a single dielectric cap layer, dielectric cap layer 485, that extends over and physically contacts metal gates 340A-340D and gate isolation fins 270A-270D. Dielectric cap layer 485 also extends below top surfaces of gate isolation fins 270A-270D and top surfaces of first portions of metal gates 240B-340E. Dielectric cap layer 485 includes materials similar to and is fabricated similar to dielectric cap layers 385A-385D as described above with reference to FIGS. 26A-26D.

Figure 29:
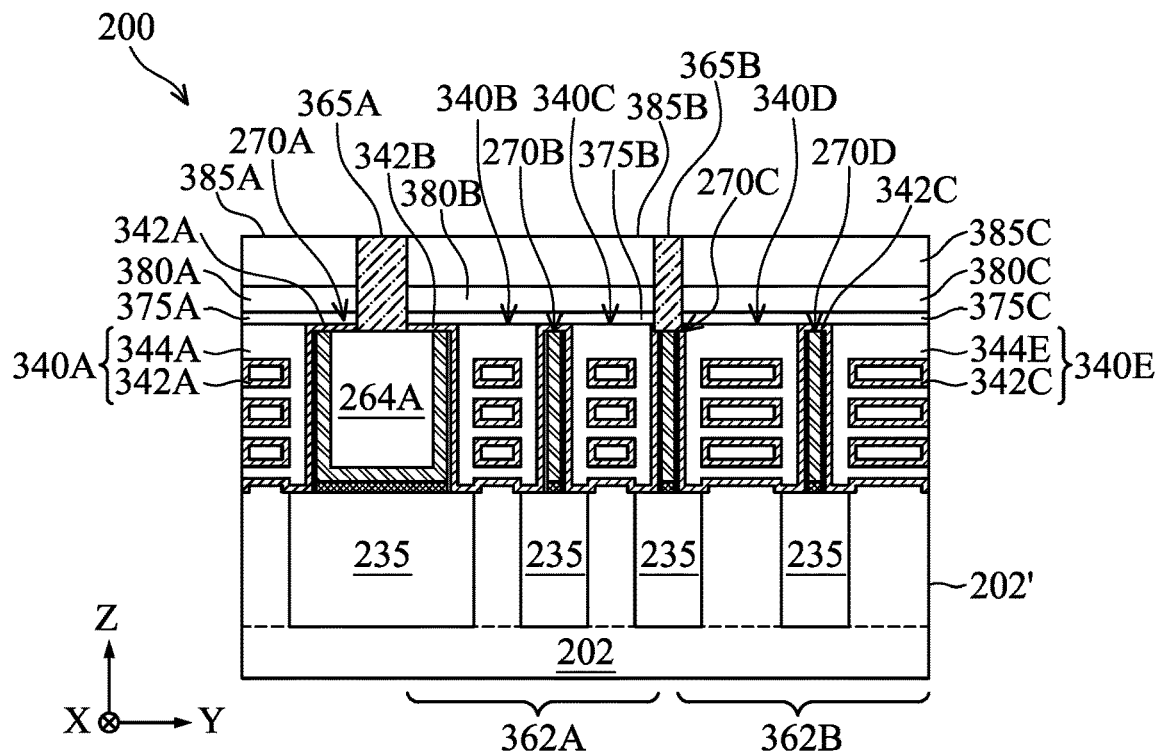
FIGS. 29-35 are fragmentary perspective views of multigate devices, in portion or entirety, at various fabrication stages (such as those associated with the method in FIG. 1) according to various aspects of the present disclosure.
Figure 30:
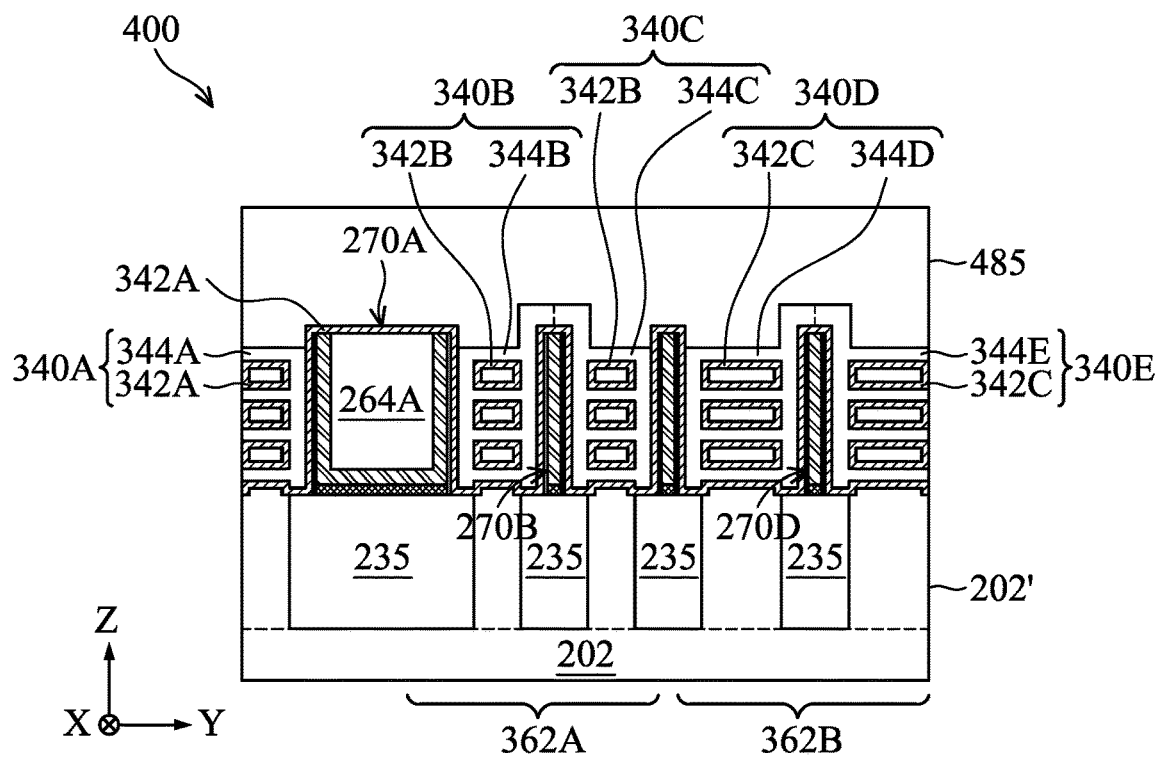

In some embodiments, processing associated with FIG. 8 is omitted from fabrication of multigate device 200 and multigate device 400 and a portion of oxide layer 264A is not replaced with dielectric capping layer 266. For example, FIG. 29 and FIG. 30 are fragmentary perspective views of multigate device 200 and multigate device 400, respectively, according to such embodiments. In FIG. 29 and FIG. 30, gate isolation fin 270 includes only dielectric liner 260A, dielectric liner 262A, and oxide layer 264A. In FIG. 29, gate isolation end cap 365A physically contacts oxide layer 264A. In FIG. 30, gate dielectric 342 physically contacts oxide layer 264A. FIG. 29 and FIG. 30 have been simplified for the sake of clarity to better understand the inventive concepts of the present disclosure.

Figure 31:
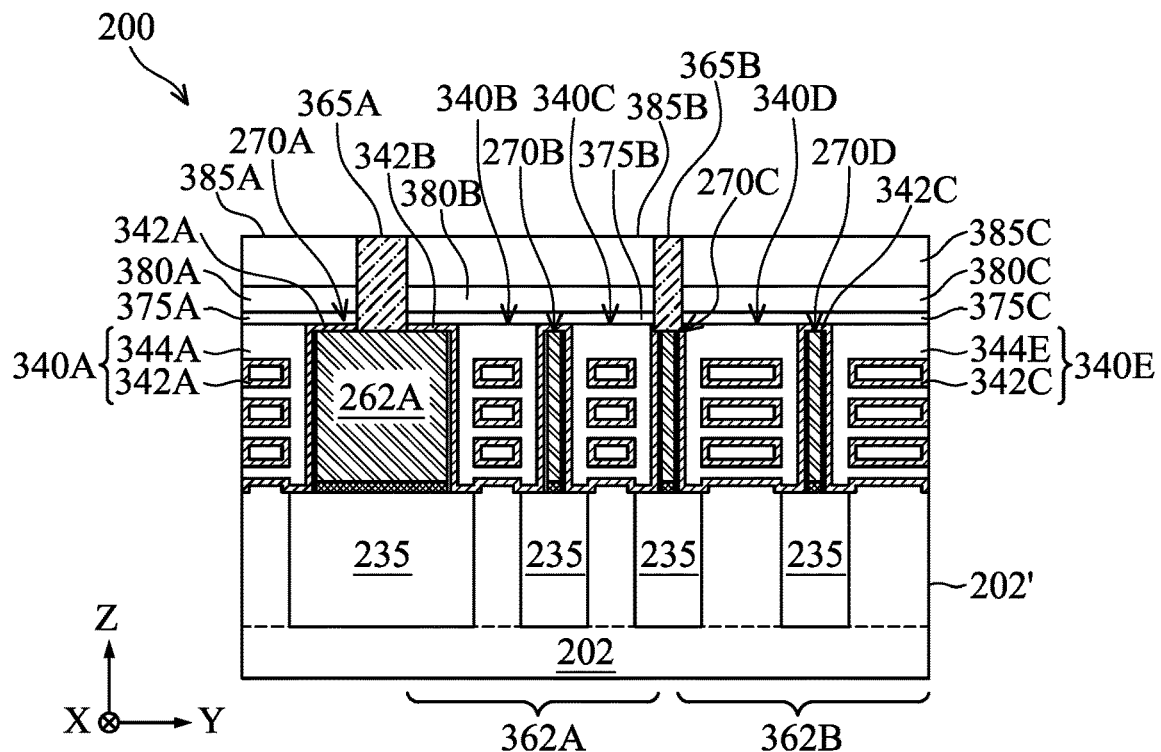
Figure 32:
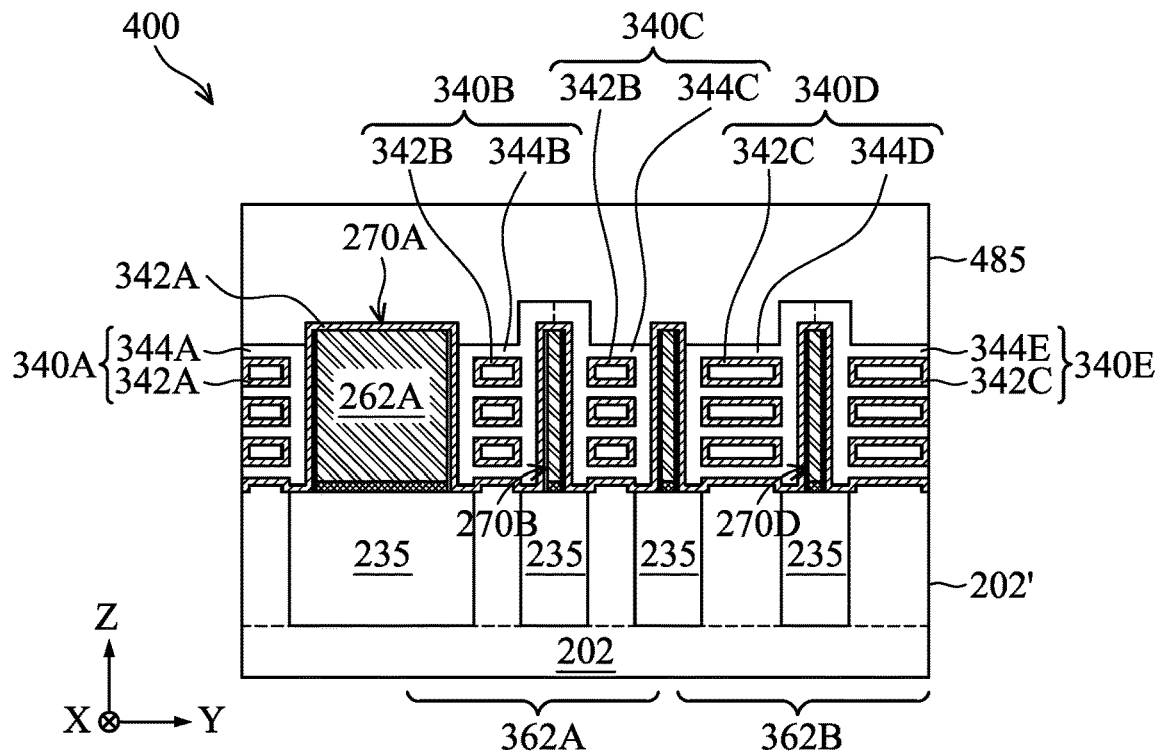

In some embodiments, processing associated with depositing and planarizing oxide layer 264 as described with reference to FIG. 6 is omitted from fabrication of multigate device 200 and multigate device 400. Instead, at FIG. 6, dielectric liner 262 is deposited over dielectric liner 260 and fills the remainder of upper portion of trench 230A and remainders of upper portions of trenches 230B-230D. For example, FIG. 31 and FIG. 32 are fragmentary perspective views of multigate device 200 and multigate device 400, respectively, according to such embodiments. In FIG. 31 and FIG. 32, gate isolation fins 270A-270D have the same layers (i.e., gate isolation fins 270A-270D include only dielectric liners 260A-260D, respectively, and dielectric liners 262A-262D, respectively) but different configurations (i.e., gate isolation fin 270A is wider than gate isolation fins 270B-270D). FIG. 31 and FIG. 32 have been simplified for the sake of clarity to better understand the inventive concepts of the present disclosure.

Figure 16A:
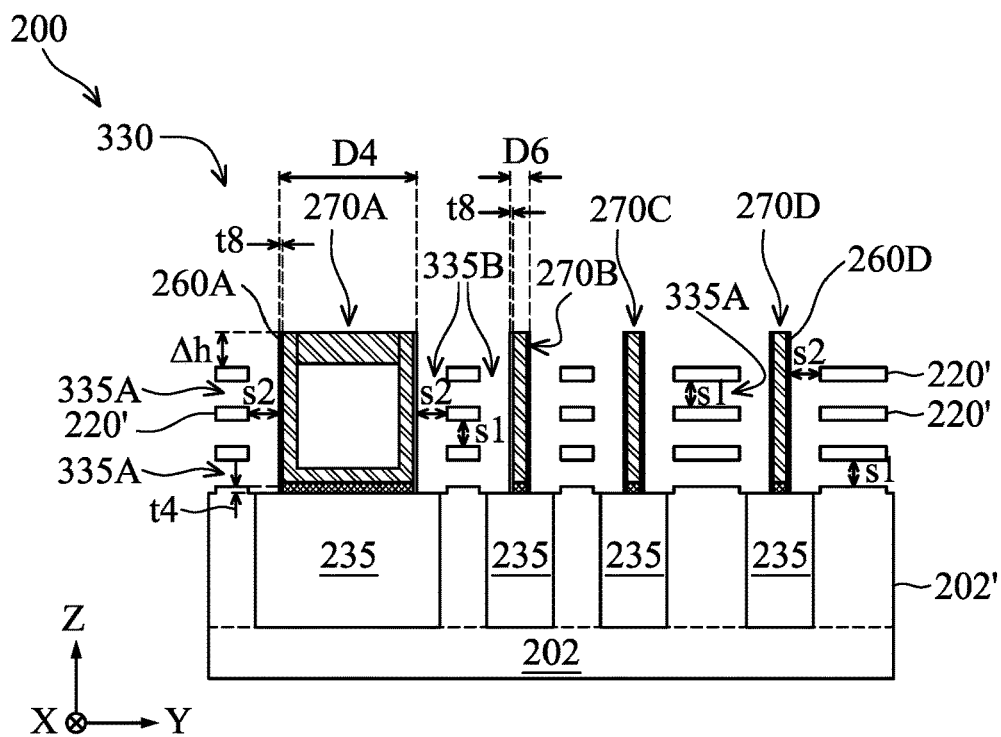
Figure 16B:
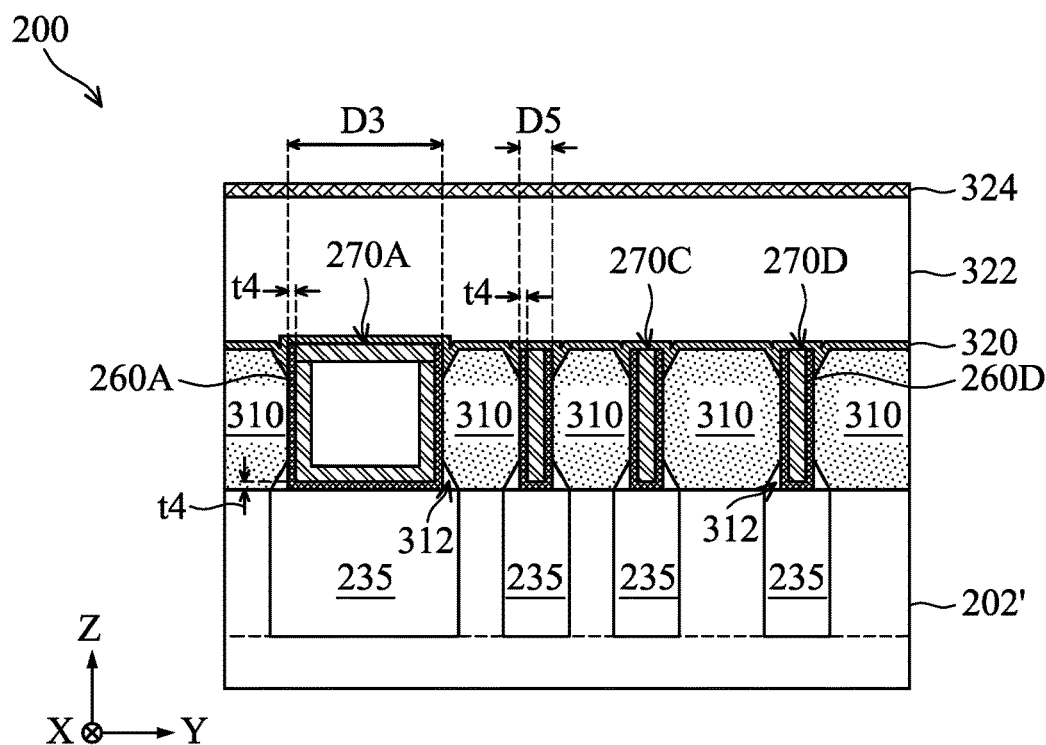
Figure 16C:
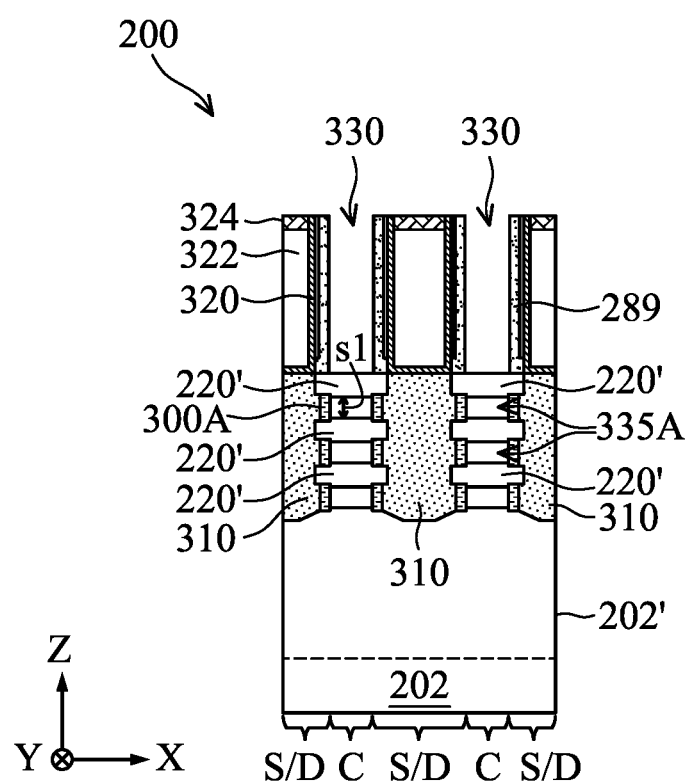
Figure 33:
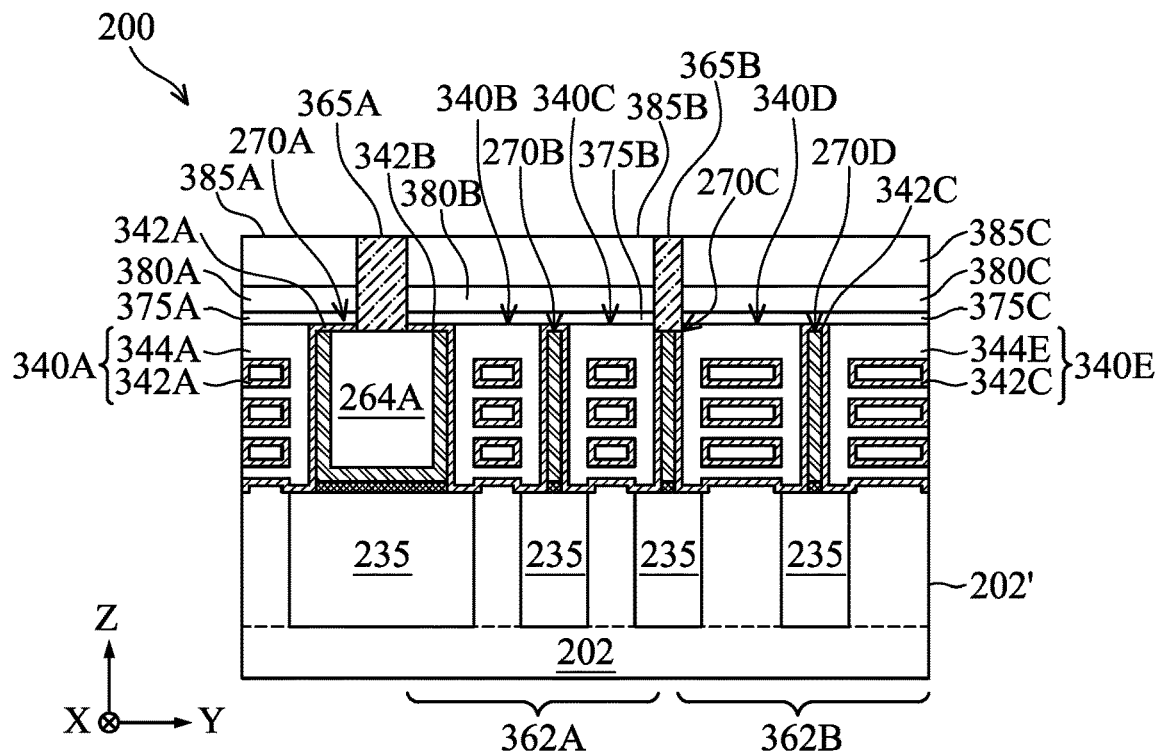
Figure 34:
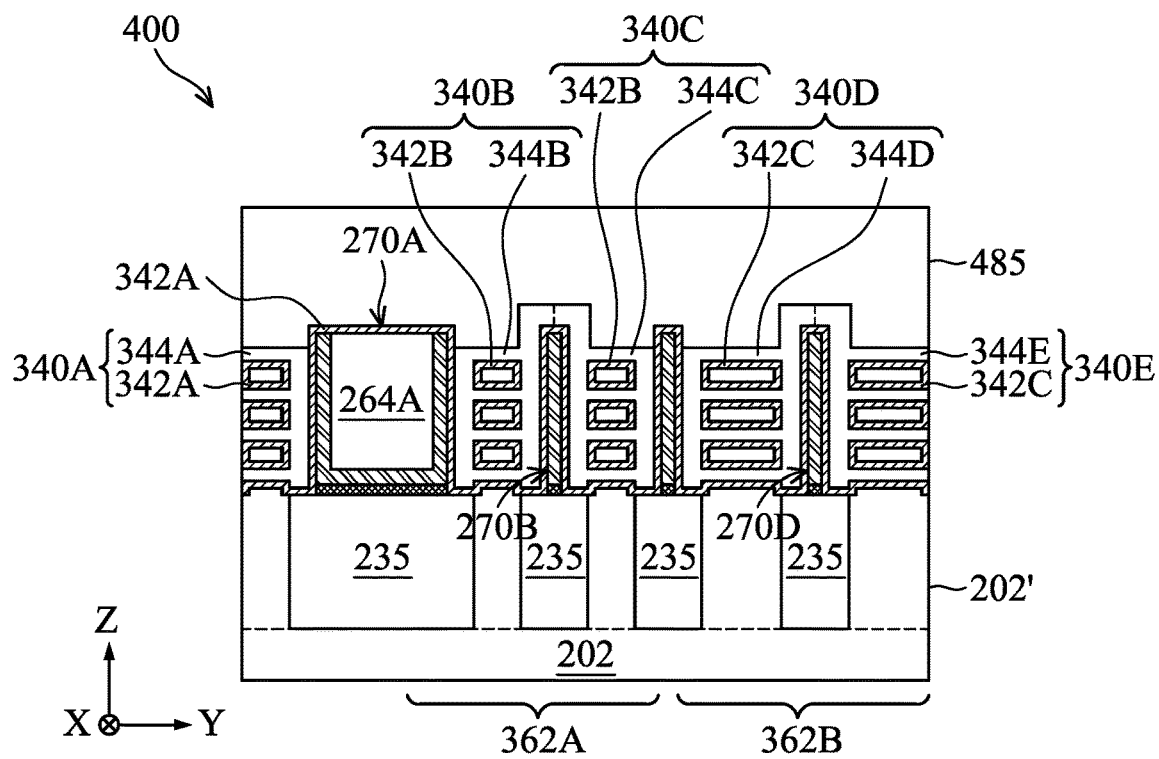

In some embodiments, dielectric liners 260A-260D are completely removed from sidewalls of gate isolation fins 270A-270D by the trimming process during processing associated with FIGS. 16A-16C. In such embodiments, in channel regions of multigate device 200 and multigate device 400, gate isolation fins 270A-270D have dielectric liners 260A-260D only between and separating top surfaces of isolation features 235 from dielectric liners 262A-262D, while in source/drain regions of multigate device 200 and multigate device 400, dielectric liners 260A-260D remain along sidewalls and bottoms of gate isolation fins 270A-270D. FIG. 33 and FIG. 34 are fragmentary perspective views of multigate device 200 and multigate device 400, respectively, according to such embodiments. For example, in FIG. 33 and FIG. 34, gate dielectrics 342A-342D physically contact dielectric liners 262A-262D of gate isolation fins 270A-270D in channel regions. FIG. 33 and FIG. 34 have been simplified for the sake of clarity to better understand the inventive concepts of the present disclosure.

Figure 35:
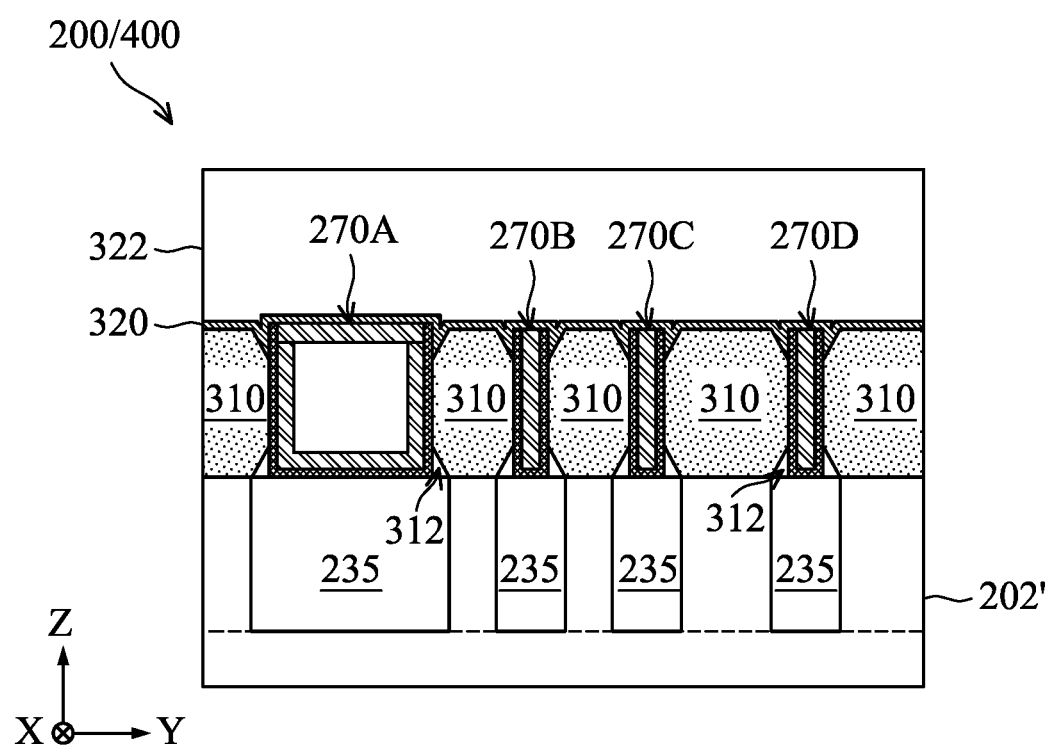

In some embodiments, the etching processes associated with forming gate spacers 289 and/or source/drain recesses 295 completely consume dielectric capping layer 266 of gate isolation fin 270A. In such embodiments, gate isolation fin 270A does not include dielectric capping layer 266 in source/drain regions of multigate device 200 and multigate device 400. FIG. 35 is a fragmentary perspective view of multigate device 200 or multigate device 400 according to such embodiments. For example, in FIG. 35, CESL 320 physically contacts dielectric liner 260A, dielectric liner 262A, and oxide layer 264A of gate isolation fin 270A in source/drain regions. In some embodiments, a top surface of oxide layer 264A is substantially planar with topmost surfaces of dielectric liners 262A-262D and topmost surfaces of dielectric liners 260A-260D in source/drain regions. FIG. 35 has been simplified for the sake of clarity to better understand the inventive concepts of the present disclosure.

Fabrication can further includes forming gate contacts, forming source/drain contacts, and/or forming a multilayer interconnect (MLI) feature, all of which can facilitate operation of transistors of multigate device 200 and/or multigate device 400. In some embodiments, ILD layer 320 and CESL 322 form a bottommost layer of an MLI feature (e.g., ILD0). The MLI feature electrically couples various devices (for example, p-type transistors and/or n-type transistors of multigate device 200 and/or multigate device 400, resistors, capacitors, and/or inductors) and/or components (for example, gate electrodes and/or epitaxial source/drain features of p-type transistors and/or n-type transistors of multigate device 200 and/or multigate device 400), such that the various devices and/or components can operate as specified by design requirements of multigate device 200 and/or multigate device 400. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or multigate device 400 and/or distribute signals (for example, clock signals, voltage signals, and/or ground signals) to the devices and/or the components of multigate device 200 and/or multigate device 400.

The various etching processes described herein include dry etching processes, wet etching processes, or combinations thereof. The dry etching processes may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. The dry etching processes can use a carrier gas to deliver the etch gas. The carrier gas can include nitrogen, argon, helium, xenon, other suitable carrier gas constituent, or combinations thereof. The wet etching processes may implement a wet etchant solution that includes $H_2SO_4$, $H_2O_2$, $NH_4OH$, HCl, HF, DHF, KOH, $NH_3$, $CH_3COOH$, $HNO_3$, $H_3PO_4$, $H_2O$ (which can be DIW or $DIWO_3$), $O_3$, other suitable chemicals, or combinations thereof. During each etching process, various etch parameters can be tuned to achieve desired selective etching, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. Further, the various etching processes described herein can include multiple steps.

Gate cutting techniques disclosed herein form gate isolation fins to isolate metal gates of multigate devices from one another before forming the multigate devices, and in particular, before forming the metal gates of the multigate devices. From the foregoing description, it can be seen that multigate devices described in the present disclosure offer advantages over conventional multigate devices. It is understood, however, that other embodiments may offer additional advantages, and not all advantages are necessarily disclosed herein, and that no particular advantage is required for all embodiments. The present disclosure provides for many different embodiments. An exemplary device includes a first multigate device having first source/drain features and a first metal gate that surrounds a first channel layer and a second multigate device having second source/drain features and a second metal gate that surrounds a second channel layer. The first channel layer is disposed between the first source/drain features, and the second channel layer is disposed between second source/drain features. A gate isolation fin, which separates the first metal gate and the second metal gate, includes a first dielectric layer having a first dielectric constant and a second dielectric layer having a second dielectric constant disposed over the first dielectric layer. The second dielectric constant is less than the first dielectric constant. In some embodiments, the first dielectric constant is greater than or equal to about seven and the second dielectric constant is less than or equal to about seven.

A gate isolation end cap may be disposed on the gate isolation fin to provide additional isolation. In some embodiments, the device further includes a first metal cap layer disposed over the first metal gate, a second metal cap layer disposed over the second metal gate, and a gate isolation end cap disposed over the gate isolation fin. The gate isolation end cap is disposed between and separates the first metal cap layer and the second metal cap layer. In some embodiments, a first width of the gate isolation end cap is less than a second width of the gate isolation fin. In some embodiments, the gate isolation fin further includes a third dielectric layer disposed over the second dielectric layer. The third dielectric layer has a third dielectric constant that is less than the first dielectric constant. In some embodiments, the gate isolation fin further includes a fourth dielectric layer disposed over the third dielectric layer. In such embodiments, the second dielectric layer is disposed along first sidewalls of the fourth dielectric layer and second sidewalls of the third dielectric layer, and the fourth dielectric layer has a fourth dielectric constant that is less than the first dielectric constant. In some embodiments, the first dielectric layer has a bottom portion having a first thickness and sidewall portions having a second thickness, where the second thickness is less than the first thickness. In some embodiments, the first dielectric layer separates the first metal gate from a first sidewall portion of the second dielectric layer and separates the second metal gate from a second sidewall portion of the second dielectric layer. In some embodiments, the first dielectric layer physically contacts a bottom portion of the second dielectric layer, the first metal gate physically contacts a first sidewall portion of the second dielectric layer, and the second metal gate physically contacts a second sidewall portion of the second dielectric layer. In some embodiments, a first height is defined between a top surface of the gate isolation fin and a top surface of a substrate, a second height is defined between a top surface of the first channel layer relative to the top surface of the substrate, and the first height is greater than the second height.

Another exemplary device includes an isolation feature disposed over a substrate and a gate isolation fin disposed over the isolation feature. The isolation feature is disposed between a first fin portion and a second fin portion extending from the substrate. The gate isolation fin includes a low-k dielectric layer disposed over a high-k dielectric layer. The device further includes a first multigate device having a first channel layer disposed over the first fin portion, a first metal gate that wraps the first channel layer, and first source/drain features. The first metal gate is disposed between the first channel layer and the first fin portion. The device further includes a second multigate device having a second channel layer disposed over the second fin portion, a second metal gate that wraps the second channel layer, and second source/drain features. The second metal gate is disposed between the second channel layer and the second fin portion. The gate isolation fin separates the first metal gate of the first multigate device from the second metal gate of the second multigate device. In some embodiments, a first width of the isolation feature is greater than a second width of the gate isolation fin. In some embodiments, the low-k dielectric layer is u-shaped, and the high-k dielectric layer is u-shaped.

In some embodiments, the isolation feature is a first isolation feature, the gate isolation fin is a first gate isolation fin, the low-k dielectric layer is a first low-k dielectric layer, and the high-k dielectric layer is a first high-k dielectric layer. In such embodiments, the device can further include a second isolation feature disposed over the substrate and between the second fin portion and a third fin portion extending from the substrate and a second gate isolation fin disposed over the isolation feature. The second gate isolation fin includes a second low-k dielectric layer disposed over a second high-k dielectric layer and an oxide layer disposed over the second low-k dielectric layer. In such embodiments, the device can further include a third multigate device having a third channel layer disposed over the third fin portion, a third metal gate that wraps the third channel layer, and third source/drain features. The third metal gate is disposed between the third channel layer and the third fin portion. The second gate isolation fin separates the second metal gate of the second multigate device from the third metal gate of the third multigate device. In some embodiments, a first spacing is between the first fin portion and the second fin portion, a second spacing is between the second fin portion and the third fin portion, and the second spacing is greater than the first spacing.

In some embodiments, the device further includes a first metal cap layer and a second metal cap. The first metal cap layer is disposed over the first metal gate, the first gate isolation fin, and the second metal gate. The second metal cap layer is disposed over the third metal gate. In some embodiments, a first dielectric cap layer is disposed over the first metal cap layer and a second dielectric cap layer disposed over the second metal cap layer. In some embodiments, a gate isolation end cap is disposed between the first metal cap layer and the second metal cap layer and between the first dielectric cap layer and the second dielectric cap layer. The gate isolation end cap physically contacts the second gate isolation fin.

An exemplary method includes forming an isolation feature in a lower portion of a trench and forming a gate isolation fin over the isolation feature. The gate isolation fin is formed in an upper portion of the trench by depositing a first dielectric layer having a first dielectric constant along a bottom and sidewalls of the upper portion of the trench, depositing a second dielectric layer in the upper portion of the trench over the first dielectric layer, and performing a planarization process on the first dielectric layer and the second dielectric layer. The second dielectric layer has a second dielectric constant that is less than the first dielectric constant. The method further includes, after forming the gate isolation fin, forming a first multigate device and a second multigate device. The first multigate device has a first channel layer, a first metal gate, and first source/drain features, where the first channel layer is disposed between the first source/drain features and the first metal gate surrounds the first channel layer. The second multigate device has a second channel layer, a second metal gate, and second source/drain features, where the second channel layer is disposed between the second source/drain features and the second metal gate surrounds the second channel layer. The gate isolation fin is disposed between and separates the first metal gate of the first multigate device and the second metal gate of the second multigate device. In some embodiments, the forming the first multigate device having the first channel layer and the second multigate device having the second channel layer includes performing a channel release process. In some embodiments, the method includes trimming the first dielectric layer of the gate isolation fin after performing the channel release process. In some embodiments, the first dielectric layer and the second dielectric layer partially fill the upper portion of the trench. In such embodiments, the forming the gate isolation fin can further include depositing a third dielectric layer having a third dielectric constant over the second dielectric layer and performing the planarization process on the third dielectric layer. The third dielectric layer fills a remainder of the upper portion of the trench. The third dielectric constant is less than the first dielectric constant. In some embodiments, the forming the gate isolation fin can further include etching back the third dielectric layer and forming a fourth dielectric layer over the third dielectric layer, where the fourth dielectric layer has a fourth dielectric constant that is less than the first dielectric constant.

Another exemplary device includes a first multigate device a second multigate device. The first multigate device has a first channel layer disposed between first source/drain features and a first metal gate that surrounds the first channel layer. The second multigate device has a second channel layer disposed between second source/drain features and a second metal gate that surrounds the second channel layer. The device further includes a dielectric gate isolation fin disposed between and separating the first metal gate and the second metal gate. The dielectric gate isolation fin includes a first dielectric layer having a first dielectric constant, a second dielectric layer disposed over the first dielectric layer, and a third dielectric layer disposed over the second dielectric layer. The second dielectric layer has a second dielectric constant that is less than the first dielectric constant. The third dielectric layer has a third dielectric constant that is less than the first dielectric constant. In some embodiments, the third dielectric constant is greater than the second dielectric constant. In some embodiments, a top surface of the dielectric gate isolation fin relative to a top surface of a substrate is higher than a top surface of the first metal gate and a top surface of the second metal gate along a fin length direction.

In some embodiments, the second dielectric layer is disposed over a bottom surface and sidewalls of the third dielectric layer. In some embodiments, the second dielectric layer is further disposed over a top surface of the third dielectric layer. In some embodiments, the first dielectric constant is greater than or equal to about seven and the second dielectric constant is less than or equal to about seven. In some embodiments, the first dielectric layer includes a high-k dielectric material, the second dielectric layer includes a low-k dielectric material, and the third dielectric layer includes an oxide material. In some embodiments, a thickness of the first dielectric layer is about 1 nm to about 7 nm. In some embodiments, a first height is defined between a top surface of the dielectric gate isolation fin and a top surface of a substrate, a second height is defined between a top surface of the first channel layer and a top surface of the second channel layer relative to the top surface of the substrate, and the first height is greater than the second height by about 5 nm to about 25 nm. In some embodiments, the dielectric gate isolation fin is a first dielectric gate isolation fin and the first metal gate further surrounds a third channel layer. In such embodiments, the device can further include a second dielectric gate isolation fin disposed between the first channel layer and the third channel layer. The second dielectric gate isolation fin may be free of the third dielectric layer. The second dielectric gate isolation fin may include the first dielectric layer having the first dielectric constant and the second dielectric layer disposed over the first dielectric layer, where the second dielectric layer has the second dielectric constant that is less than the first dielectric constant. In such embodiments, the first metal gate may extend over a top surface of the second dielectric gate isolation fin. In such embodiments, a top surface of the first dielectric gate isolation fin relative to a top surface of a substrate may be higher than a first portion of a top surface of the first metal gate that is disposed over the first channel layer and the third channel layer and lower than a second portion of the top surface of the first metal gate that is disposed over the second dielectric gate isolation fin.

In some embodiments, the dielectric gate isolation fin is a first dielectric gate isolation fin. In such embodiments, the device can further include a third multigate device having a third channel layer disposed between third source/drain features and a third metal gate that surrounds the third channel layer. In such embodiments, the device can further include a second dielectric gate isolation fin disposed between and separating the first metal gate and the third metal gate. The second dielectric gate isolation fin may be free of the third dielectric layer. The second dielectric gate isolation fin may include the first dielectric layer having the first dielectric constant and the second dielectric layer disposed over the first dielectric layer, where the second dielectric layer has the second dielectric constant that is less than the first dielectric constant. In some embodiments, a first width of the first dielectric gate isolation fin is greater than a second width of the second dielectric gate isolation fin. In some embodiments, a metal layer extends along a gate length direction continuously without interruption over the first metal gate, the second dielectric gate isolation fin, and the third metal gate. In some embodiments, the metal layer further extends along the gate length direction over the first dielectric gate isolation fin and the second metal gate. A dielectric layer may extend through the metal layer to the first dielectric gate isolation fin. In some embodiments, the metal layer includes a tungsten layer. In some embodiments, the metal layer includes a titanium nitride layer. In some embodiments, the metal layer is disposed between first spacers disposed along first sidewalls of the first metal gate and between second spacers disposed along second sidewalls of the third metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an isolation feature in a lower portion of a trench;
   forming a gate isolation fin over the isolation feature, wherein the gate isolation fin is formed in an upper portion of the trench by:
      depositing a first dielectric layer having a first dielectric constant along a bottom and sidewalls of the upper portion of the trench,
      depositing a second dielectric layer in the upper portion of the trench over the first dielectric layer, wherein the second dielectric layer has a second dielectric constant that is less than the first dielectric constant, and
      performing a planarization process on the first dielectric layer and the second dielectric layer; and
   after forming the gate isolation fin, forming a first multigate device and a second multigate device, wherein:
      the first multigate device has a first channel layer, a first metal gate, and first source/drain features, wherein the first channel layer is disposed between the first source/drain features and the first metal gate surrounds the first channel layer,
      the second multigate device has a second channel layer, a second metal gate, and second source/drain features, wherein the second channel layer is disposed between the second source/drain features and the second metal gate surrounds the second channel layer, and
      the gate isolation fin is disposed between and separates the first metal gate of the first multigate device and the second metal gate of the second multigate device, and
   wherein the forming the first multigate device having the first channel layer and the second multigate device having the second channel layer includes performing a channel release process and the method further includes trimming the first dielectric layer of the gate isolation fin after performing the channel release process.

2. The method of claim 1, wherein the first dielectric layer includes metal and oxygen and the second dielectric layer includes silicon.

3. The method of claim 1, wherein the first dielectric layer and the second dielectric layer partially fill the upper portion of the trench and the forming the gate isolation fin further includes:
   depositing a third dielectric layer over the second dielectric layer, wherein the third dielectric layer fills a remainder of the upper portion of the trench and the third dielectric layer has a third dielectric constant that is less than the first dielectric constant; and
   performing the planarization process on the third dielectric layer.

4. The method of claim 3, wherein the forming the gate isolation fin further includes etching back the third dielectric layer and forming a fourth dielectric layer over the third dielectric layer, wherein the fourth dielectric layer has a fourth dielectric constant that is less than the first dielectric constant.

5. The method of claim 1, further comprising:
   forming a semiconductor sacrificial layer in the upper portion of the trench before forming the gate isolation fin; and
   wherein the forming the first multigate device and the second multigate device includes selectively removing the semiconductor sacrificial layer, wherein a portion of the first metal gate and a portion of the second metal gate replace the semiconductor sacrificial layer.

6. The method of claim 1, further comprising forming a gate isolation end cap over the gate isolation fin.

7. The method of claim 1, further comprising performing a fin fabrication process to form a first fin and a second fin extending from a substrate, wherein the trench is formed by the first fin and the second fin.

8. A method comprising:
   forming a first fin and a second fin extending from a substrate, wherein:
      the first fin and the second fin each include a fin portion extending from the substrate and a semiconductor layer stack over the fin portion, wherein the semiconductor layer stack includes first semiconductor layers and second semiconductor layers, and
      a trench is between the first fin and the second fin, wherein the trench has a first sidewall formed by the first fin, a second sidewall formed by the second fin, and a bottom extending between the first sidewall and the second sidewall, wherein the bottom is formed by the substrate;
   forming a first dielectric feature that fills a lower portion of the trench, wherein the first dielectric feature is between the fin portion of the first fin and the fin portion of the second fin;
   forming a sacrificial semiconductor layer and a second dielectric feature that fill an upper portion of the trench, wherein:
      the sacrificial semiconductor layer and the second dielectric feature are between the semiconductor layer stack of the first fin and the semiconductor layer stack of the second fin, and
      the second dielectric feature includes a low-k dielectric layer disposed over a high-k dielectric layer,
   in a first region of the first fin and the second fin, replacing the first semiconductor layers and the sacrificial semiconductor layer with a first gate stack that surrounds the second semiconductor layers of the first fin and a second gate stack that surrounds the second semiconductor layers of the second fin, wherein the second dielectric feature separates the first gate stack and the second gate stack; and
   in a second region of the first fin and the second fin, replacing the first semiconductor layers, the second semiconductor layers, and the sacrificial semiconductor layer with a first epitaxial source/drain over the fin portion of the first fin and a second epitaxial source/drain over the fin portion of the second fin, wherein the second dielectric feature separates the first epitaxial source/drain and the second epitaxial source/drain.

9. The method of claim 8, wherein the forming the first dielectric feature that fills the lower portion of the trench includes:
   depositing an oxide layer that fills the trench;
   performing a planarization process on the oxide layer; and etching back the oxide layer to the fin portions of the first fin and the second fin.

10. The method of claim 8, further comprising trimming the high-k dielectric layer during the replacing of the first semiconductor layers and the sacrificial semiconductor layer with the first gate stack and the second gate stack.

11. The method of claim 8, further comprising removing the high-k dielectric layer from sidewalls of the low-k dielectric layer during the replacing of the first semiconductor layers and the sacrificial semiconductor layer with the first gate stack and the second gate stack.

12. The method of claim 8, further comprising reducing a height of the second dielectric feature during the replacing of the first semiconductor layers, the second semiconductor layers, and the sacrificial semiconductor layer with the first epitaxial source/drain and the second epitaxial source/drain.

13. The method of claim 8, wherein the trench is a first trench, the sacrificial semiconductor layer is a first sacrificial semiconductor layer, the low-k dielectric layer is a first low-k dielectric layer, the high-k dielectric layer is a first high-k dielectric layer, and the method further comprises:
    forming a third fin extending from the substrate, wherein:
        the third fin includes a respective fin portion extending from the substrate and a respective semiconductor layer stack over the respective fin portion,
        the respective semiconductor layer stack includes respective first semiconductor layers and respective second semiconductor layers, and
        a second trench is between the third fin and the first fin, wherein the second trench has a first sidewall formed by the third fin, a second sidewall formed by the first fin, and a bottom formed by the substrate;
    forming a third dielectric feature that fills a lower portion of the second trench, wherein the third dielectric feature is between the fin portion of the first fin and the fin portion of the third fin;
    forming a second sacrificial semiconductor layer and a fourth dielectric feature that fill an upper portion of the second trench, wherein:
        the second sacrificial semiconductor layer and the fourth dielectric feature are between the semiconductor layer stack of the first fin and the semiconductor layer stack of the third fin, and
        the fourth dielectric feature includes a low-k dielectric cap layer and a second low-k dielectric layer disposed over a second high-k dielectric layer,
    in a first region of the third fin, replacing the first semiconductor layers and the second sacrificial semiconductor layer with a third gate stack that surrounds the second semiconductor layers of the third fin, wherein the fourth dielectric feature separates the third gate stack and the first gate stack;
    in a second region of the third fin, replacing the first semiconductor layers, the second semiconductor layers, and the second sacrificial semiconductor layer with a third epitaxial source/drain over the fin portion of the third fin, wherein the fourth dielectric feature separates the third epitaxial source/drain and the first epitaxial source/drain;
    in the first region of the first fin, replacing the second sacrificial semiconductor layer with the first gate stack; and
    in the second region of the first fin, replacing the second sacrificial semiconductor layer with the first epitaxial source/drain.

14. The method of claim 13, wherein the first dielectric feature and the third dielectric feature are formed at the same time.

15. The method of claim 13, wherein the first low-k dielectric layer and the second low-k dielectric layer are formed at the same time and the first high-k dielectric layer and the second high-k dielectric layer are formed at the same time.

16. A method comprising:
    forming an isolation feature over a substrate, wherein the isolation feature is between a first semiconductor fin and a second semiconductor fin extending from the substrate;
    forming a gate isolation fin over the isolation feature, wherein:
        a width of the gate isolation fin is less than a width of the isolation feature,
        the gate isolation fin is between the first semiconductor fin and the second semiconductor fin,
        the gate isolation fin includes a first dielectric layer and a second dielectric layer disposed over the first dielectric layer, and
        the first dielectric layer has a first dielectric constant, the second dielectric layer has a second dielectric constant, and the second dielectric constant is less than the first dielectric constant; and
    forming a first multigate device and a second multigate device from the first semiconductor fin and the second semiconductor fin, respectively, after forming the gate isolation fin, wherein the gate isolation fin separates a first metal gate of the first multigate device and a second metal gate of the second multigate device.

17. The method of claim 16, wherein the first dielectric layer includes metal and oxygen and the second dielectric layer includes silicon and oxygen.

18. The method of claim 16, wherein the forming the gate isolation fin over the isolation feature includes:
    forming a first sacrificial semiconductor layer over the first semiconductor fin;
    forming a second sacrificial semiconductor layer over the second semiconductor fin;
    depositing a first dielectric material that partially fills a trench having a bottom formed by the isolation feature, a first sidewall formed by the first sacrificial semiconductor layer, and a second sidewall formed by the second sacrificial semiconductor layer;
    depositing a second dielectric material over the first dielectric material, wherein the second dielectric material fills a remainder of the trench; and
    performing a planarization process on the first dielectric material and the second dielectric material, wherein a remainder of the first dielectric material and a remainder of the second dielectric material form the first dielectric layer and the second dielectric layer, respectively, of the gate isolation fin.

19. The method of claim 18, further comprising removing the first sacrificial semiconductor layer and the second sacrificial semiconductor layer during the forming of the first multigate device and the second multigate device.

20. The method of claim 18, further comprising reducing a thickness of the first dielectric material during the forming of the first multigate device and the second multigate device.

* * * * *